(12) United States Patent
Kim et al.

(10) Patent No.: US 10,553,692 B2
(45) Date of Patent: Feb. 4, 2020

(54) SEMICONDUCTOR DEVICE HAVING BURIED GATE STRUCTURE, METHOD FOR MANUFACTURING THE SAME, AND MEMORY CELL HAVING THE SAME

(71) Applicant: SK hynix Inc., Gyeonggi-do (KR)

(72) Inventors: Dong-Soo Kim, Gyeonggi-do (KR);
Sung-Won Lim, Gyeonggi-do (KR);
Eun-Jeong Kim, Gyeonggi-do (KR);
Hyun-Jin Chang, Gyeonggi-do (KR);
Keun Heo, Gyeonggi-do (KR);
Jee-Hyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 23 days.

(21) Appl. No.: 15/208,395

(22) Filed: Jul. 12, 2016

(65) Prior Publication Data

US 2017/0186844 A1  Jun. 29, 2017

(30) Foreign Application Priority Data

Dec. 23, 2015 (KR) .................. 10-2015-0185152

(51) Int. Cl.
| | |
|---|---|
| *H01L 29/423* | (2006.01) |
| *H01L 27/108* | (2006.01) |
| *H01L 29/10* | (2006.01) |
| *H01L 29/49* | (2006.01) |
| *H01L 29/51* | (2006.01) |
| *H01L 27/22* | (2006.01) |
| *H01L 27/24* | (2006.01) |
| *H01L 29/78* | (2006.01) |

(52) U.S. Cl.
CPC .... *H01L 29/4236* (2013.01); *H01L 27/10823* (2013.01); *H01L 29/105* (2013.01); *H01L 29/4966* (2013.01); *H01L 29/511* (2013.01); *H01L 29/517* (2013.01); *H01L 27/228* (2013.01); *H01L 27/2436* (2013.01)

(58) Field of Classification Search
CPC .............. H01L 29/105; H01L 29/4236; H01L 29/4966; H01L 29/511; H01L 29/517
USPC ................................................. 257/330–334
See application file for complete search history.

(56) References Cited

U.S. PATENT DOCUMENTS

| | | | |
|---|---|---|---|
| 9,306,022 B1* | 4/2016 | Oh ...................... | H01L 29/4941 |
| 2013/0256770 A1* | 10/2013 | Huh ..................... | H01L 29/7827 |
| | | | 257/296 |
| 2014/0159145 A1 | 6/2014 | Park et al. | |
| 2014/0197484 A1 | 7/2014 | Anathan et al. | |
| 2015/0349073 A1* | 12/2015 | Kang ................... | H01L 29/4236 |
| | | | 257/330 |

* cited by examiner

*Primary Examiner* — Ori Nadav
*Assistant Examiner* — Vernon P Webb
(74) *Attorney, Agent, or Firm* — IP & T Group LLP

(57) ABSTRACT

A semiconductor device includes at least one trench extending into a semiconductor substrate and lined with a gate dielectric layer; a dipole inducing layer covering a lowermost portion of the lined trench; a gate electrode covering the dipole inducing layer and filled in the lined trench; and doping regions, in the semiconductor substrate, separated from each other by the lined trench and separated from the dipole inducing layer.

16 Claims, 27 Drawing Sheets

SEMICONDUCTOR DEVICE HAVING BURIED GATE STRUCTURE, METHOD FOR MANUFACTURING THE SAME, AND MEMORY CELL HAVING THE SAME

CROSS-REFERENCE TO RELATED APPLICATION

This application claims priority under 35 U.S.C. § 119 to Korean Patent Application No. 10-2015-0185152 filed on Dec. 23, 2015 in the Korean Intellectual Property Office, which is incorporated herein by reference in its entirety.

TECHNICAL FIELD

Exemplary embodiments relate to a semiconductor device and, more particularly, to a semiconductor device having a buried gate structure, a method for manufacturing the same, and a memory cell having the same.

DISCUSSION OF THE RELATED ART

A metal gate electrode is applied for high performance of a transistor. In particular, in a buried, gate transistor, control of a threshold voltage is required for a high performance operation. Also, a gate-induced drain leakage (GIDL) characteristic exerts a substantial influence on performance of a buried gate transistor.

SUMMARY

Various embodiments are directed to a buried gate structure capable of shifting a threshold voltage, and a method for manufacturing the same.

Various embodiments are directed to a semiconductor device with improved gate-induced drain leakage (GIDL), and a method for manufacturing the same.

Various embodiments are directed to a memory cell with improved refresh characteristic.

In an embodiment, a semiconductor device may include: at least one trench extending into a semiconductor substrate and lined with a gate dielectric layer; a dipole inducing layer covering a lowermost portion of the trench; a gate electrode disposed over the dipole inducing layer and that fills in the trench; and doping regions in the semiconductor substrate, separated from each other by the trench and separated from the dipole inducing layer. The dipole inducing layer may include a dielectric material that has a dielectric constant higher than the gate dielectric layer. The gate dielectric layer may include a silicon oxide ($SiO_2$), and the dipole inducing layer may include an aluminum oxide ($Al_2O_3$) a titanium oxide ($TiO_2$) a hafnium oxide ($HfO_2$), a zirconium oxide ($ZrO_2$), a magnesium oxide (MgO) or a combination thereof. The gate electrode may include a first portion, contacting the dipole inducing layer; and a second portion non-contacting the dipole inducing layer, and the first portion of the gate electrode may have a high work function higher than the second portion. The first portion of the gate electrode may be separated from the doping regions, and may be separated from sidewalk of the trench. The gate electrode may include a work function layer lining the dipole inducing layer and the gate dielectric layer; and a low-resistivity layer filling the trench over the work function layer. The work function layer may include: a first portion contacting the dipole inducing layer; and a second portion neighboring the sidewalk of the trench except the lowermost portion of the trench, and the second portion of the work function layer may overlap with the doping, regions. The first portion of the work function layer may have a high work function higher than the second portion. The gate electrode may further include: a barrier layer may be formed over the work function layer and the low-resistivity layer; and a low work function layer may be formed over the barrier layer, and the low work function layer may overlap with the doping regions. The low work function layer may have a low work function lower than the work function layer. The gate electrode may include: a work function layer including a first portion that may be disposed over the dipole inducing layer and a second portion that fills the trench. The gate electrode may further include: a low work function layer may be formed over the work function layer, and the low work function layer may overlap with the doping regions and may have a low work function lower than the second portion of the work function layer. The work function layer may include a titanium nitride. The low-resistivity layer may include tungsten. The semiconductor device may further include a bottom channel formed along a bottom of the trench; and a side channel formed along side ails of the trench, the bottom channel overlaps with the dipole inducing layer. The dipole inducing layer may have a height that non overlaps with the side channel. The bottom channel may have a dopant concentration lower than the side channel. The bottom channel may be undoped, and the side channel may be doped.

In an embodiment, a semiconductor device may include: at least one trench extending into a semiconductor substrate and lined with a gate dielectric layer; a dipole inducing layer covering a lowermost portion of the trench; a gate electrode disposed over the dipole inducing layer and that fills in the trench; and doping regions, in the semiconductor substrate, separated from each other by the trench and separated from the dipole inducing layer, the gate electrode may include: a first work function layer disposed over only the dipole inducing layer; and a second work function layer disposed over the first work function layer and the gate dielectric layer. The first work function layer may have a high work function higher than the second work function layer. The dipole inducing layer may include a dielectric material that may have a dielectric constant higher than the gate dielectric layer. The gate dielectric layer may include a silicon oxide ($SiO_2$), and the dipole inducing layer include an aluminum oxide ($Al_2O_3$), a titanium oxide ($TiO_2$), a hafnium oxide ($HfO_2$), a zirconium oxide ($ZrO_2$), a magnesium oxide (MgO) or a combination thereof. The first work function layer may be separated from the doping regions and may be separated from sidewalls of the trench. The gate electrode may further include: a low-resistivity layer filling the trench over the second work function layer, and the second work function layer lines the first work function layer and the gate dielectric layer. The second work function layer may overlap with the doping regions. The gate electrode may further include: a barrier layer may be formed over the second work function layer and the low-resistivity layer; and a low work function layer may be formed over the barrier layer, and the low work function layer may overlap with the doping regions, and the second work function layer non-overlaps with the doping regions. The low work function layer may have a low work function lower than the second work function layer. The second work function layer may fill the trench. The gate electrode may further include: a low work function layer may be formed over the second work function layer and having a work function lower than the second work function layer, and the low work function layer may overlap with the doping, regions, and the second work function layer non-overlaps with the doping regions. The low work function layer may include T-type doped polysilicon. The first work function layer may include a titanium nitride that may have a high work function, and the second work function layer may include titanium nitride that may have a low work function.

In an embodiment, a method for manufacturing semiconductor device may include: forming a trench in a semiconductor substrate; forming a gate dielectric layer that lines a surface of the trench; forming a dipole inducing material over the gate dielectric layer; etching the dipole inducing material, and forming a dipole inducing layer at, a lowermost portion of the trench; forming a gate electrode that fills the trench, over the dipole inducing layer and the gate dielectric layer; and forming doping regions in the semiconductor substrate on both sides of the trench. The forming of the dipole inducing layer may include: forming a sacrificial layer that fills the trench, over the dipole inducing material; etching the sacrificial layer, and forming a sacrificial filler that may be positioned in the trench; etching the dipole inducing material by using the sacrificial filler as a barrier, and forming the dipole inducing layer; and removing the sacrificial filler. The dipole inducing layer may include a dielectric material that may have a dielectric constant higher than the gate dielectric layer. The gate dielectric layer may include a silicon oxide ($SiO_2$), and the dipole inducing layer may include an aluminum oxide ($Al_2O_3$) a titanium oxide ($TiO_2$), a hafnium oxide ($HfO_2$) a zirconium oxide ($ZrO_2$), a magnesium oxide (MgO) or a combination thereof. The forming of the gate electrode may include: forming a work function material over the dipole inducing layer and the gate dielectric layer; forming a low-resistivity material that fills the trench, over the work function material; exposing the low-resistivity material to a thermal process; recessing the low-resistivity material, and forming a low-resistivity layer that partially fills the trench; and recessing the work function material and forming a work function layer that lines the dipole inducing layer and the gate dielectric layer. The work function layer may include a high work function portion that contacts the dipole inducing layer and a low work function portion that contacts the gate dielectric layer. In the forming of the work function layer, the low work function portion and the doping regions may overlap with each other. The thermal process may be performed under an atmosphere of nitrogen or an atmosphere of a mixture gas of nitrogen and hydrogen. The work function material may include a titanium nitride. The forming of the gate electrode may further include: forming a barrier layer over the work function layer and the low-resistivity layer; and forming a low work function layer that may have a work function lower than the work function layer, over the barrier layer. The low work function layer may include N-type doped polysilicon. The forming of the gate electrode may include: forming a work function material that fills the trench, over the dipole inducing layer and the gate dielectric layer; and recessing the work function material, and forming a work function layer over the dipole inducing layer and that partially fills the trench. The work function layer may include a high work function portion that contacts the dipole inducing layer and a low work function portion that contacts the gate dielectric layer. The forming of the gate electrode may further include: forming a low work function layer that may have a work function lower than the work function layer, over the work function layer. The low work function layer may include N-type doped polysilicon.

In are embodiment, a method for manufacturing semiconductor device may include: forming a trench in a semiconductor substrate; forming a gate dielectric layer that lines a surface of the trench; forming a dipole inducing material over the gate dielectric layer; forming a first work function material over the dipole inducing material; etching the dipole inducing material, and forming a dipole inducing layer at a lowermost portion of the trench; etching the first work function material, and forming a first work function layer that may be positioned at the lowermost portion of the trench and over the dipole inducing layer; forming a gate electrode including the first work function layer and a second work function layer over the gate dielectric layer; and forming doping regions in the semiconductor substrate on both sides of the trench. The forming of the dipole inducing layer and the forming of the first work function layer may include: forming a sacrificial layer that fills the trench, over the first work function material; etching the sacrificial layer, and forming a sacrificial filler that may be positioned in the trench; etching the dipole inducing material and the first work function material by using the sacrificial filler as a barrier, and forming the dipole inducing layer and the first work function layer; and removing the sacrificial filler. The first work function layer may have a work function higher than the second work function layer. The dipole inducing layer may include a dielectric material that may have a dielectric constant higher than the gate dielectric layer. The gate dielectric layer may include a silicon oxide ($SiO_2$), and the dipole inducing layer include an aluminum oxide ($Al_2O_3$), a titanium oxide ($TiO_2$), a hafnium oxide ($HfO_2$), a zirconium oxide ($ZrO_2$), a magnesium oxide (MgO) or combination thereof. The forming of the gate electrode may include: forming a second work function material over the first work function layer and the gate dielectric layer; forming a low-resistivity material that fills the trench over the second work function material; exposing the low-resistivity material to a thermal process; recessing the low-resistivity material, and forming a low-resistivity layer that partially fills the trench; and recessing the second work function material, and forming the second work function layer that lines the first work function layer and the gate dielectric layer. In the forming of the second work function layer, the second work function layer and the doping regions may overlap with each others. The thermal process may be performed under an atmosphere of nitrogen or an atmosphere of a mixture gas of nitrogen and hydrogens. The forming of the gate electrode may further include: forming a barrier layer over the second work function layer and the low-resistivity layer; and forming a low work function layer that may have a work function lower than the second work function layer, over the barrier layer. In the forming of the low work function layer, the low work function layer and the doping regions may overlap with each other. The low work function layer may include N-type doped polysilicon. The forming of the gate electrode may include: forming a second work function material that fills the trench, over the first work function layer and the gate dielectric layer; and recessing the second work function material, and forming the second work function layer over the first work function layer and that partially fills the trench. In the forming of the second work function layer, the second work function layer and the doping regions may overlap with each other. The forming of the gate electrode may further include: forming a low work function layer that may have a work function lower than the second work function layer, over the second work function layer. In the forming of the low work function layer, the low work function layer and the doping regions may overlap with each other. The low work function layer include N-type doped polysilicon.

DETAILED DESCRIPTION

Figure 1A:
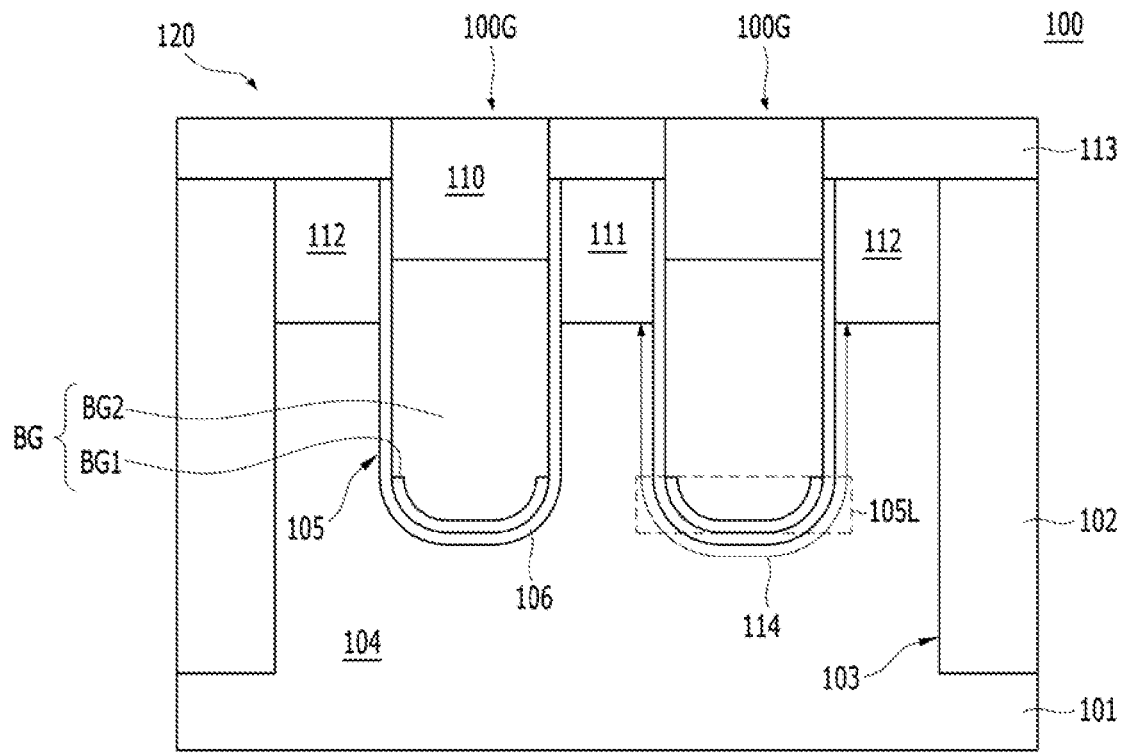
FIG. 1A is side, cross-sectional schematic view of a semiconductor device, according to a first embodiment of the present invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereinbelow, in the described embodiments, a threshold voltage (Vt) may depend on a flat-band voltage. A flat-band voltage may depend on a work function. A work function may be engineered by various methods. For example, a work function may be modulated by a material of a gate electrode, a material between the gate electrode and a channel region, a dipole, and so forth. By increasing or decreasing a work function, a flat-band voltage may be shifted. A high work function may shift a flat-band voltage in a positive direction, and a low work function may shift a flat-band voltage in a negative direction. By shifting a flat-band voltage as described above, it is possible to modulate a threshold voltage. In the described embodiments, even though a channel dose is decreased or channel doping is omitted, a threshold voltage may be modulated by shifting a flat-band voltage. In the described embodiments, a flat-band voltage may be shifted by a dipole inducing layer.

Figure 1B:
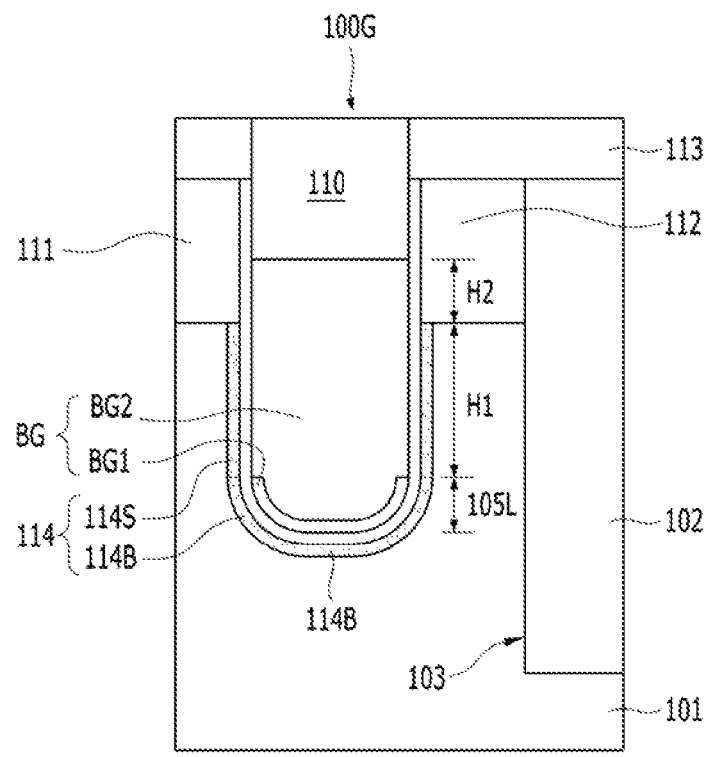
FIG. 1B is a detailed view of an example of a buried gate structure of FIG. 1A.

Referring now to FIG. 1A a semiconductor device 100 is provided, according to a first embodiment of the present invention. FIG. 1B is a detailed view of an example of a buried gate structure 100G according to the first embodiment of the present invention. The semiconductor device 100 as illustrated in FIG. 1A may be include a transistor 120.

Referring to FIGS. 1A and 1B, the semiconductor device 100 may include a substrate 101. An isolation layer 102 and an active region 104 may be formed, in the substrate 101. A buried gate structure 100G may extend in the active region 104 of the substrate 101. A first doping region 111 may be disposed in the interval between the gate structure 100G. A second doping region may be disposed in the interval between the isolation layer 102 and the buried gate structure 100G. The buried gate structure 100G extends in a direction perpendicular to the plane of the substrate to define intervals for the first and second doping layers 111 and 112. The buried gate structure 100G includes a gate trench 105 formed in the substrate 101. In an embodiment, the gate trench 105 may be a line shape that extends across the active region 104 and the isolation layer 102. The buried gate structure 100G may be formed in the gate trench 105. The active region 104 may include a channel region 114, the first doping region 111 and the second doping region 112. The channel region 114 may include the gate trench 105. The channel region 114 may be formed between the first and second doping regions 111 and 112 to have an "U" shape. The channel region 114 may include a bottom channel 114B and a side channel 114S. A hard mask layer 113 may be formed on top of the substrate 101 except for the area covered by the buried gate structure 100G, i.e., the hard mask layer 113 may cover the top surfaces of the isolation region 102 and the first and second doping regions 110 and 112.

The substrate 101 may be a material that is appropriate for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may include another semiconductor material, such as, for example, germanium. The substrate 101 may include a III/V group semiconductor substrate, for example, a compound semiconductor substrate such as GaAs. The substrate 101 may include a silicon-on-insulator (SOI) substrate.

The isolation layer 102 and the active region 104 may be formed in the substrate 101. The active region 104 may be defined by the isolation layer 102. The isolation layer 102 may be a STI (shallow trench isolation) region. The isolation layer 102 may be formed by filling a dielectric material in a shallow trench, for example, an isolation trench 103. Any dielectric material that is suitable for use in semiconductor manufacturing may be employed for forming the isolation layer 102, such as, for example, a silicon oxide, a silicon nitride, or a combination thereof.

The gate trench 105 may be formed in the substrate 101. When viewed from the top, the gate trench 105 may be a line shape that extends in any one direction. For example, in an embodiment, when viewed from the top a cross-section of the gate trench 105 may be a line shape extending across the active region 104 and the isolation layer 102. The gate trench 105 may have a depth shallower than the isolation trench 103. The bottom surface of the gate trench 105 may have a curvature.

The channel region 114, the first and second doping regions 111 and 112 may be formed in the active region 104. The first and second doping regions 111 and 112 are doped with a conductive dopant. For example, a conductive dopant may be or include phosphorus (P), arsenic (As), antimony (Sb) or boron (B). The first and second doping regions 111 and 112 may be doped with the same conductive dopant. The first and second doping regions 111 and 112 may be doped with a different conductive dopant. The first and second doping regions 111 and 112 may be separated from each other by the gate trench 105. The first and second doping regions 111 and 112 may be positioned in the active region 104 on both sides of the gate trench 105. The first and second doping regions 111 and 112 may be referred to as a source region and a drain region, respectively. The bottom surfaces of the first and second doping regions 111 and 112 may be positioned at a predetermined depth from the top surface of the active region 104. The first and second doping regions 111 and 112 may neighbor the sidewalls of the gate trench 105. The bottom surfaces of the first and second doping regions 111 and 112 may be at a higher level than the bottom surface of the gate trench 105. The first and second doping regions 111 and 112 may be symmetrical to each other. For example, the first and second doping regions 111 and 112 may form junctions of the same depth.

The channel region 114 may be defined in the active region 104 between the first and second doping regions 111 and 112. The channel region 114 may include the bottom channel 114B and the side channel 114S. The bottom channel 114B may be defined under the bottom surface of the gate trench 105, and the side channel 114S may neighbor the sidewalls of the gate trench 105. When the semiconductor device 100 is a transistor 120, for modulating the threshold voltage of the transistor 120, the channel region 114 may include a dopant by channel doping. For example, the bottom channel 114B and the side channel 114S may include a dopant. The bottom channel 114B and the side channel 114S may have different dopant concentrations. For example, the side channel 114S may have a dopant concentration larger than that of the bottom channel 114B. In another embodiment, the side channel 114S may be doped, whereas the bottom channel 114B may not be doped. Hence, the bottom channel 114B may not contain any dopant whereas the side channel 114S may be doped with a dopant. Even so, a threshold voltage of a predetermined level may be obtained by a first portion BG1 of a gate electrode BG. The channel region 114 may have a longer channel length than the channel of a conventional planar type transistor. Such a configuration may be advantageous for substantially preventing short channel effect observed with conventional planar transistors.

The hurled gate structure 100G may be formed in the gate trench 105. The buried gate structure 100G may be simply referred to as an embedded buried gate BG. The buried gate structure 100G may be positioned in the gate trench 105 between the first and second doping regions 111 and 112. The buried gate structure 100G may be disposed in the active region 104 between the first and second doping regions 111 and 112, and may extend at a greater depth than the depth of the first and second doping regions 111 and 112 but less of the depth of the isolation layer 102.

The buried gate structure 100G may include a gate dielectric layer 106, the gate electrode BG and a capping layer 110. The top surface of the gate electrode BG may be positioned at a level lower than the top surface of the active region 104. In other words, the gate electrode BG may only partially fill the gate trench 105. The gate electrode BG may be referred to as a 'buried gate electrode' or an 'embedded gate electrode.' The capping layer 110 may, be positioned on top of the gate electrode BG.

The gate trench 105 may be lined with the gate dielectric layer 106. The gate trench 105 lined with the gate dielectric layer 106 may be referred to as a 'lined trench' or a 'lined gate trench.' The gate dielectric layer 106 may be formed on the bottom and sidewalls of the gate trench 105.

The gate dielectric layer 106 may include a silicon oxide, a silicon nitride, a silicon oxynitride, a high-k material or a combination thereof. A high-k material may include a material having a dielectric constant higher than the dielectric constant of a silicon oxide. For example, a high-k material may include a material having a dielectric constant higher than 3.9. For another example, a high-k material may include a material having a dielectric constant higher than 10. For still another example, a high-k material may include a material having a dielectric constant of 10 to 30. A high-k material may include at least one metallic element. A high-k material may include a hafnium-containing material. A hafnium-containing material may include a hafnium oxide, a hafnium silicon oxide, a hafnium silicon oxynitride or a combination thereof. In another embodiment, a high-k material may include a lanthanum oxide, a lanthanum aluminum oxide, a zirconium oxide, a zirconium silicon oxide, a zirconium silicon oxynitride, an aluminum oxide or a combination thereof. As a high-k material, other high-k materials known in the art may be selectively used. In the present embodiment, the gate dielectric layer 106 may be formed by oxidating the surface of the gate trench 105. In another embodiment, the gate dielectric layer 106 may include a silicon oxide that is obtained by oxidating a polysilicon liner. In still another embodiment, the gate dielectric layer 106 may include a silicon oxide that is obtained by oxidating a nitride liner.

The gate electrode BG is only partially filled in the gate trench 105. Hence, the top surface of the gate electrode BG may be at a lower level than the top surface of the active region 104. The gate electrode BG may be a metal-base material, for low resistivity.

The capping layer 110 protects the gate electrode BG. The capping layer 110 may include any suitable dielectric material for protecting the gate electrode BG, such as, for example, a silicon nitride, a silicon oxynitride or a combination thereof. In another embodiment, the capping layer 110 may include a combination of a silicon nitride and a silicon oxide. For example, for forming the capping layer 110, lining may be performed using a silicon nitride, and thereafter, a spin-on-dielectric (SOD) may be filled. In another embodiment, the capping layer 110 may be an oxide-nitride-oxide (ONO) structure.

The gate electrode BG will be described below in detail.

The gate electrode BG may include a first portion BG1 having a locally increased work function. The gate electrode BG may also include a second portion BG2. The first portion BG1 of the gate electrode BG may overlap with the bottom channel 114B. Hence the first portion BG1 may not extend in any substantial way along the interior side wall of the gate trench 105. The second portion BG2 of the gate electrode BG may not overlap with the bottom channel 114B. The second portion BG2 may form the most portion of the gate electrode BG. The second portion BG2 of the gate electrode BG may fill most of the gate trench 105. The first portion BG1 of the gate electrode BG may have a work function higher than the second portion BG2. The first portion BG1 of the gate electrode BG may overlap with the bottom channel 114B. The second portion BG2 of the gate electrode BG may be formed above the first portion BG1 of the gate electrode and may overlap with the side channel 114S to cover the interior of the gate trench all the way up to a level that is above the highest level of the side channel 114S. Hence, the top surface of the second portion BG2 of the gate electrode BG may be at a higher level than the level of the bottom surfaces of the first and second doping regions 111 and 112 and below the level of the top surfaces of the first and second doping regions 111 and 112. The first portion BG1 of the gate electrode BG may have its work function modulated, and the second portion BG2 of the gate electrode BG may be a portion of which work function is not modulated. For example, the second portion BG2 of the gate electrode BG may have an intrinsic work function of the material itself of the gate electrode BG, and the first portion BG1 of the gate electrode BG may have an increased work function. The first portion BG1 of the gate electrode BG may have a high work function, and the second portion BG2 of the gate electrode BG may have a work function lower than the first portion BG2. In this way, the gate electrode BG may include the first portion BG1 having a high work function and the second portion BG2 having a low work function.

The first portion BG1 of the gate electrode BG may have a work function that is able to shift the threshold voltage of the bottom channel 114B. The second portion BG2 of the gate electrode BG may have a work function that does not shift the threshold voltage of the side channel 114S. For example, the threshold voltage of the bottom channel 114B may be increased by the first portion BG1. The second portion BG2 may be suppressing any increase in the threshold voltage of the side channel 114S. A high work function refers to a work function higher than the mid-gap work function of silicon. A low work function refers to a work function lower than the mid-gap work function of silicon. For example, a high work function may be a work function higher than 4.5 eV, whereas a low work function may be a work function lower than 4.5 eV. The first portion BG1 of the gate electrode BG may have a work function higher than the second portion BG2. The first portion BG1 of the gate electrode BG may have a work function higher than 4.5 eV.

The gate electrode BG may include a low-resistivity metal material. The gate electrode BG may include a material that does not attack the gate dielectric layer 106. For example, the gate electrode BG may be formed of a material that does not contain, or is essentially free of an impurity such as fluorine. The gate electrode BG may include, for example, a metal, a metal nitride or a combination thereof. In the case, where the material used for the gate electrode BG contains an impurity (e.g., fluorine), a barrier layer may be additionally formed. Various application examples of the gate electrode BG will be described later.

The first portion BG1 of the gate electrode BG may be formed to be separated by a first height H1 from the first and second doping regions 111 and 112. The first height H1 may be the same or substantially the same as the height of the side channel 114. The first height H1 may be defined as the height between the bottom surfaces of the first and second doping regions 111 and 112 and the lowermost portion 105L (i.e. bottom surface) of the gate trench 105. In an embodiment, the first portion BG1 of the gate electrode BG may cover most of the lowermost portion 105L of the gate trench 105. Meanwhile, the second portion BG2 of the gate electrode BG may be formed inside the gate trench 105 up to a level that is above the level of the bottom surfaces of the first and second doping regions 111 and 112 by a second height H2. The first height H1 may be larger than the second height H2.

The channel region 114, the first doping region 111, the second doping region 112 and the buried gate structure 100G may construct the transistor 120, referred to also as a 'buried gate transistor'.

According to the first embodiment, the first portion BG1 of the gate electrode BG may be a material that induces a high work function, and may be formed to be sufficiently separated by the first height H1 from the first and second doping regions 111 and 112. The threshold voltage may be shifted by the first portion BG1 of the gate electrode BG. For example, the threshold voltage may be increased by the first portion BG1 of the gate electrode BG. Because the gate trench 105 has a high aspect ratio, it has been generally difficult to secure the threshold voltage of the bottom channel 114B by channel doping. Namely it is difficult to sufficiently perform channel doping to the bottom portion of the gate trench 105. Therefore, after channel doping, additional channel doping is locally performed for the bottom portion of the gate trench 105, commonly referred to as 'local channel doping.' In the case where implantation is applied as local channel doping, the implantation is referred to as local channel implantation (LCI). The threshold voltage of the bottom channel 114B is modulated by local channel doping. Since the threshold voltage may be modulated by the hist portion BG1 of the gate electrode BG, the channel doping dose of the bottom channel 114B may be decreased. For example, LCI may be omitted altogether or at least the amount of LCI needed may be significantly reduced. In addition, decreasing the channel doping amount, because of the first portion BG1 of the gate electrode BG, junction leakage may be reduced substantially.

Also, since the second portion BG2 of the gate electrode BG has a low work function, it is possible to suppress gate-induced drain leakage (GIDL) in the first and second doping regions 111 and 112. If the first portion BG1 of the gate electrode BG overlaps with the first and second doping regions 111 and 112, GIDL may increase due to induction of a high work function. Therefore, a position where the first portion BG1 of the gate electrode BG is formed should be controlled to avoid the first portion BG1 extending inside the gate trench at a level that is near or higher the bottom surface of the first and second doping regions 111 and 112. The present first embodiment is advantageous because it ensures that a sufficient distance H1 is kept between the upper surface of the first portion BG1 and the lower surface of the first and second doping regions 111 and 112 for preventing or substantially reducing GIDL.

Furthermore since not only the first portion BG1 of the gate electrode BG is formed not to extend above a level that is higher than the uppermost level of the side channel 114S, but also the second portion BG2 of the gate electrode BG has a low work function, off-state leakage may be substantially reduced or prevented. Off-state leakage may refer to leakage current that occurs when the transistor 120 is in an off state. As a comparative example if the first portion BG1 of the gate electrode BG overlaps with the side channel 114S, off-state leakage may increase. Also, even in the case where the second portion BG2 of the gate electrode BG has a high work function, off-state leakage may increase. Such off-state leakage at the side channel 114S is referred to as a 'side transistor effect.' Off-state leakage may become serious as a spacing between neighboring buried gate structures 100G is narrow. In the present embodiment, for preventing off-state leakage, the height of the first portion BG1 of the gate electrode BG is decreased, and the second portion BG2 of the gate electrode BG has a low work function.

The buried gate structure 100G according to the first embodiment may be applied to a buried gate type fin channel transistor. Namely, a fin region may be additionally included under the buried gate structure 100G. The bottom channel 114B may include the fin region. For the fin region, reference may be made to FIGS. 3A and 3B that will be described later.

Figure 2A:
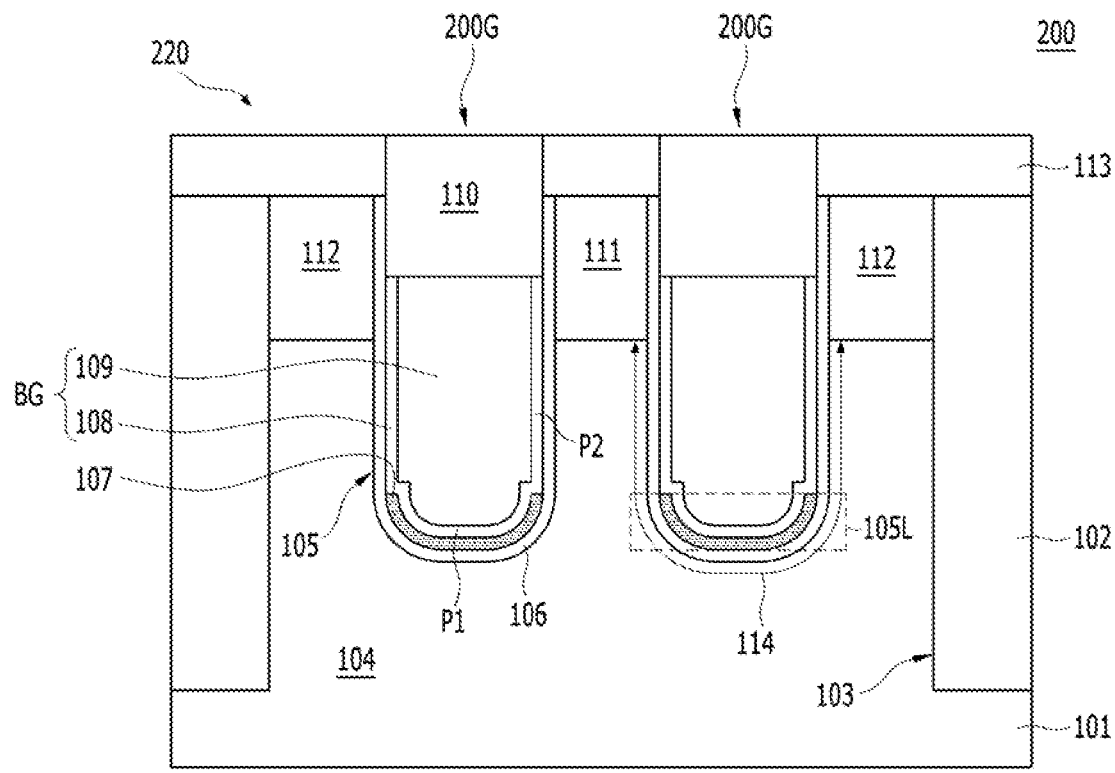
FIG. 2A is a side cross-sectional schematic view of semiconductor device, according to a second embodiment of the present invention.
Figure 2B:
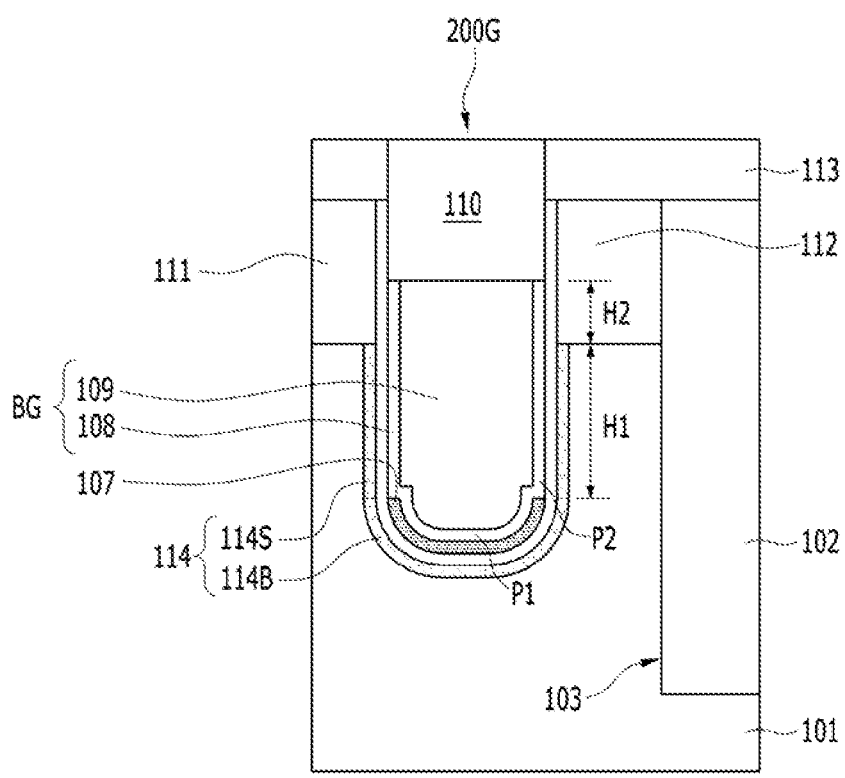
FIG. 2B is a detailed view of an example of a buried gate structure in accordance with the second embodiment.

FIG. 2A is a side cross-sectional schematic view of semiconductor device 200 according to a second embodiment of the present invention. FIG. 2B is a detailed view of an example of a buried gate structure 200G, according to the second embodiment of the present invention. A transistor 220 is shown as a part of a semiconductor device 200.

Some components of the semiconductor device 200 may be the same as those of the semiconductor device 100 according to the first embodiment of the present invention. The semiconductor device 200 may include the buried gate structure 200G, a channel region 114, a first doping region 111, and a second doping region 112. An isolation layer 102 and an active region 104 may be formed in a substrate 101. The first and second doping regions 111 and 112 may be disposed in the active region 104. A gate trench 105 that extends across the active region 104 and the isolation layer 102 may be formed. The buried gate structure 200G may be formed in the gate trench 105. The channel region 114 may include the gate trench 105.

The buried gate structure 200G may be embedded in the gate trench 105. The buried gate structure 200G may include a gate dielectric layer 106, a dipole inducing layer 107, a gate electrode BG, and a capping layer 110. The top surface of the gate electrode BG may be positioned at a level lower than the top surface of the active region 104. The dipole inducing layer 107 may cover the lowermost portion 105L of the gate trench 105 and is positioned above bottom channel 114B. In an embodiment, the dipole inducing layer 107 may cover most of the lowermost portion 105L of the gate trench 105. The dipole inducing layer 107 may overlap with a bottom channel 114B. The sidewalls of the gate trench 105 and the dipole inducing layer 107 may not extend above each other in any substantial way, meaning that the uppermost portion of the dipole inducing layer 107 may be below the lowermost level of the sidewalls of the gate trench 105. The dipole inducing layer 107 may not overlap with the side channel 114S. The dipole inducing layer 107 may be formed of a metal oxide having a dielectric constant higher than the gate dielectric layer 106. In the case where the gate dielectric layer 106 is $SiO_2$, the dipole inducing layer 107 may include an aluminum oxide ($Al_2O_3$), a titanium oxide ($TiO_2$), a hafnium oxide ($HfO_2$), a zirconium oxide ($ZrO_2$), a magnesium oxide(MgO) or a combination thereof.

The gate electrode BG may include a low-resistivity layer 109. The gate electrode BG may further include a work function layer 108 between the low-resistivity layer 109 and the gate dielectric layer 106. Most of the inside of the gate trench 105 may be filled with the low-resistivity layer 109, and the work function layer 108 of a thin thickness may be formed between the low-resistivity layer 109 and the gate dielectric layer 106. Accordingly, the work function layer 108 may be referred to as a 'work function liner.' The work function layer 108 may perform, the function of a barrier layer. For example, the work function layer 108 may prevent an impurity from diffusing to the gate dielectric layer 106 from the low-resistivity layer 109.

The work function layer 108 may include a first portion P1 having a locally increased work function. The work function layer 108 may further include a second portion P2. The first portion P1 of the work function layer 108 may contact the dipole inducing layer 107, and the second portion P2 of the work function layer 108 may not contact the dipole inducing layer 107. Accordingly the first portion P1 of the work function layer 108 may overlap with the bottom channel 114B, and the second portion P2 of the work function layer 108 may overlap with the side channel 114S. The second portion P2 of the work function layer 108 may also overlap with the first and second doping regions 111 and 112. The first portion P1 of the work function layer 108 may have its work function modulated, whereas the second portion P2 of the work function layer 108 may not have its work function modulated. For example, the second portion P2 of the work function layer 108 may have an intrinsic work function of the material itself of the work function layer 108, and the first portion P1 of the work function layer 108 may have a work function that is increased by the dipole inducing layer 107. The first portion P1 of the work function layer 108 may have a high work function, and the second portion P2 of the work function layer 108 may have a work function lower than the first portion P1. In this way, the work function layer 108 may include the first portion P1 having a high work function and the second portion P2 having a low work function.

The first portion P1 of the work function layer 108 may have a high work function that is able to shift the threshold voltage of the bottom channel 114B. The second portion P2 of the work function layer 108 may have a work function that does not shift the threshold voltage of the side channel 114S. For example, the threshold voltage of the bottom channel 114B may be increased by the first portion P1 of the work function layer 108, whereas the threshold voltage of the side channel 114S may be suppressed from being increased by the second portion P2 of the work function layer 108. The first portion P1 of the work function layer 108 may have a work function higher than the second portion P2 by the dipole inducing layer 107. The first portion P1 of the work function layer 108 may have a work function higher than 4.5 eV. The work function layer 108 may be a conductive material. The work function layer 108 may be a metal-base material, for reducing the resistivity of the gate electrode BG. The work function layer 108 may be formed of a material that does not attack the gate dielectric layer 106. For example, the work function layer 108 may be formed of a material that does not contain an impurity such as, for example, fluorine. The work function layer 108 may be a metal nitride. The work function layer 108 may be a titanium nitride (TiN).

The low-resistivity layer 109 may include a metal material for reducing the resistivity of the gate electrode BG. In this manner, resistivity may be reduced as a volume occupied by the low-resistivity layer 109 in the gate electrode BC increases. The low-resistivity layer 109 may be a low-resistivity metal. The low-resistivity layer 109 may include tungsten (W). In the case where tungsten is used as the low-resistivity layer 109, the gate dielectric layer 106 may be attacked. For example, tungsten may be deposited using a tungsten hexafluoride ($WF_6$) gas, and the gate dielectric layer 106 may be attacked by fluorine. Therefore, for preventing an attack by fluorine, the work function layer 108 may be formed between the low-resistivity layer 109 and the gate dielectric layer 106.

According to the second embodiment, the dipole inducing layer 107 may be a material that induces a high work function, and may be formed to be sufficiently separated by a first height H1 from the first and second doping regions 111 and 112.

A threshold voltage is shifted by the dipole inducing layer 107. For example, a threshold voltage may be increased by the dipole inducing layer 107. Since a threshold voltage may be modulated by the dipole inducing layer 107, the channel dose of the bottom channel 114B may be decreased. That is to say, the dose of LCI may be remarkably decreased or LCI may be omitted. As a result, in the present embodiment, because a channel dose is decreased by the dipole inducing layer 107, junction leakage may be improved.

Also, in the second embodiment, since the second portion P2 of the work function layer 108 has a low work function, it is possible to suppress GIDL in the first and second doping regions 111 and 112.

Furthermore, since not only the dipole inducing layer 107 is formed to not overlap with the side channel 114S but also the second portion P2 of the work function layer 108 has a low work function, off-state leakage may be prevented.

The buried gate structure 200G according to the second embodiment may be applied to a buried gate type fin channel transistor. That is to say, a fin region 104F (refer to FIG. 3A) may be additionally included under the buried gate structure 200G.

Figure 3A:
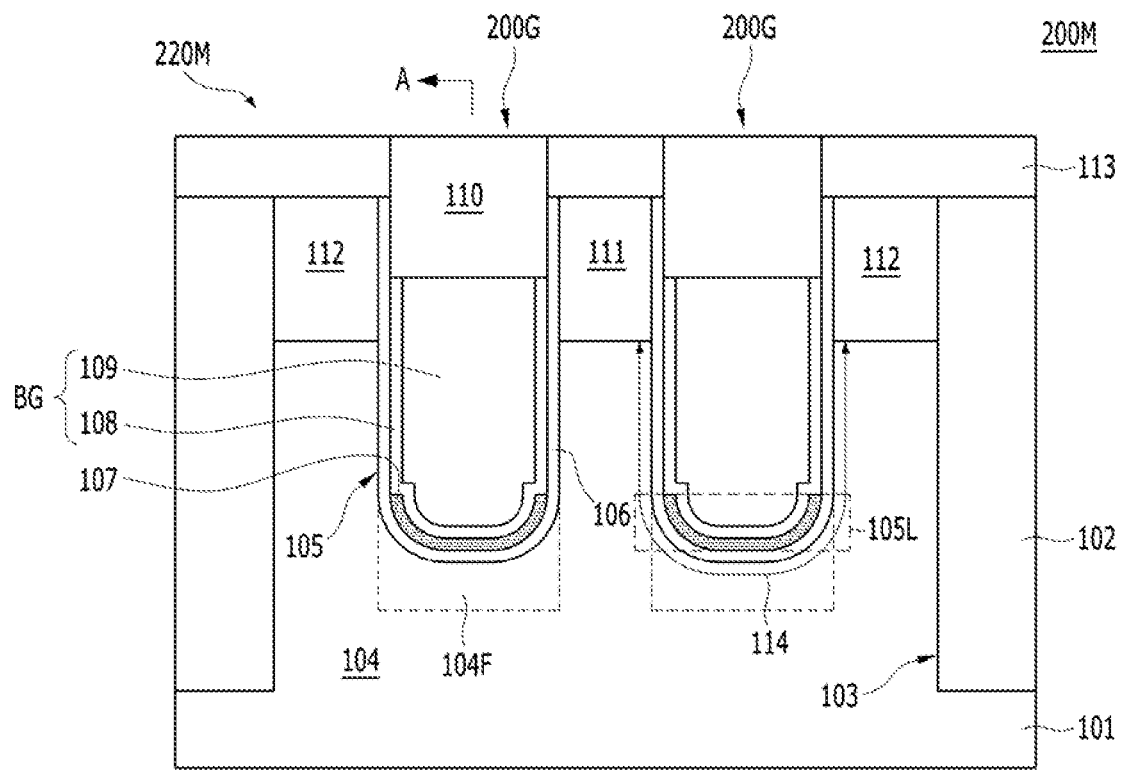
FIG. 3A is a side cross-sectional schematic view of semiconductor device, according to a modification of the second embodiment of the present invention illustrated in FIG. 2A.
Figure 3B:
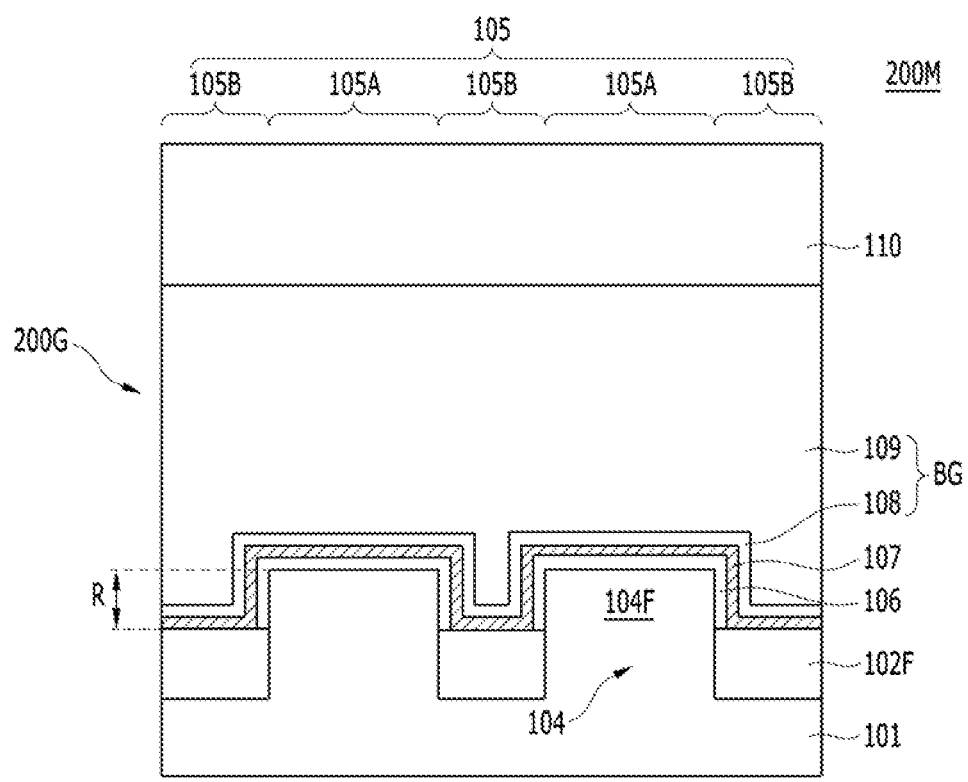
FIG. 3B is the uppermost surface of the dipole inducing layer 107 may not extend over the uppermost surface, of the side channel view taken along the line A-A' of FIG. 3A.

FIGS. 3A and 3B are views of an example of a semiconductor device, according to a modification of the second embodiment of the present invention. FIG. 3B is a cross-sectional view taken along the line A-A' of FIG. 3A. A transistor 220M is shown as a part of a semiconductor device 200M. Some components of the semiconductor device 200M may be the same as those of the semiconductor device 200 according to the second embodiment of the present invention. A buried gate structure 200G of the semiconductor device 200M may include a gate dielectric layer 106, a dipole inducing layer 107, a gate electrode BG, and a capping layer 110. The gate electrode BG may include a work function layer 108 and a low-resistivity layer 109.

The transistor 220M may further include a fin region 104F. The fin region 104F may be positioned in an active region 104 under a gate trench 105.

The gate trench 105 may include a first trench 105A and a second trench 105B. The first trench 105A may be formed in the active region 104. The second trench 105B may be formed in an isolation layer 102. The second trench 105B may be continuously expanded from the first trench 105A. The first and second trenches 105A and 05B may have bottom surfaces that are positioned at different levels. For example, the bottom surface of the first trench 105A may be positioned at a level higher than the bottom surface of the second trench 105B. The height difference between the first and second trenches 105A and 05B is formed as the isolation layer 102 is recessed. Therefore, the second trench 105B may include a recess region R having a bottom surface lower than the bottom surface of the first trench 105A.

The fin region 104F is formed in the active region 104 due to the step portion between the first and second trenches 105A and 05B. Accordingly, the active region 104 includes the fin region 104F.

In this way, the fin region 104F is formed under the first trench 105A, and the sidewalls of the fin region 104F are exposed by a recessed isolation layer 102F. The fin region 104F is a portion where a bottom channel 114B is formed. The fin region 104F is referred to as a saddle fin. By the fin region 104F, a channel width may be increased and an electrical characteristic may be improved.

The dipole inducing layer 107 may cover the top surface and sidewalls of the fin region 104F. The dipole inducing layer 107 may not overlap with a side channel 114S. Accordingly by using the dipole inducing layer 107, the channel dose of the fin region 104F may be decreased or local channel doping may be omitted.

Figure 4A:
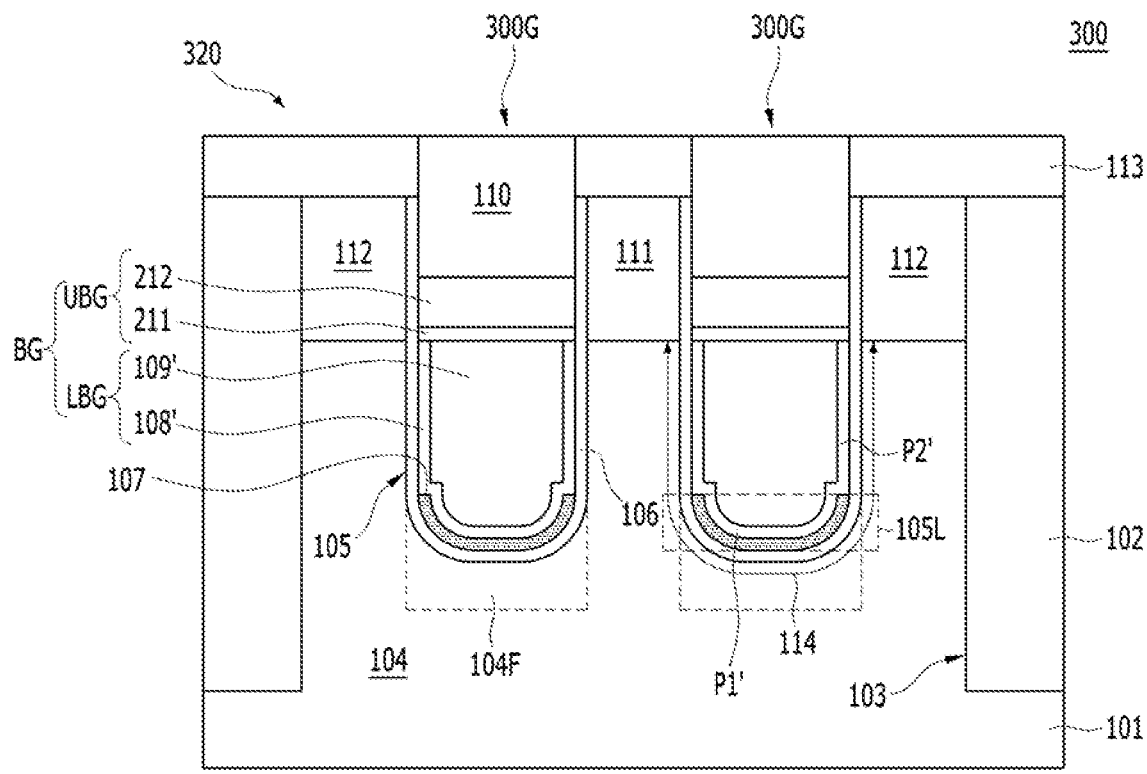
FIG. 4A is a side cross-sectional schematic view of a semiconductor device, according to a third embodiment of present invention.
Figure 4B:
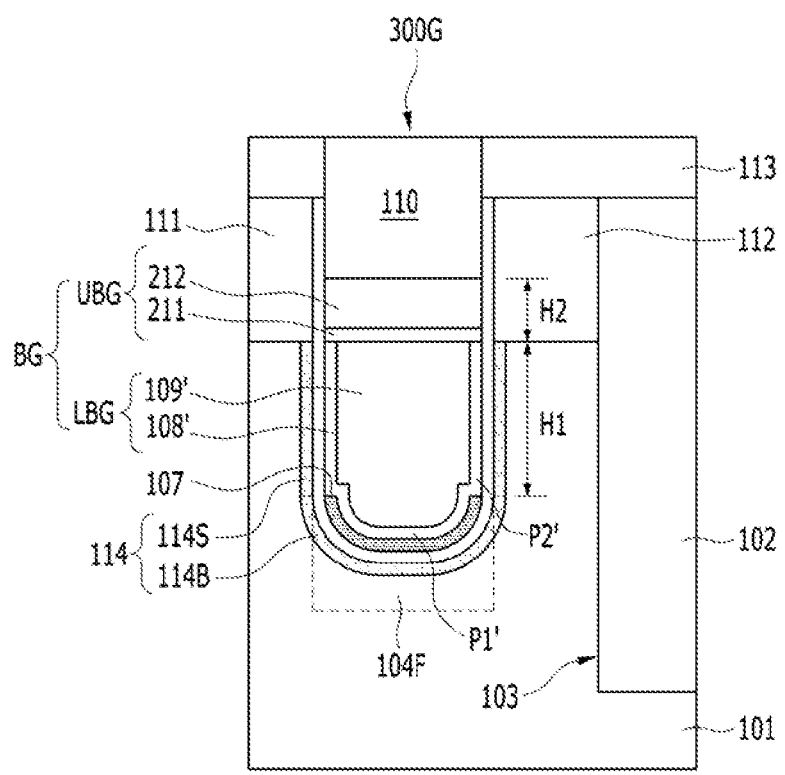
FIG. 4B is a detailed view of an example of a buried gate structure in accordance with the third embodiment.

FIG. 4A is a side cross-sectional view of a semiconductor device, 300 according to a third embodiment of the present invention. FIG. 4B is a detailed view of art example of a buried gate structure 300G according to the third embodiment of the present invention. A transistor 320 is shown as a part of a semiconductor device 300.

Referring to FIGS. 4A and 4B, some components of the semiconductor device 300 may be the same as those of the semiconductor device 200 according to the second embodiment of the present invention. The semiconductor device 300 may further include a barrier layer 211 and a low work function layer 212.

The semiconductor device 300 may include a buried gate structure 300G, a channel region 114, a first doping region 111, and a second doping region 112. An isolation layer 102 and an active region 104 may be formed in a substrate 101. The first and second doping regions 111 and 112 may be disposed in the active region 104. A gate trench 105 that extends across the active region 104 and the isolation layer 102 may be formed. The buried gate structure 300G may be formed in the gate trench 105. The channel region 114 may include the gate trench 105.

The buried gate structure 300G may be embedded in the gate trench 105. The buried gate structure 300G may include a gate dielectric layer 106, a dipole inducing layer 107, a gate electrode BG, and a capping layer 110. The top surface of the gate electrode BG may be positioned at a level lower than the top surface of the active region 104.

The gate electrode BG may include a first buried portion LBG and a second buried portion UBG. The first buried portion LBG may fill the lower portion of the gate trench 105. The second buried portion UBG may be positioned on the first buried portion LBG. The first buried portion LBG may be referred to as a 'bottom gate electrode,' and the second buried portion UBG may be referred to as a 'top gate electrode.' The second buried portion UBG may overlap with the first and second doping regions 111 and 112. The second buried portion UBG is partially filled in the gate trench 105 on the first buried portion LBG. The top surface of the second buried portion UBG may be at a lower level than the top surface of the substrate 101. The first buried portion LBG may overlap with a bottom channel 114B and a side channel 114S. The second buried portion UBG may overlap with the first and second doping regions 111 and 112. Since the gate electrode BG includes the first and second buried portions LBG and UBG in this way, the gate electrode BG may be referred to as a dual BG. The top surface of the first buried portion LBG may be the same level as the bottom surfaces of the first and second doping regions 111 and 112. That is to say, the first buried portion LBG may not overlap with the first and second doping regions 111 and 112. The first buried portion LBG may occupy a larger volume than the second buried portion UBG in the gate electrode BG.

The first buried portion LBG of the gate electrode BG may include a work function layer 108' and a low-resistivity layer 109'. The work function layer 108' and the low-resistivity layer 109' may be the same materials as the work function layer 108 and the low-resistivity layer 109 according to the second embodiment of the present invention. The work function layer 108' may include a first portion P1' and a second portion P2'. The first portion P1' of the work function layer 108' may contact the dipole inducing layer 107, and the second portion P2' of the work function layer 108' may not contact the dipole inducing layer 107. The first portion P1' of the work function layer 108 may have its work function modulated, and the second portion P2' of the work function layer 108' may be a portion of which work function is not modulated. The first portion P1' of the work function layer 108' may have a high work function, and the second portion P2' of the work function layer 108' may have a work function lower than the first portion P1'. The first portion P1' of the work function layer 108' may have a high work function that is able to shift the threshold voltage of the bottom channel 114B. The second portion P2' of the work function layer 108' may have a work function that does not shift the threshold voltage of the side channel 114S. For example, the threshold voltage of the bottom channel 114B may be increased by the first portion P1' of the work function layer 108', whereas the threshold voltage of the side channel 114S may be suppressed from being increased by the second portion P2' of the work function layer 108'. The work function layer 108' may be a metal nitride. The work function layer 108' may be a titanium nitride (TiN). The low-resistivity layer 109' may include tungsten. Unlike the second embodiment, the second portion P2' of the work function layer 108' may not overlap with the first and second doping regions 111 and 112.

The second buried portion UBG may include the barrier layer 211 and the low work function layer 212. The barrier layer 211 may be, a conductive material. The barrier layer 211 may be or include a metal material for reducing the resistivity of the gate electrode BG. The barrier layer 211 may be a metal nitride. The barrier layer 211 and the work function layer 108' may be the same material. The barrier layer 211 may be a titanium nitride (TiN). The barrier layer 211 may be a material of which work function is not modulated. Namely, the barrier layer 211 and the second portion P2' of the work function layer 108' may have the same work function. By the barrier layer 211, interdiffusion or interaction between the low work function layer 212 and the low-resistivity layer 109' may be prevented.

The low work function layer 212 may partially fill the gate trench 105. The low work function layer 212 may be a non-metal material. The low work function layer 212 may be a material having a low work function. The low work function layer 212 may have a work function lower than the second portion P2' of the work function layer 108'. The low work function layer 212 may include polysilicon. In particular, the low work function layer 212 may include N-type doped polysilicon, which is doped with an N-type dopant, to have a low work function. N-type doped polysilicon has a work function lower than the mid-gap work function of silicon. N-type doped polysilicon has a work function lower than a titanium nitride. The low work function layer 212 may overlap with the first and second doping regions 111 and 112.

According to the third embodiment, the dipole inducing layer 107 may be a material that induces a high work function, and may be formed to be sufficiently separated by a first height H1 from the first and second doping regions 111 and 112.

A threshold voltage is shifted by the dipole inducing layer 107. For example, a threshold voltage may be increased by the dipole inducing layer 107. Since a threshold voltage may be modulated by the dipole inducing layer 107, the channel dose of the bottom channel 114B may be decreased. That is to say, the dose of LCI may be remarkably decreased or LCI may be omitted. As a result, in the present embodiment, because a channel dose is decreased by the dipole inducing layer 107, junction leakage may be improved.

Also, in the third embodiment, since the low work function layer 212 has a low work function, it is possible to suppress GIDL in the first and second doping regions 111 and 112. The low work function layer 212 may overlap with the first and second doping regions 111 and 112 by a second height H2. The second height H2 may be smaller than the first height H1.

Furthermore, since not only the dipole inducing layer 107 is formed to not overlap with the side channel 114S but also the low work function layer 212 has a low work function, off-state leakage may be prevented.

The buried gate structure 300G according to the third embodiment may be applied to a buried gate type fin channel transistor as shown in FIG. 3A. That is to say, a fin region 104F may be additionally included under the buried gate structure 300G.

Figure 5A:
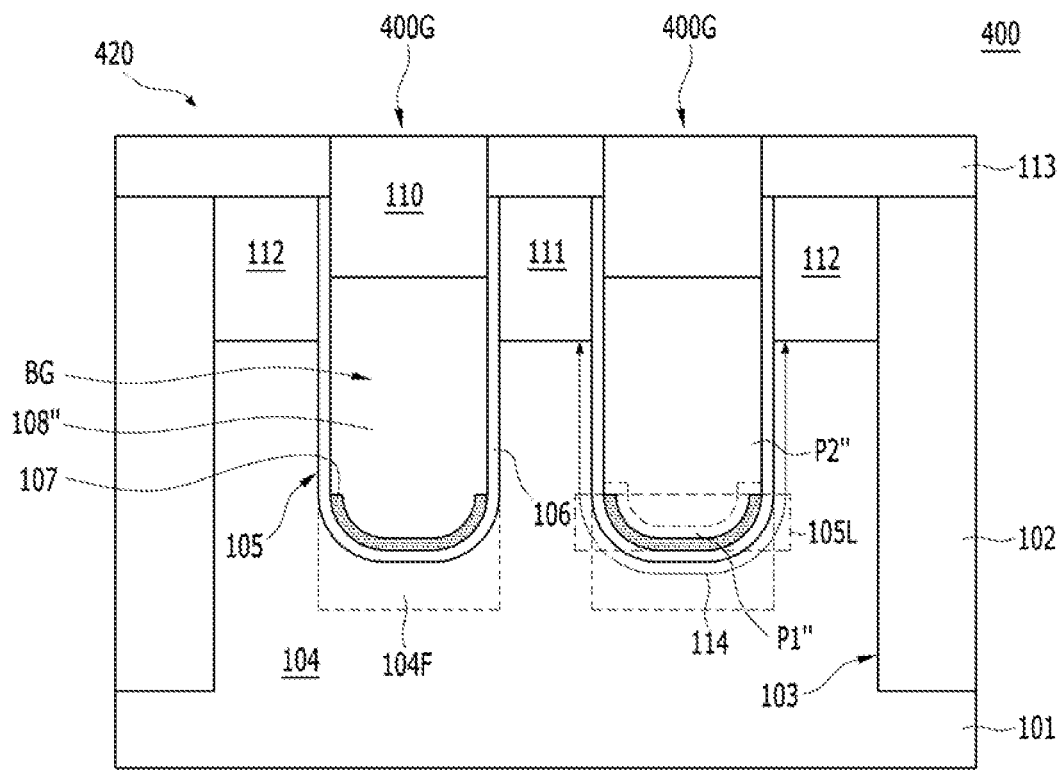
FIG. 5A is a side cross-sectional schematic view of semiconductor device, according to a fourth embodiment of the present invention.
Figure 5B:
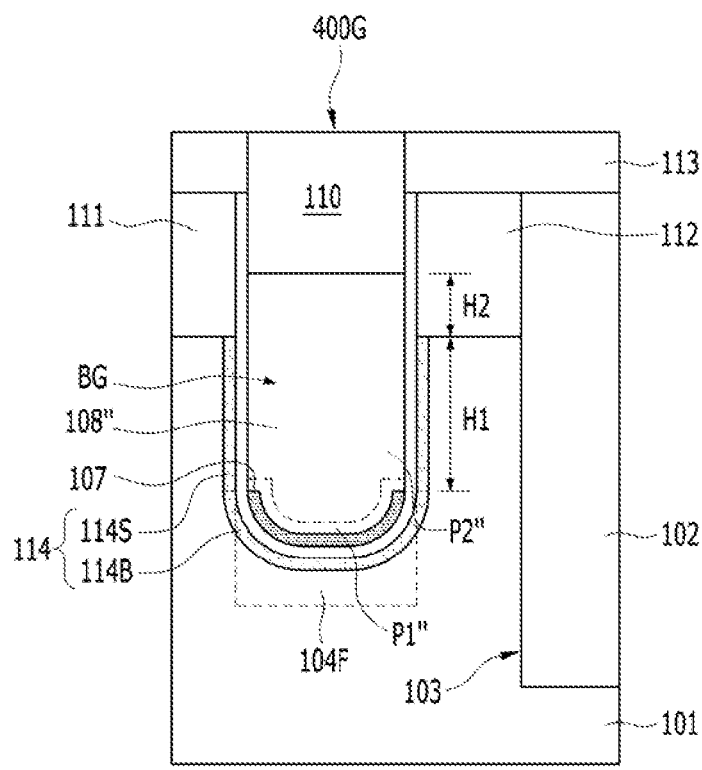
FIG. 5B is a detailed view of an example of a buried gate structure in accordance with the fourth embodiment.

FIG. 5A is a side cross-sectional schematic view of a semiconductor device, 400 according to a fourth embodiment of the present invention. FIG. 5B is a detailed view of an example of a buried gate structure 400G according to the fourth embodiment of the present invention. A transistor 420 is shown as a part of a semiconductor device 400.

Referring to FIGS. 5A and 5B, some components of the semiconductor device 400 may be the same as those of the semiconductor device 200 according to the second embodiment of the present invention.

The semiconductor device 400 may include the buried gate structure 400G, a channel region 114, a first doping region 111, and a second doping region 112. An isolation layer 102 and an active region 104 may be formed in a substrate 101. The first and second doping regions 111 and 112 may be disposed in the active region 104. A gate trench 105 that extends across the active region 104 and the isolation layer 102 may be formed. The buried gate structure 400G may be formed in the gate trench 105. The channel region 114 may include the gate trench 105.

The buried gate structure 400G may be embedded in the gate trench 105. The buried gate structure 400G may include a gate dielectric layer 106, a dipole inducing layer 107, a gate electrode BG, and a capping layer 110. The top surface of the gate electrode BG may be positioned at a level lower than the top surface of the active ion 104. The gate electrode BG may be a single structure. That is to say, only a work function layer 108" may fill the gate trench 105 without a low-resistivity layer. Accordingly, the resistivity of the gate electrode BG may be improved.

The work function layer 108" may be the same material as the work function layer 108 according to the second embodiment of the present invention. The work function layer 108" may include a first portion P1" and a second portion P2". The first portion P1" may contact the dipole inducing layer 107, and the second portion P2" may not contact the dipole inducing layer 107. The first portion P1" may have its work function modulated, and the second portion P2" may be a portion of which work function is not modulated. The first portion P1" may have a high work function, and the second portion P2" may have a work function lower than the first portion P1". The first portion P1" may have a high work function that is able to shift the threshold voltage of a bottom channel 114B. The second portion P2" may have a work function that does not shift the threshold voltage of a side channel 114S. For example, the threshold voltage of the bottom channel 114B may be increased by the first portion P1", whereas the threshold voltage of the side channel 114S may be suppressed from being increased by the second portion P2". The work function layer 108" may be a metal nitride. The work function layer 108" may be a titanium nitride (TiN). In the same manner as the second embodiment, the second portion P2" of the work function layer 108" may overlap with the first and second doping regions 111 and 112 by a second height H2. Since the work function layer 108" includes a titanium nitride, that is, the work function layer 108" is a fluorine-free material, a barrier layer may be omitted. Since a barrier layer is omitted, filling of the work function layer 108" may be improved.

According to the fourth embodiment, the dipole inducing layer 107 may be a material that induces a high work function, and may be formed to be sufficiently separated by a first height H1 from the first and second doping regions 111 and 112.

A threshold voltage is shifted by the dipole inducing layer 107. For example, a threshold voltage may be increased by the dipole inducing layer 107. Since a threshold voltage may be modulated by the dipole inducing layer 107, the channel dose of the bottom channel 114B may be decreased. That is to say, the dose of LCI may be remarkably decreased or LCI may be omitted. As a result, in the present embodiment, because a channel dose is decreased by the dipole inducing layer 107, junction leakage may be improved.

Also, in the fourth embodiment, since the second portion P2" of the work function layer 108" has a low work function, is possible to suppress GIDL in the first and second doping regions 111 and 112.

Furthermore, since not only the dipole inducing layer 107 formed to not overlap with the side channel 114S but also the second portion P2" of the work function layer 108" has a low work function, off-state leakage may be prevented.

In addition in the fourth embodiment, since the gate electrode BG is formed using only the work function layer 108", the resistivity of the gate electrode BG may be improved.

The buried gate structure 400G according to the fourth embodiment may be applied to a buried gate type fin channel transistor as shown in FIG. 3A. That is to say, a fin region 104F may be additionally included under the buried gate structure 400G.

Figure 6A:
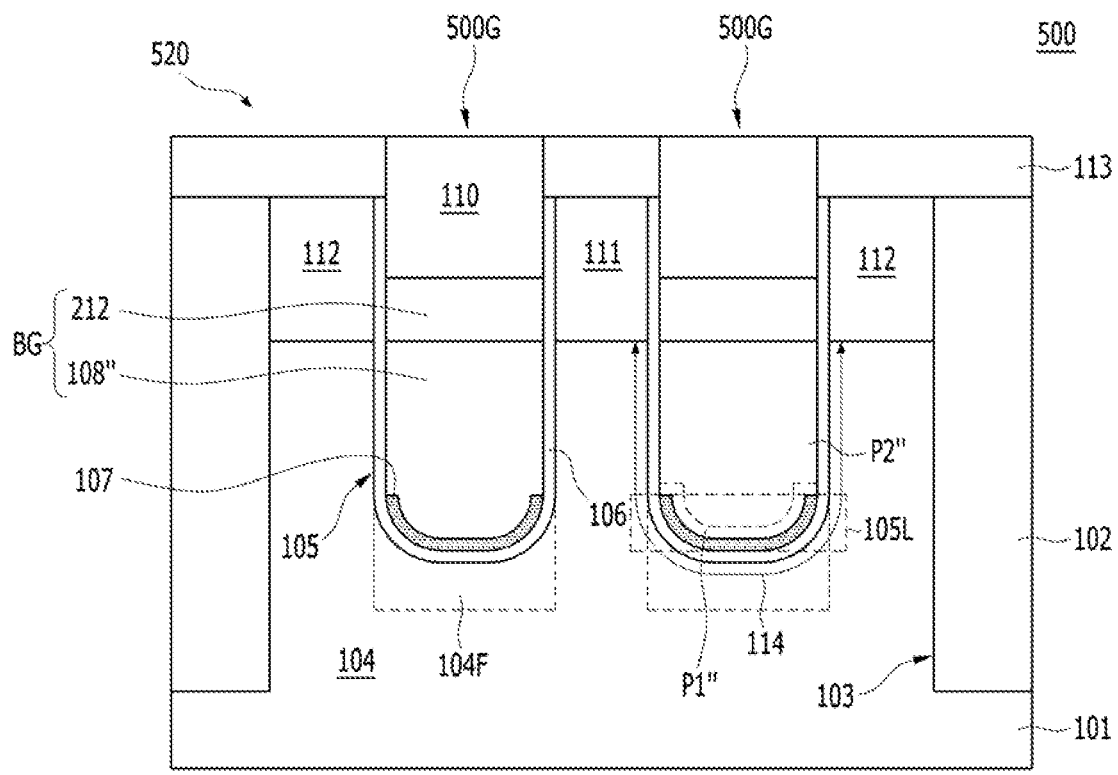
FIG. 6A is a side cross-sectional schematic view of semiconductor device, according to a fifth embodiment of the present invention.
Figure 6B:
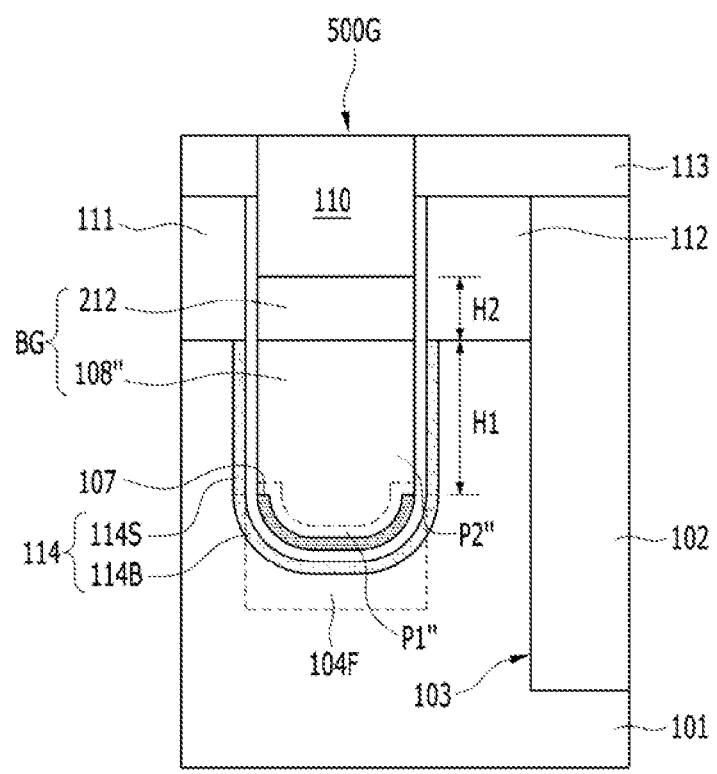
FIG. 6B is a detailed view of an example of a buried gate structure in accordance with the fifth embodiment.

FIG. 6A is a side cross-sectional schematic view of a semiconductor device, 500 according to a fifth embodiment of the present invention. FIG. 6B is a detailed view of an example of a buried gate structure 500G according to the fifth embodiment of the present invention. A transistor 520 is shown as a part of a semiconductor device 500.

Referring to FIGS. 6A and 6B, some components of the semiconductor device 500 may be the same a those of the semiconductor device 400 according to the fourth embodiment of the present invention. The semiconductor device 500 may further include a low work function layer 212.

The semiconductor device 500 may include the buried gate structure 500G a channel region 114, a first doping region 111, and a second doping region 112. An isolation layer 102 and an active region 104 may be formed in a substrate 101. The first and second doping regions 111 and 112 may be disposed in the active region 104. A gate trench 105 that extends across the active region 104 and the isolation layer 102 may be formed. The buried gate structure 500G may be formed in the gate trench 105. The channel region 114 may include the gate trench 105.

The buried gate structure 500G may be embedded in the gate trench 105. The buried gate structure 500G may include a gate dielectric layer 106, a dipole inducing layer 107, a gate electrode BG, and a capping layer 110. The top surface of the gate electrode BG may be positioned at a level lower than the top surface of the active region 104.

The gate electrode BG may include a work function layer 108" and the low work function layer 212. The work function layer 108" may fill the lower portion of the gate trench 105. The low work function layer 212 may be positioned on the work function layer 108". The low work function layer 212 may overlap with the first and second doping regions 111 and 112. The low work function layer 212 is partially filled in the gate trench 105 on the work function layer 108". The top surface of the low work function layer 212 may be at a lower level than the top surface of the substrate 101. The work function layer 108" may overlap with a bottom channel 114B and a side channel 114S. The top surface of the work function layer 108" may be the same level as the bottom surfaces of the first and second doping regions 111 and 112. In other words, the work function layer 108" may not overlap with the first and second doping regions 111 and 112. The work function layer 108" may occupy a larger volume than the low work function layer 212 in the gate electrode BG.

The work function layer 108" may be the same material as the work function layer 108" according to the fourth embodiment of the present invention. The work function layer 108" may include a first portion P1" and a second portion P2". The first portion P1" of the work function layer 108" may contact the dipole inducing layer 107, and the second portion P2" of the work function layer 108" may not contact the dipole inducing layer 107. The first portion P1" of the work function layer 108" may have its work function modulated, and the second portion P2" of the work function layer 108" may be a portion of which work function is not modulated. The first portion P1" of the work function layer 108" may have a high work function, and the second portion P2" of the work function layer 108" may have a work function lower than the first portion P1". The first portion P1" of the work function layer 108" may have a high work function that is able to shift the threshold voltage of the bottom channel 114B. The second portion P2" of the work function layer 108" may have a work function that does not shift the threshold voltage of the side channel 114S. For example, the threshold voltage of the bottom channel 114B may be increased by the first portion P1" of the work function layer 108", whereas the threshold voltage of the side channel 114S may be suppressed from being increased by the second portion P2" of the work function layer 108". The work function layer 108" may be a metal nitride. The work function layer 108" may be a titanium nitride (TiN). The second portion P2" of the work function layer 108" may not overlap with the first and second doping regions 111 and 112. Since the work function layer 108" includes a titanium nitride, that is, the work function layer 108" is a fluorine-free material, a barrier layer may be omitted. Since a barrier layer is omitted, filling of the work function layer 108" may be improved.

The log work function layer 212 may be a non-metal material. The low work function layer 212 may be a material having a low work function. The low work function layer 212 may have a work function lower than the second portion P2" of the work function layer 108". The low work function layer 212 may include polysilicon. In particular, the low work function layer 212 may include N-type doped polysilicon, which is doped with an N-type dopant, to have a low work function N-type doped polysilicon has a work function lower than the mid-gap work function of silicon. N-type doped polysilicon has a work function lower than a titanium nitride. The low work function layer 212 may overlap with the first and second doping regions 111 and 112.

According to the fifth embodiment, the dipole inducing layer 107 may be a material that induces a high work function, and may be formed to be sufficiently separated by a first height H1 from the first and second doping regions 111 and 112.

A threshold voltage is shifted by the dipole inducing layer 107. For example, a threshold voltage may be increased by the dipole inducing layer 107. Since a threshold voltage may be modulated by the dipole inducing layer 107, the channel dose of the bottom channel 114B may be decreased. That is to say, the dose of LCI may be remarkably decreased or LCI may be omitted. As a result, in the present embodiment, because a channel dose is decreased by the dipole inducing layer 107, junction leakage may be improved.

Also, in the fifth embodiment, since the low work function layer 212 has a low work function, it is possible to suppress GIDL in the first and second doping regions 111 and 112.

Furthermore, since not only the dipole inducing layer 107 is formed to not overlap with the side channel 114S but also the second portion P2" of the work function layer 108" and the low work function layer 212 have low work functions, off-state leakage may be prevented.

The buried gate structure 500G according to the fifth embodiment may be applied to a buried gate type fin channel transistor as shown in FIG. 3A. That is to say, a fin region 104F may be additionally included under the buried gate structure 500G.

Figure 7:
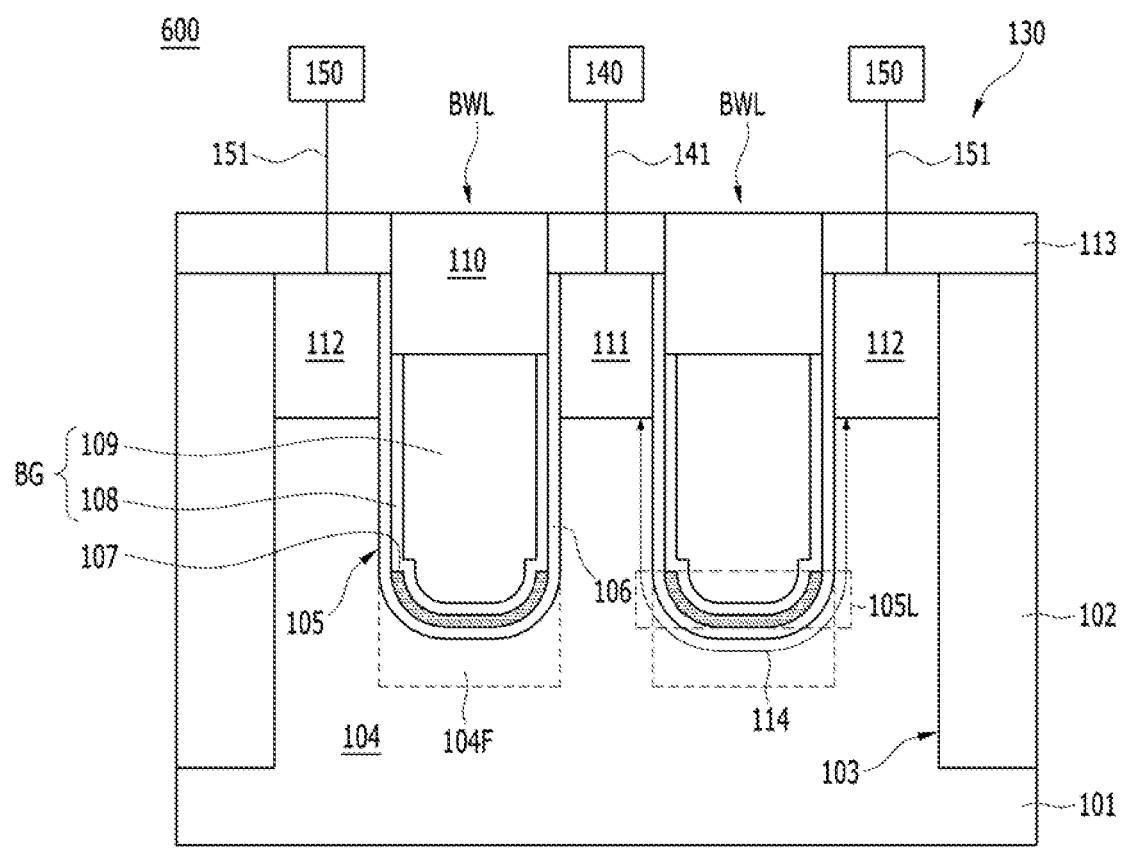
FIG. 7 is a view illustrating an application example of the semiconductor device, according to the second embodiment of the present invention.

FIG. 7 is a view illustrating a representation of an application example of the semiconductor device according to the second embodiment of the present invention.

Referring to FIG. 7, a memory cell 600 is shown. The memory cell 600 may include a cell transistor 130, a bit line 140, and a memory element 150. The cell transistor 130 may be the transistor 220 of FIG. 2A. Accordingly, the cell transistor 130 may include a buried word line structure BWL, a channel region 114, a first doping region 111, and a second doping region 112. The first doping region 111 may be electrically coupled to the bit line 140 through a first contact plug 141. The second doping region 112 may be electrically coupled to the memory element 150 through a second contact plug 151. The first contact plug 141 and the second contact plug 151 may be coupled to the first and second doping regions 111 and 112, respectively, through a hard mask layer 113. The buried word line structure BWL may be the same as a buried gate structure 200G. The buried word line structure BWL may be embedded in a gate trench 105. The buried word line structure BWL may include a gate dielectric layer 106, a dipole inducing layer 107, a gate electrode BG, and a capping layer 110. The gate electrode BG may include a work function layer 108 and a low-resistivity layer 109.

The cell transistor 130 may be replaced with the transistor 220M of FIG. 3A. Further, the buried word line structure BWL of the cell transistor 130 may be replaced with one of the buried gate structures 300G, 400G and 500G according to the third to fifth embodiments.

The memory element 150 may be a capacitor. The memory element 150 may include a storage node that contacts the second contact plug 151. The storage node may be a cylinder or pillar shape. A capacitor dielectric layer may be formed on the surface of the storage node. The capacitor dielectric layer may include at least any one selected among a zirconium oxide, an aluminum oxide and a hafnium oxide. For example, the capacitor dielectric layer may be a ZAZ structure in which a first zirconium oxide, an aluminum oxide and a second zirconium oxide are stacked. A plate node is formed on the capacitor dielectric layer. The storage node and the plate node may include metal-containing materials.

In another embodiment, the memory element 150 may include a variable resistor. The variable resistor may include a phase change material. The phase change material may include at least one selected between Te and Se as chalcogenide elements. In another embodiment, the variable resistor may include a transition metal oxide. In still another embodiment, the variable resistor may be a magnetic tunnel junction (MTJ).

As described above, the memory cell 600 may include the buried word line structure BWL that includes the work function layer 108 and the low-resistivity layer 109. In the case where the memory cell 600 is applied to a DRAM, the refresh characteristic of the DRAM may be improved. Also, by preventing off-state leakage, a retention time may be improved.

Figure 8A:
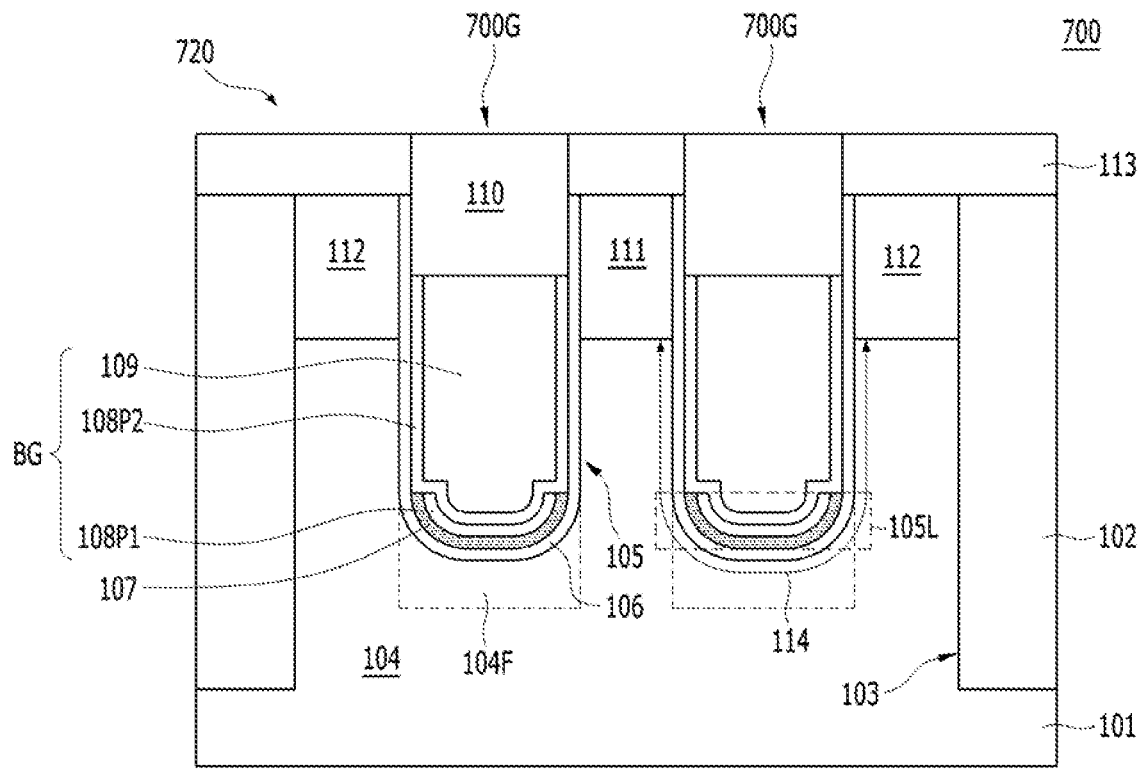
FIG. 8A is a side cross-sectional schematic view of semiconductor device, according to a sixth embodiment of the present invention.
Figure 8B:
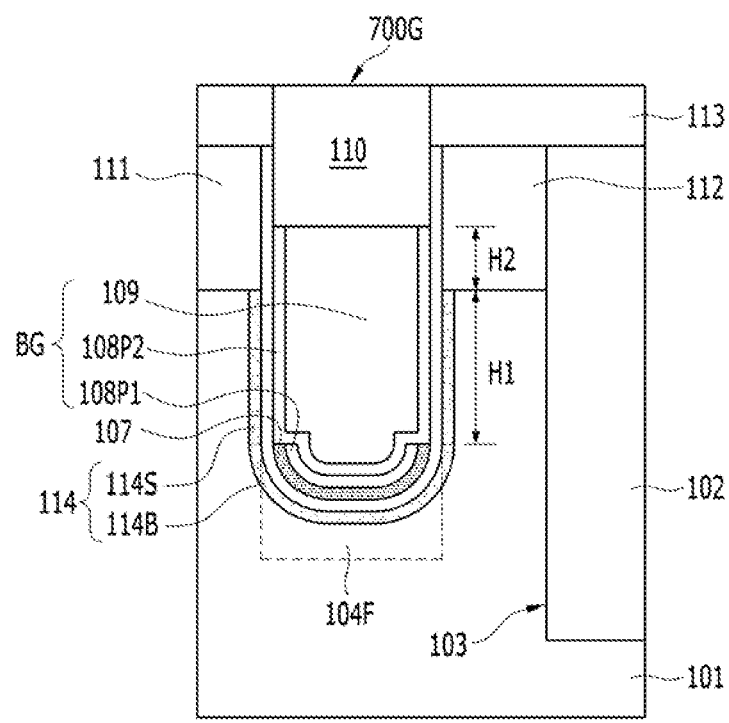
FIG. 8B is a detailed view of an example of buried gate structure in accordance with the sixth embodiment.

FIG. 8A is a side cross-sectional schematic view of a semiconductor device, 700 according to a sixth embodiment of the present invention. FIG. 8B is a detailed view of an example of a buried gate structure 700G according to the sixth embodiment of the present invention. A transistor 720 is shown as a part of a semiconductor device 700.

Referring to FIGS. 8A and 8B, some components of the semiconductor device 700 may be the same, as those of the semiconductor device 200 according to the second embodiment of the present invention. The semiconductor device 700 may include a first work function layer 108P1 and a second work function layer 108P2.

The semiconductor device 700 may include the buried gate structure 700G, a channel region 114, a first doping region 111, and a second doping region 112. An isolation layer 102 and an active region 104 may be formed in a substrate 101. The first and second doping regions 111 and 112 may be disposed in the active region 104. A gate trench 105 that extends across the active region 104 and the isolation layer 102 may be formed. The buried gate structure 700G may be formed in the gate trench 105. The channel region 114 may include the gate trench 105.

The buried gate structure 700G may be embedded in the gate trench 105. The buried gate structure 700G may include a gate dielectric layer 106, a dipole inducing layer 107, a gate electrode BG, and a capping layer 110. The top surface of the gate electrode BG may be positioned at a level lower than the top surface of the active region 104.

The gate electrode BG ma y include the first work function layer 108P1 the second work function layer 108P2, and a low-resistivity layer 109. Most of the inside of the gate trench 105 may be filled with the low-resistivity layer 109, and the first and second work function layers 108P1 and 108P2 of thin thicknesses may be formed between the low-resistivity layer 109 and the gate dielectric layer 106. The first and second work function layers 108P1 and 108P2 may be the same material as the work function layer 108 of the second embodiment of the present invention. The first work function layer 108P1 may have a high work function, and the second work function layer 108P2 may have a low work function. The first and second portions P1 and P2 of the second embodiment are defined in the work function layer 108. On the contrary to this, in the sixth embodiment, the first and second work function layers 108P1 and 108P2 may be formed independently of each other.

The first work function layer 108P1 may be positioned on only the dipole inducing layer 107. That is to say, the first work function layer 108P1 may not be positioned on the gate dielectric layer 106. The second work function layer 108P2 may cover the first work function layer 108P1 and the gate dielectric layer 106. The first and second work function layers 108P1 and 108P2 may perform the function of a barrier layer. For example, the first and second work function layers 108P1 and 108P2 may prevent an impurity from diffusing to the gate dielectric layer 106 from the low-resistivity layer 109.

The first work function layer 108P1 may overlap with a bottom channel 114B, and the second work function layer 108P2 may overlap with a side channel 114S. The second work function layer 108P2 may also overlap with the first and second doping regions 111 and 112. The first work function layer 108P1 may have its work function modulated, and the second work function layer 108P2 may be a portion of which work function is not modulated. For example, the second work function layer 108P2 may have an intrinsic work function of the material itself of the second work function layer 108P2, and the first work function layer 108P1 may have a work function that is increased by the dipole inducing layer 107. The first and second work function layers 108P1 and 108P2 may include a titanium nitride. Accordingly, the first work function layer 108P1 may be a titanium nitride of which work function is increased, and the second work function layer 108P2 may be a titanium nitride of which work function is not modulated.

The first work function layer 108P1 may have a high work function that is able to shift the threshold voltage of the bottom channel 114B. The second work function layer 108P2 may have a work function that does not shift the threshold voltage of the side channel 114S. For example, the threshold voltage of the bottom channel 114B may be increased by the first work function layer 108P1, whereas the threshold voltage of the side channel 114S may be suppressed from being increased by the second work function layer 108P2.

According to the sixth embodiment the dipole inducing layer 107 may be a material that induces a high work function, and may be formed to be sufficiently separated by a first height H1 from the first and second doping regions 111 and 112.

A threshold voltage is shifted by the dipole inducing layer 107. For example, a threshold voltage may be increased by the dipole inducing layer 107. Since a threshold voltage may be modulated by the dipole inducing layer 107, the channel dose of the bottom channel 114B may be decreased. That is to say, the dose of LCI may be remarkably decreased or LCI may be omitted. As a result, in the in present embodiment, because a channel dose is decreased by the dipole inducing layer 107, junction leakage may be improved.

Also, in the sixth embodiment, since the second work function layer 108P2 has a low work function, it is possible to suppress GIDL in the first and second doping regions 111 and 112.

Furthermore, since not only the dipole inducing layer 107 is formed to non-overlap with the side channel 114S but also the second work function layer 108P2 has a low work function, off-state leakage may be prevented.

The buried gate structure 700G according to the sixth embodiment may be applied to a buried gate type fin channel transistor as shown in FIG. 3A. That is to say, a fin region 104F may be additionally included under the buried gate structure 700G.

Figure 9A:
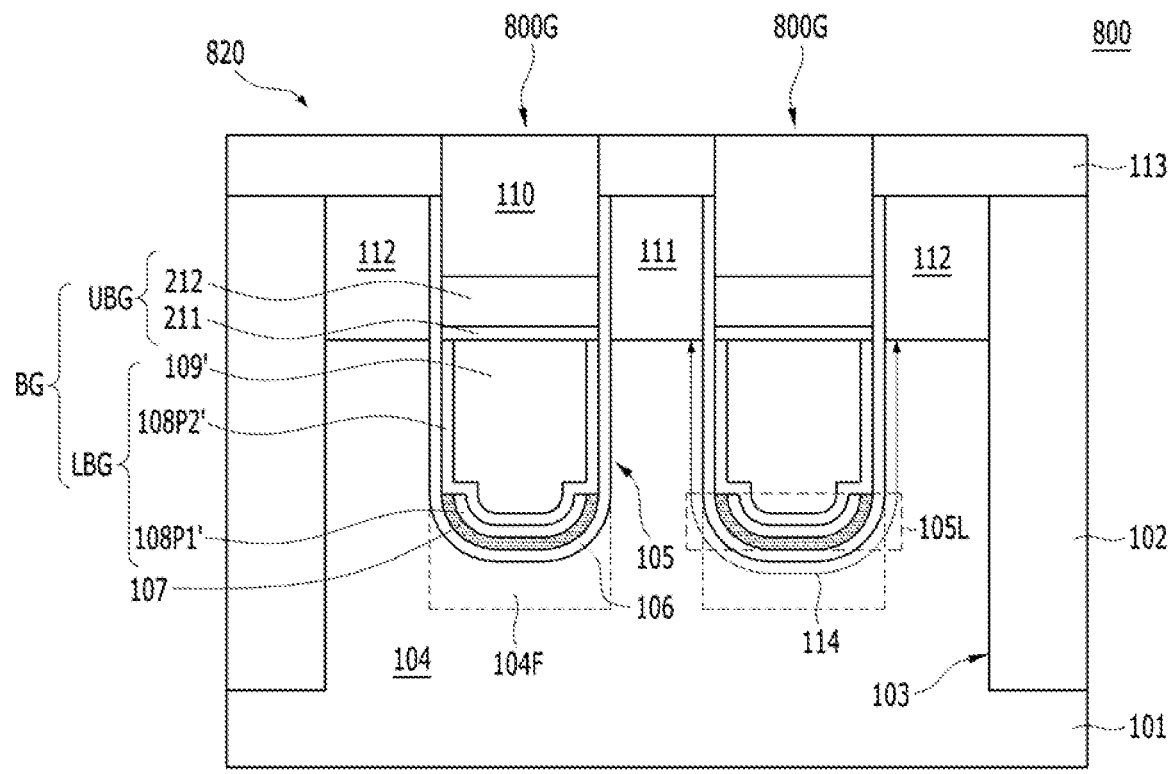
FIG. 9A is a side cross=schematic view of a semiconductor device, according to a seventh embodiment of the present invention.
Figure 9B:
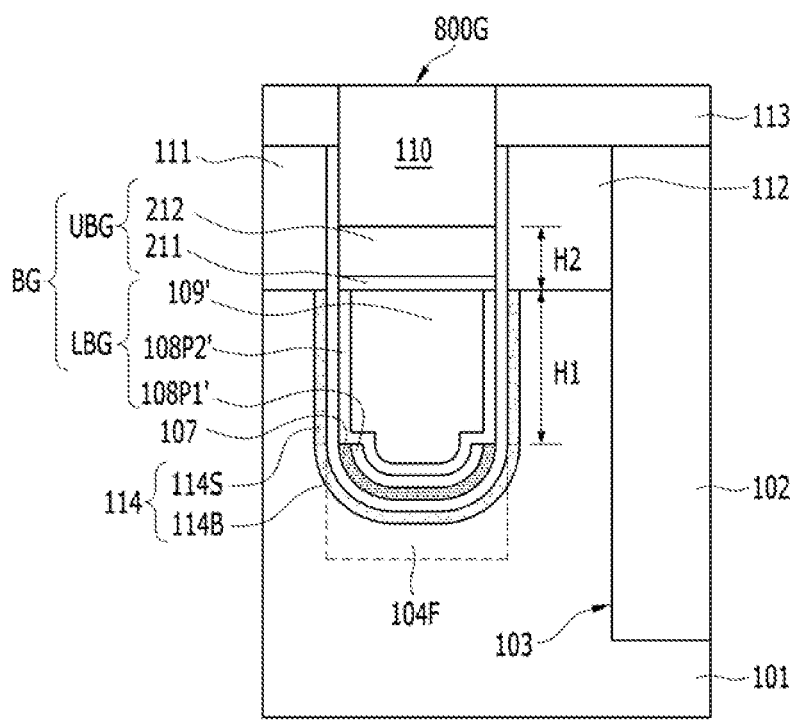
FIG. 9B is a detailed view of an example of a buried gate structure in accordance with the seventh embodiment.

FIG. 9A is a side cross-sectional schematic view of a semiconductor device, 800 according to a seventh embodiment of the present invention. FIG. 9B is a detailed view of an example of a buried gate structure 800G according to the seventh embodiment of the present invention. A transistor 820 is shown as a part of a semiconductor device 800.

Referring to FIGS. 9A and 9B some components of the semiconductor device 800 may be the same as those of the semiconductor device 700 according to the sixth embodiment of the present invention. The semiconductor device 800 may further include a barrier layer 211 and a low work function layer 212.

The semiconductor device 800 may include the buried gate structure 800G, a channel region 114, a first doping region 111, and a second doping region 112. An isolation layer 102 and an active region 104 may be formed in a substrate 101. The first and second doping regions 111 and 112 may be disposed in the active region 104. A gate trench 105 that extends across the active region 104 and the isolation layer 102 may be formed. The buried gate structure 800G may be formed in the gate trench 105. The channel region 114 may include the gate trench 105.

The buried gate structure 800G may be embedded in the gate trench 105. The buried gate structure 800G may include a gate dielectric layer 106, a dipole inducing layer 107, a gate electrode BG, and a capping layer 110. The top surface of the gate electrode BG may be positioned at a level lower than the top surface of the active region 104.

The gate electrode BG m ay include a first buried portion LBG and a second buried portion UBG. The first buried portion LBG may fill the lower portion of the gate trench 105. The second buried portion UBG may be positioned on the first buried portion LBG. The second buried portion UBG may overlap with the first and second doping regions 111 and 112. The second buried portion UBG is partially filled in the gate trench 105 on the first buried portion LBG. The top surface of the second buried portion UBG may be at a lower level than the top surface of the substrate 101. The first buried portion LBG may overlap with a bottom channel 114B and a side channel 114S. The second buried portion UBG may overlap with the first and second doping regions 111 and 112. Since the gate electrode BG includes the first and second buried portions LBG and UBG in this way, the gate electrode BG may be referred to as a dual BG. The top surface of the first buried portion LBG may be the same level as the bottom surfaces of the first and second doping regions 111 and 112. That is to say, the first buried portion LBG may not overlap with the first and second doping regions 111 and 112. The first buried portion LBG may occupy a larger volume than the second buried portion UBG in the gate electrode BG.

The first buried portion LBG of the gate electrode BG may include a first work function layer 108P1', a second work function layer 108P2', and a low-resistivity layer 109'. The first work function layer 108P1', the second work function layer 108P2' and the low-resistivity layer 109' may be the same materials as the first work function layer 108P1, the second work function layer 108P2 and the low-resistivity layer 109 according to the sixth embodiment of the present invention. The first work function layer 108P1' may contact the dipole inducing layer 107. The first work function layer 108P1' may have a high work function, and the second work function layer 108P2' may have a low work function. The first work function layer 108P1' may increase the threshold voltage of the bottom channel 114B, whereas the threshold voltage of the side channel 114S may be suppressed from being increased by the second work function layer 108P2'. The first work function layer 108P1' may be a titanium nitride of which work function is increased, and the second work function layer 108P2' may be a titanium nitride of which work function is not modulated. The low-resistivity layer 109' may include tungsten. Unlike the sixth embodiment, the second work function layer 108P2' and the low-resistivity layer 109' may not overlap with the first and second doping regions 111 and 112.

The second buried portion UBG may include the barrier layer 211 and the low work function layer 212. The barrier layer 211 may be a conductive material. The barrier layer 211 may be a metal-base material for reducing the resistivity of the gate electrode BG. The barrier layer 211 may be a metal nitride. The barrier layer 211 and the second work function layer 108P2' may be the same material. The barrier layer 211 may be a titanium nitride (TiN). The barrier layer 211 may be a material of which work function is not modulated. In other words the barrier layer 211 and the second work function layer 108P2' may have the same work function. By the barrier layer 211, interdiffusion or interaction between the low work function layer 212 and the low resistivity layer 109' may be prevented.

The low work function layer 212 may partially fill the gate trench 105. The low work function layer 212 may be a non-metal material. The low work function layer 212 may be a material having a low work function. The low work function layer 212 may have a work function lower than the second work function layer 108P2'. The low work function layer 212 may include polysilicon. In particular, the low work function layer 212 may include N-type doped polysilicon, which is doped with an N-type dopant, to have a low work function. N-type doped polysilicon has a work function lower than the mid-gap work function of silicon. N-type doped polysilicon has a work function lower than a titanium nitride. The low work function layer 212 may overlap with the first and second doping regions 111 and 112.

According to the seventh embodiment the dipole inducing layer 107 may be a material that induces a high work function, and may be formed to be sufficiently separated by a first height H1 from the first and second doping regions 111 and 112.

A threshold voltage is shifted by the dipole inducing layer 107. For example, a threshold voltage may be increased by the dipole inducing layer 107. Since a threshold voltage may be modulated by the dipole inducing layer 107, the channel dose of the bottom channel 114B may be decreased. That is to say, the dose of LCI may be remarkably decreased or LCI may be omitted. As a result, in the present embodiment, because a channel dose decreased by the dipole inducing layer 107, junction leakage may be improved.

Also, in the seventh embodiment, since the low work function layer 212 has a low work function, it is possible to suppress GIDL in the first and second doping regions 111 and 112.

Furthermore, since not only the dipole inducing layer 107 is formed to not overlap with the side channel 114S but also the second work function layer 108P2' and the low work function layer 212 have low work functions, off-state leakage may be prevented.

The buried gate structure 800G according to the seventh embodiment may be applied to a buried gate type fin channel transistor as shown in FIG. 3A. That is to say, a fin region 104F may be additionally included under the buried gate structure 800G.

Figure 10A:
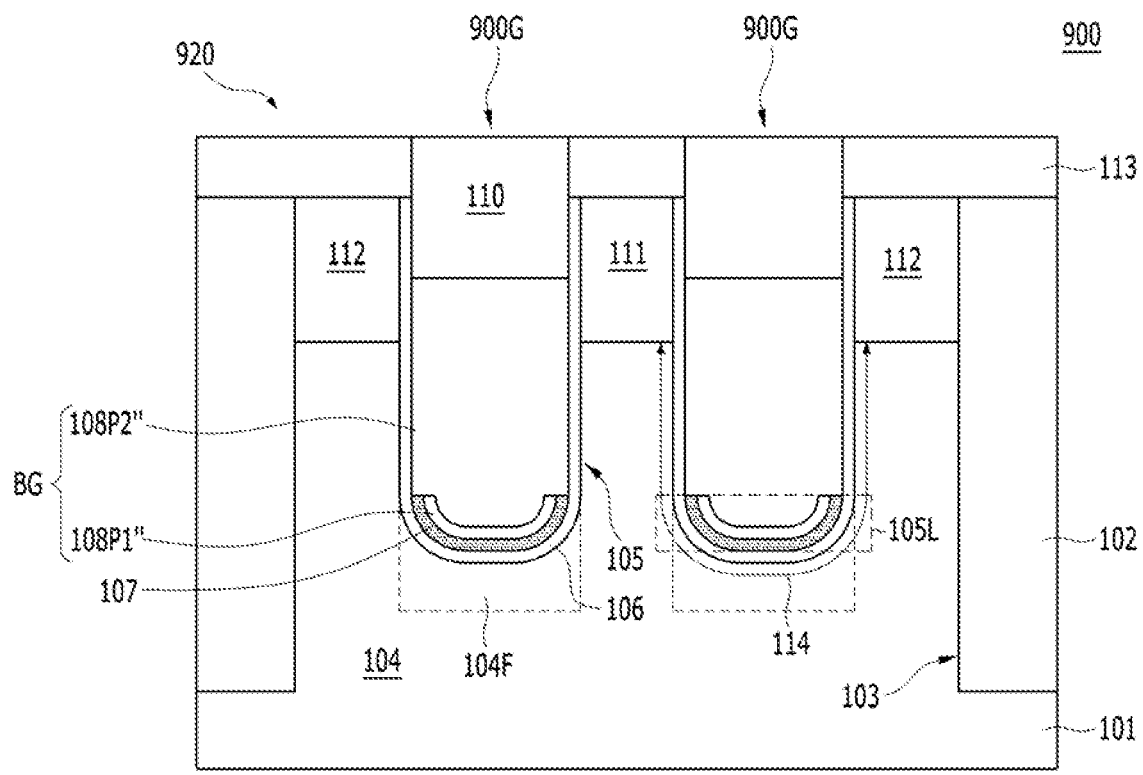
FIG. 10A is a side cross-sectional schematic view of a semiconductor device, according to an eighth embodiment of the present invention.
Figure 10B:
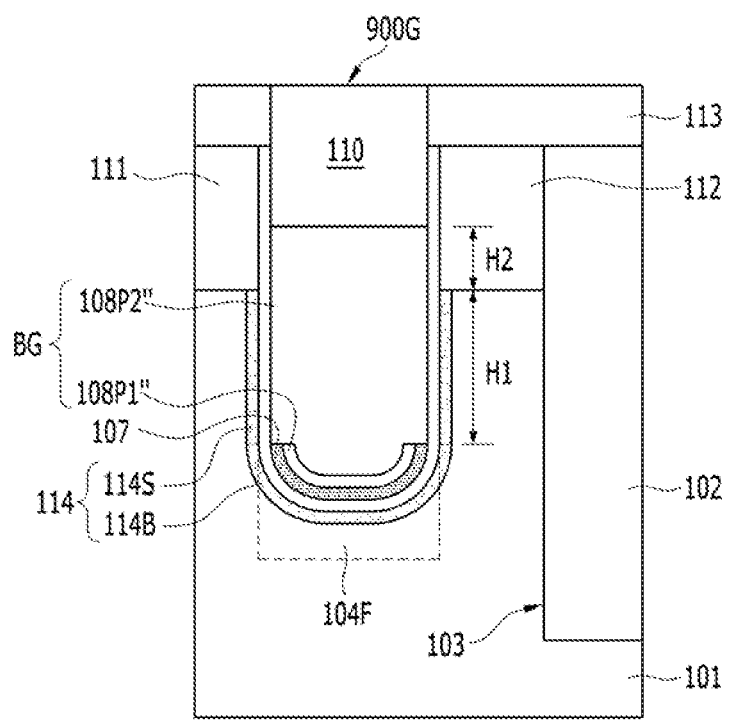
FIG. 10B is a detailed view of an example of a buried gate structure in accordance with the eighth embodiment.

FIG. 10A is a side cross-sectional schematic view of semiconductor device, 900 according to an eighth embodiment of the present invention. FIG. 10B is a detailed view of an example of a buried gate structure 900G according to the eighth embodiment of the present invention. A transistor 920 is shown as a part of a semiconductor device 900.

Referring to FIGS. 10A and 10B, some components of the semiconductor device 900 may be the same as those of the semiconductor device 700 according to the sixth embodiment of the present invention.

The semiconductor device 900 may include the buried gate structure 900G, a channel region 114, a first doping region 111, and a second doping region 112. An isolation layer 102 and an active region 104 may be formed in a substrate 101. The first and second doping regions 111 and 112 may be disposed in the active region 104. A gate trench 105 that extends across the active region 104 and the isolation layer 102 may be formed. The buried gate structure 900G may be formed in the gate trench 105. The channel region 114 may include the gate trench 105.

The buried gate structure 900G may be embedded in the gate trench 105. The buried gate structure 900G may include a gate dielectric layer 106, a dipole inducing layer 107, a gate electrode BG, and a capping layer 110. The top surface of the gate electrode BG may be positioned at a level lower than the top surface of the active region 104. The gate electrode BG may fill the gate trench 105 by only a first work function layer 108P1" and a second work function layer 108P2" without a low-resistivity layer. Accordingly, the resistivity of the gate electrode BG may be improved.

The second work function layer 108P2" may be the same material as the second work function layer 108P2 according to the sixth embodiment of the present invention. The second work function layer 108P2" may be a titanium nitride (TiN). The second work function layer 108P2" may overlap with the first and second doping regions 111 and 112. Since the second work function layer 108P2" includes a titanium nitride, that is, the second work function layer 108P2" is a fluorine-free material, a barrier layer may be omitted. Since a barrier layer is omitted, filling of the second work function layer 108P2" may be improved.

According to the eighth embodiment, the dipole inducing layer 107 may be a material that induces a high work function, and may be formed to be sufficiently separated by a first height H1 from the first and second doping regions 111 and 112.

A threshold voltage is shifted by the dipole inducing layer 107. For example, a threshold voltage may be increased by the dipole inducing layer 107. Since a threshold voltage may be modulated by the dipole inducing layer 107, the channel dose of a bottom channel 114B may be decreased. That is to say, the dose of LCI may be remarkably decreased or LCI may be omitted. As a result, in the present embodiment, because a channel dose is decreased by the dipole inducing layer 107, junction leakage may be improved.

Also, in the eighth embodiment, since the second work function layer 108P2" has a low work function, it is possible to suppress GIDL in the first and second doping regions 111 and 112.

Furthermore, since not only the dipole inducing layer 107 is formed to not overlap with the side channel 114S but also the second work function layer 108P2" has a low work function, off-state leakage may be prevented.

In addition, in the eighth embodiment, since the gate electrode BG is formed using only the first work function layer 108P1" and the second work function layer 108P2" of the same material, the resistivity of the gate electrode BG may be improved.

The buried gate structure 900G according to the eighth embodiment may be applied to a buried gate type fin channel transistor as shown in FIG. 3A. That is to say, a fin region 104F may be additionally included under the buried gate structure 900G.

Figure 11A:
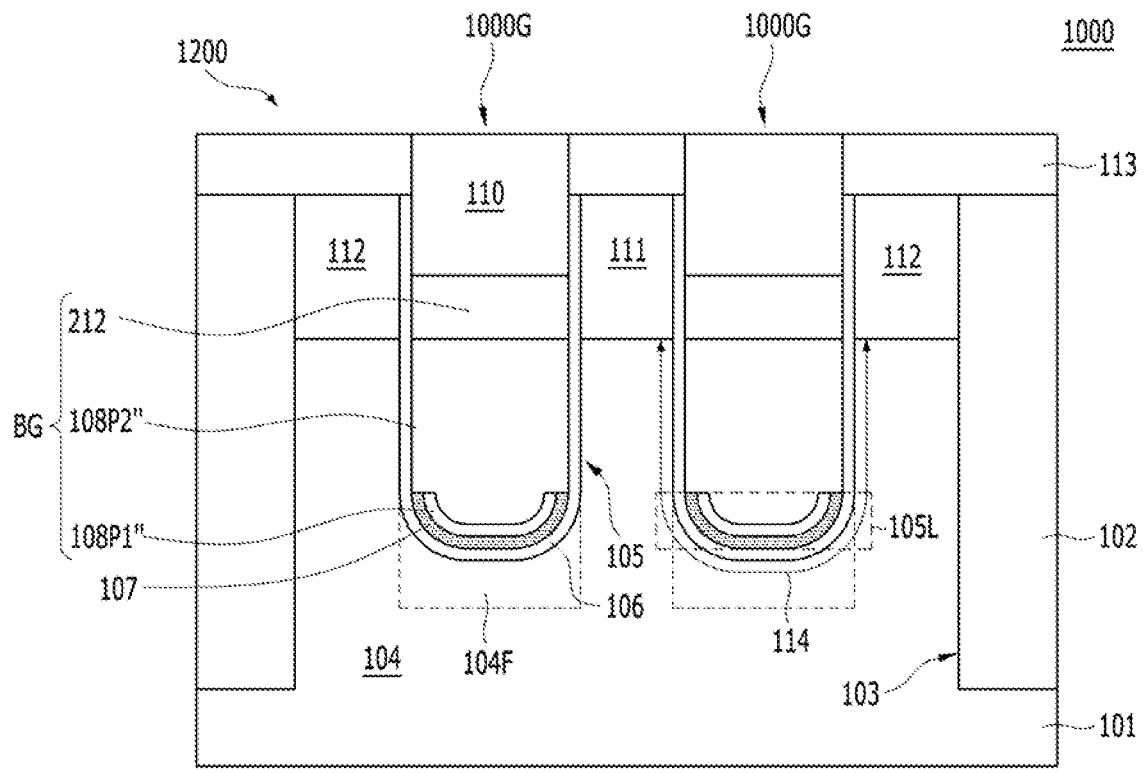
FIG. 11A is a side cross-sectional schematic view of a semiconductor device, according to a ninth embodiment of the present invention.
Figure 11B:
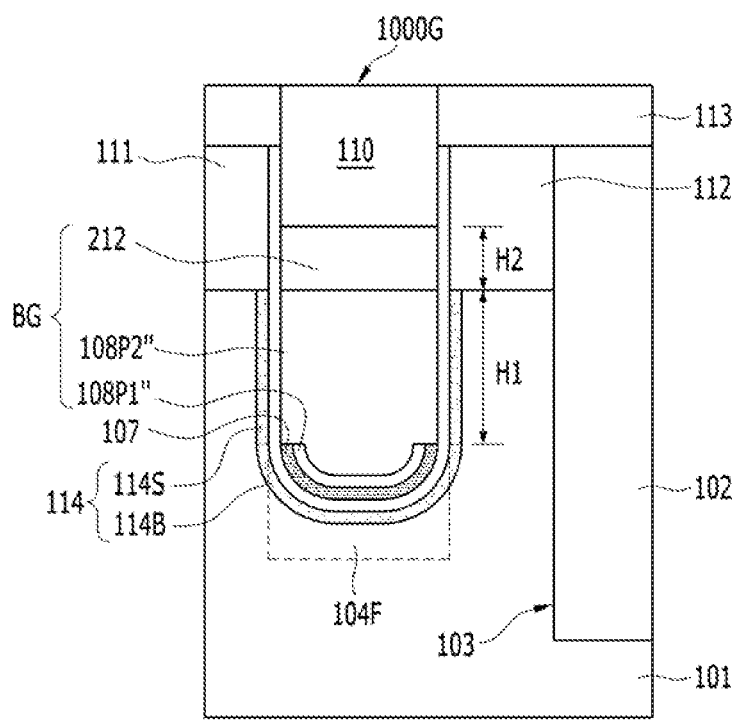
FIG. 11B is a detailed view of an example of a buried gate structure according to the ninth embodiment of the present invention.

FIG. 11A is a side cross-sectional schematic view of a semiconductor device, 1000 according to a ninth embodiment of the present invention. FIG. 11B is a detailed view of an example of a buried gate structure 1000G according to the ninth embodiment of the present invention. A transistor 1200 is shown as a part of a semiconductor device 1000.

Referring to FIGS. 11A and 11B, some components of the semiconductor device 1000 may be the same as those of the semiconductor device 900 according to the eighth embodiment of the present invention. The semiconductor device 1000 may further include a low work function layer 212.

The semiconductor device 1000 may include the buried gate structure 1000G, a channel region 114, a first doping region 111, and a second doping region 112. An isolation layer 102 and an active region 104 may be formed ire a substrate 101. The first and second doping regions 111 and 112 may be disposed in the active region 104. A gate trench 105 that extends across the active region 104 and the isolation layer 102 may be formed. The buried gate structure 1000G may be formed in the gate trench 105. The channel region 114 may include the gate trench 105.

The buried gate structure 1000G may be embedded in the gate trench 105. The buried gate structure 1000G may include a gate dielectric layer 106, a dipole inducing layer 107, a gate electrode BG, and a capping layer 110. The top surface of the gate electrode BG may be positioned at a level lower than the top surface of the active region 104.

The gate electrode BG may include a first work function layer 108P1", a second work function layer 108P2", and the low work function layer 212. The first work function layer 108P1" may have a high work function, and the second work function layer 108P2" may have a low work function. The first work function layer 108P1" may increase the threshold voltage of a bottom channel 114B, and the threshold voltage of a side channel 114S may be suppressed from being increased by the second work function layer 108P2". The first work function layer 108P1" may be a titanium nitride of which work function is increased, and the second work function layer 108P2" may be a titanium nitride of which work function is not modulated. The second work function layer 108P2" does not overlap with the first and second doping regions 111 and 112. The low work function layer 212 may partially fill the gate trench 105. The low work function layer 212 may be a non-metal material. The low work function layer 212 may be a material having a low work function. The low work function layer 212 may have a work function lower than the second work function layer 108P2". The low work function layer 212 may include polysilicon. In particular, the low work function layer 212 may include N-type doped polysilicon, which is doped with an N-type dopant, to have a low work function. N-type doped polysilicon has a work function lower than the mid-gap work function of silicon. N-type doped polysilicon has a work function lower than a titanium nitride. The low work function layer 212 may overlap with the first and second doping regions 111 and 112.

According to the ninth embodiment, the dipole inducing layer 107 may be a material that induces a high work function, and may be formed to be sufficiently separated by a first height H from the first and second doping regions 111 and 112.

A threshold voltage 1 shifted by the dipole inducing layer 107. For example, a threshold voltage may be increased by the dipole inducing layer 107. Since a threshold voltage may be modulated by the dipole inducing layer 107, the channel dose of the bottom channel 114B may be decreased. That is to say, the dose of LCI may be remarkably decreased or LCI may be omitted. As a result, in the present embodiment, because a channel dose is decreased by the dipole inducing layer 107, junction leakage may be improved.

Also, in the ninth embodiment, since the low work function layer 212 has a low work function, it is possible to suppress GIDL in the first and second doping regions 111 and 112.

Furthermore, since not only the dipole inducing layer 107 formed to not overlap with the side, channel 114S but also the low work function layer 212 has a low work function off-state leakage may be prevented.

The buried gate structure 1000G according to the ninth embodiment may be applied to a buried gate type fin channel transistor as shown in FIG. 3A. That is to say, a fin region 104F may be additionally included under the buried gate structure 1000G.

Figure 12:
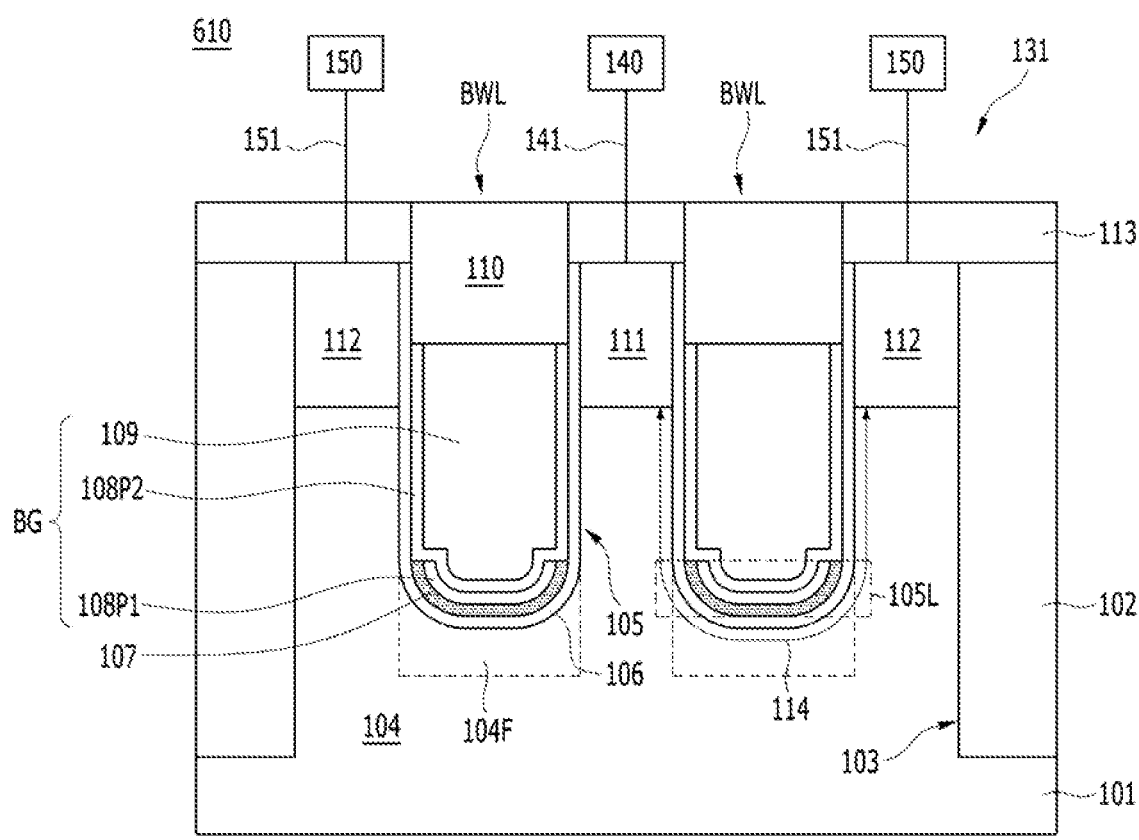
FIG. 12 is a view illustrating a representation of an application example of the semiconductor device, according to the sixth embodiment of the present invention.

FIG. 12 is a view illustrating a representation of an application example of the semiconductor device according to the sixth embodiment of the present invention.

Referring to FIG. 12, a memory cell 610 is shown. The memory cell 610 may include a cell transistor 131, a bit line 140, and a memory element 150. The cell transistor 131 may be the transistor 720 of FIG. 8A. Accordingly, the cell transistor 131 may include a buried word line structure BWL, a channel region 114, a first doping region 111, and a second doping region 112. The first doping region 111 may be electrically coupled to the bit line 140 through a first contact plug 141. The second doping region 112 may be electrically coupled to the memory element 150 through a second contact plug 151. The buried word line structure BWL may be the same as the buried gate structure 700G of FIG. 8A. The buried word line structure BWL may be embedded in a gate trench 105. The buried word line structure BWL may include a gate dielectric layer 106, a dipole inducing layer 107, a gate electrode BG, and a capping layer 110. The gate electrode BG may include a first work function layer 108P1, a second work function layer 108P2, and a low-resistivity layer 109. The first work function layer 108P1 has a high work function, and the second work function layer 108P2 has a low work function.

The cell transistor 131 may be replaced with a buried gate transistor. Further, the buried word line structure BWL of the cell transistor 131 may be replaced with one of the buried gate structures 800G, 900G and 1000G according to the seventh to ninth embodiments.

The memory element 150 may be a capacitor. The memory element 150 may include a storage node that contacts the second contact plug 151. The storage node may be a cylinder or pillar shape. A capacitor dielectric layer may be formed on the surface of the storage node. The capacitor dielectric layer may include at least any one selected among a zirconium oxide, an aluminum oxide and a hafnium oxide. For example, the capacitor dielectric layer may be a ZAZ structure in which a first zirconium oxide an aluminum oxide and a second zirconium oxide are stacked. A plate node is formed on the capacitor dielectric layer. The storage node and the plate node may include metal-containing materials.

In another embodiment, the memory element 150 may include a variable resistor. The variable resistor may include a phase change material. The phase change material may include at least one selected between Te and Se as chalcogenide elements. In another embodiment, the variable resistor may include a transition metal oxide. In still another embodiment, the variable resistor may be a magnetic tunnel junction (MTJ).

As described above, the memory, cell 610 may include the buried word line structure BWL that includes the dipole inducing layer 107, the first work function layer 108P1, the second work function layer 108P2 and the low-resistivity layer 109. In the case where the memory cell 610 is applied to a DRAM, the refresh characteristic of the DRAM may be improved. Also by preventing off-state leakage, a retention time may be improved.

The semiconductor devices according to the above-described embodiments may be applied to an electronic device. An electronic device may include a plurality of semiconductor devices. For example, an electronic device may include at least one among the semiconductor devices 100 to 1000 and memory cells 600 and 610 according to the above-described embodiments and application examples.

At least one semiconductor device among semiconductor devices included in an electronic device includes a buried gate structure that is formed in a gate trench. The buried gate structure may include a dipole inducing layer and a work function layer. The threshold voltage of a bottom channel may be increased by the dipole inducing layer. The threshold voltage of a side channel may be suppressed from being increased by a low work function of the work function layer. Also, GIDL may be improved by a low work function layers. Accordingly, the electronic device may achieve a high operation speed in correspondence to miniaturization.

FIGS. 13A to 13I are representations of examples of views to assist in the explanation of a method for manufacturing the semiconductor device according to the second embodiment of the present invention.

Figure 13A:
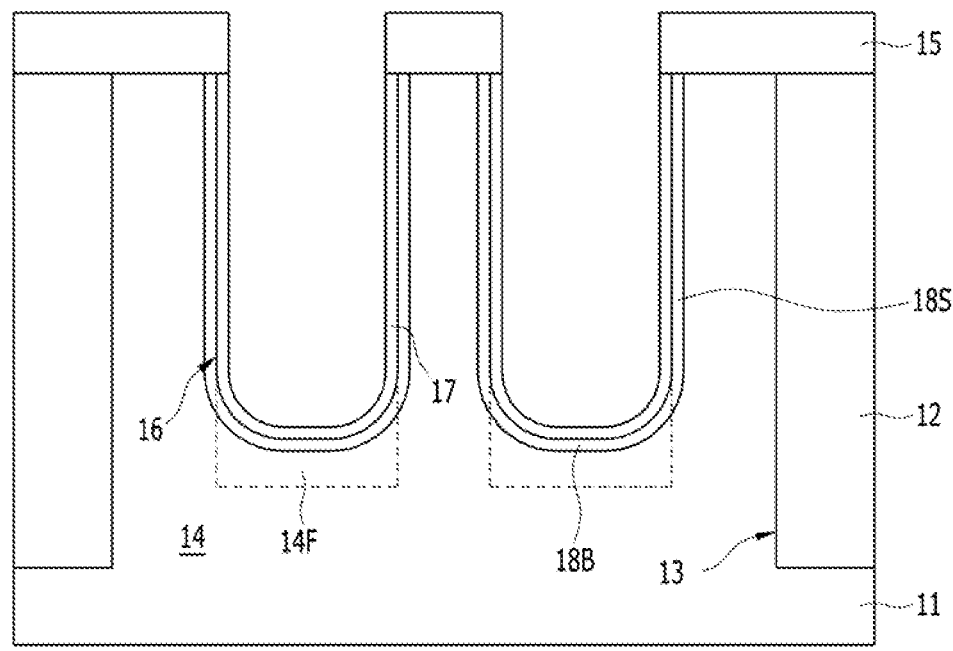
FIGS. 13A to 13I are representations of examples of views to assist in the explanation of a method for manufacturing the semiconductor device according to the second embodiment of the present invention.

As shown in FIG. 13A, an isolation layer 12 is formed in a substrate 11. An active region 14 is defined by the isolation layer 12. The isolation layer 12 may be formed by a shallow trench isolation (STI) process. The STI process is as follows. By etching the substrate 11, an isolation trench 13 is formed. The isolation trench 13 is filled with a dielectric material, and accordingly, the isolation layer 12 is formed. The isolation layer 12 may include a silicon oxide, a silicon nitride or a combination thereof. Chemical vapor deposition (CVD) or another deposition process may be used to fill the isolation trench 13 with a dielectric materials. A planarization process such as, for example, chemical mechanical polishing (CMP) may be additionally used.

A hard mask layer 15 may be formed on the substrate 11. The hard mask layer 15 may be formed of a material having an etching selectivity with respect to the substrate 11. The hard mask layer 15 may include a silicon oxide. The hard mask layer 15 may include TEOS.

A gate trench 16 is formed in the substrate 11. The gate trench 16 may have a line shape that extends across the active region 14 and the isolation layer 12. The gate trench 16 may be formed by forming a mask pattern (not shown) on the substrate 11 and performing an etching process using the mask pattern as an etch mask. The gate trench 16 may be formed shallower than the isolation trench 1. The gate trench 16 may have a sufficient depth to increase the average cross-sectional area of a subsequent gate electrode. Accordingly, the resistivity of the gate electrode may be reduced. The bottom of the gate trench 16 may have a curvature. In this way, by forming the bottom of the gate trench 16 to have a curvature, prominences and depressions may be minimized at the bottom of the gate trench 16, and accordingly, filling of the gate electrode may be easily performed. Also, by forming the bottom of the gate trench 16 to have a curvature, angled corners may be removed at the bottom of the gate trench 16, whereby electric field enhancement may be alleviated.

A fin region 14F is formed. The fin region 14F may be formed by recessing the isolation layer 12 (see FIG. 3A).

A gate dielectric layer 17 may be formed on the surface of the gate trench 16. Before forming the gate dielectric layer 17, etch damage to the surface of the gate trench 16 may be cured. For example, after forming sacrificial oxide by thermal oxidation processing, the sacrificial oxide may be removed.

The gate dielectric layer 17 may be formed by a thermal oxidation process. In another embodiment, the gate dielectric layer 17 may be formed by chemical vapor deposition (CVD) or atomic layer deposition (ALD). The gate dielectric layer 17 may include a high-k material, an oxide, a nitride, an oxynitride or a combination thereof. A high-k material may include a hafnium-containing material. A hafnium-containing material may include a hafnium oxide, a hafnium silicon oxide, a hafnium silicon oxynitride or a combination thereof. In another embodiment, a high-k material may include a lanthanum oxide, a lanthanum aluminum oxide, a zirconium oxide, a zirconium silicon oxide, a zirconium silicon oxynitride, an aluminum oxide or a combination thereof. As a high-k material, other high-k materials known in the art may be selectively used.

In another embodiment, the gate dielectric layer 17 may be formed by depositing a polysilicon liner layer and then performing radical oxidation for the polysilicon liner layer.

In still another embodiment, the gate dielectric layer 17 may be formed by forming a liner silicon nitride layer and then performing radical oxidation for the liner silicon nitride layer.

Channel doping may be performed to modulate a threshold voltage before forming the gate dielectric layer 17. Channel doping may be performed for the bottom and the sidewalls of the gate trench 16. In addition, local channel doping may be performed for the bottom of the gate trench 16. At this time, the dose of local channel doping is decreased. Local channel doping may be omitted.

A side channel 18S and a bottom channel 18B may be defined by channel doping.

Figure 13B:
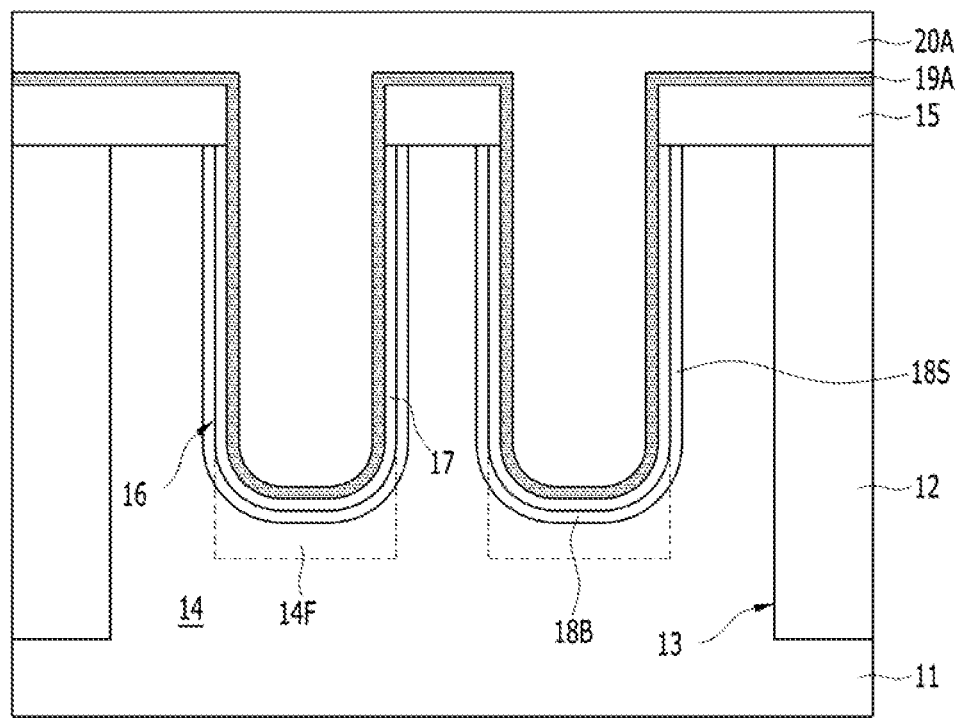

As shown in FIG. 13B, a dipole inducing material 19A may be formed on the gate dielectric layer 17. The dipole inducing material 19A may be formed conformally on the surface of the gate dielectric layer 17. The dipole inducing material 19A is a material for forming a dipole. The dipole inducing material 19A may be formed of a material having a dielectric constant higher than $SiO_2$. The dipole inducing material 19A may include an aluminum oxide ($Al_2O_3$) a titanium oxide ($TiO_2$), a hafnium oxide ($HfO_2$), a zirconium oxide ($ZrO_2$), a magnesium oxide (MgO) or a combination thereof. In the present embodiment, the dipole inducing material 19A may include $Al_2O_3$.

A sacrificial layer 20A may be formed on the dipole inducing material 19A. The sacrificial layer 20A may fill the gate trench 16. The sacrificial layer 20A may fill the gate trench 16 without a void. The sacrificial layer 20A may be formed of a material having an etching selectivity with respect to the dipole inducing material 19A. The sacrificial layer 20A may include polysilicon, a metal, silicon germanium or a combination thereof. The sacrificial layer 20A may be formed by chemical vapor deposition (CVD) or atomic layer deposition (ALD).

Figure 13C:
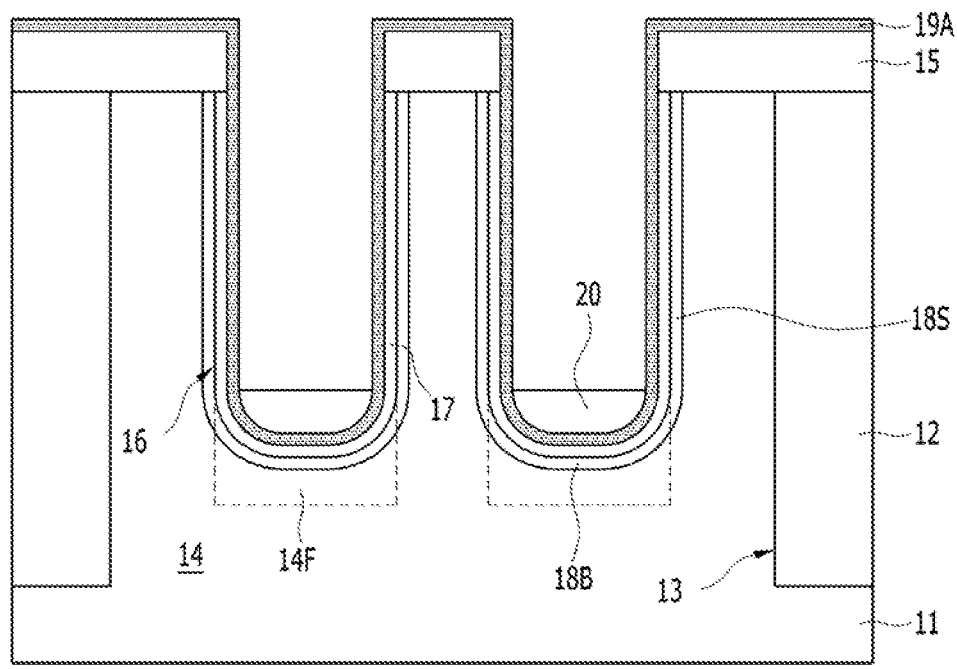

As shown in FIG. 13C, a recessing process for the sacrificial layer 20A is performed such that a sacrificial filler 20 remains in the gate trench 16. The recessing process for the sacrificial layer 20A may be performed by dry etching, for example, an etch-back process. The sacrificial filler 20 may be formed by an etch-back process for the sacrificial layer 20A.

In another embodiment, the recessing process for the sacrificial layer 20A may be performed in such a manner that, after a planarization process is first performed, an etch-back process is performed subsequently.

The sacrificial filler 20 is formed by the recessing process for the sacrificial layer 20A, as described above. The sacrificial filler 20 may be recessed to be lower than the top surface of the active region 14. For example, the sacrificial filler 20 may cover the lowermost portion of the gate trench 16. The sacrificial filler 20 may not overlap with the sidewalls of the gate trench 16.

After forming the sacrificial filler 20, a portion of the dipole inducing material 19A may be exposed.

Figure 13D:
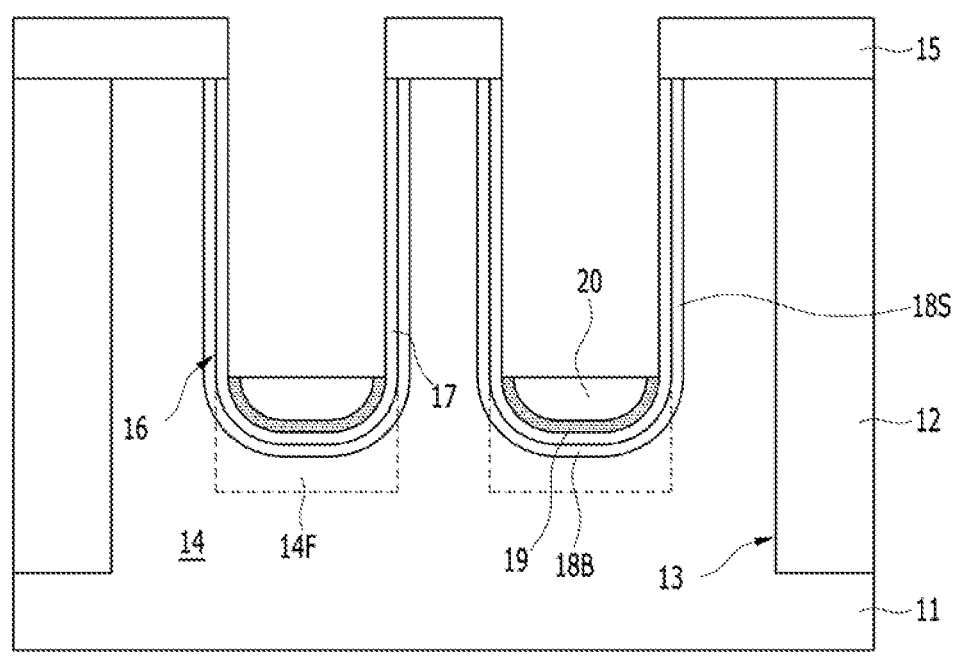

As shown in FIG. 13D, the dipole inducing material 19A may be selectively removed. For example, the exposed portion of the dipole inducing material 19A may be removed. Accordingly, a dipole inducing layer 19 may be formed. A recessing process is performed such that the dipole inducing layer 19 remains in the gate trench 16. The recessing process may be performed by dry etching or wet etching. The dipole inducing layer 19 may be formed by an etch-back process for the dipole inducing material 19A. The recessing process may be performed without an attack to the gate dielectric layer 17. The dipole inducing layer 19 may be positioned between the sacrificial filler 20 and the gate dielectric layer 17. The heights of the top surfaces of the dipole inducing layer 19 and the sacrificial filler 20 may be the same level. For example, the dipole inducing layer 19 may not be positioned on the sidewalls of the gate trench 16. The dipole inducing layer 19 may cover the top of the fin region 14F. That is to say, the dipole inducing layer 19 may cover the lowermost portion (i.e., the bottom) of the gate trench 16. Accordingly, a non-overlapping portion may be defined between the dipole inducing layer 19 and the sidewalls of the gate trench 16. Both ends of the dipole inducing layer 19 may partially cover the bottom corners of the gate trench 16. In other words, the dipole inducing layer 19 and the lower sidewalls of the gate trench 16 may partially overlap with each other. In the present embodiment, an overlap height between the dipole inducing layer 19 and the lower sidewalls of the gate trench 16 is minimized.

The recessing process for the dipole inducing material 19A has an etching selectivity with respect to the gate dielectric layer 17. Accordingly, loss of the gate dielectric layer 17 is prevented.

Figure 13E:
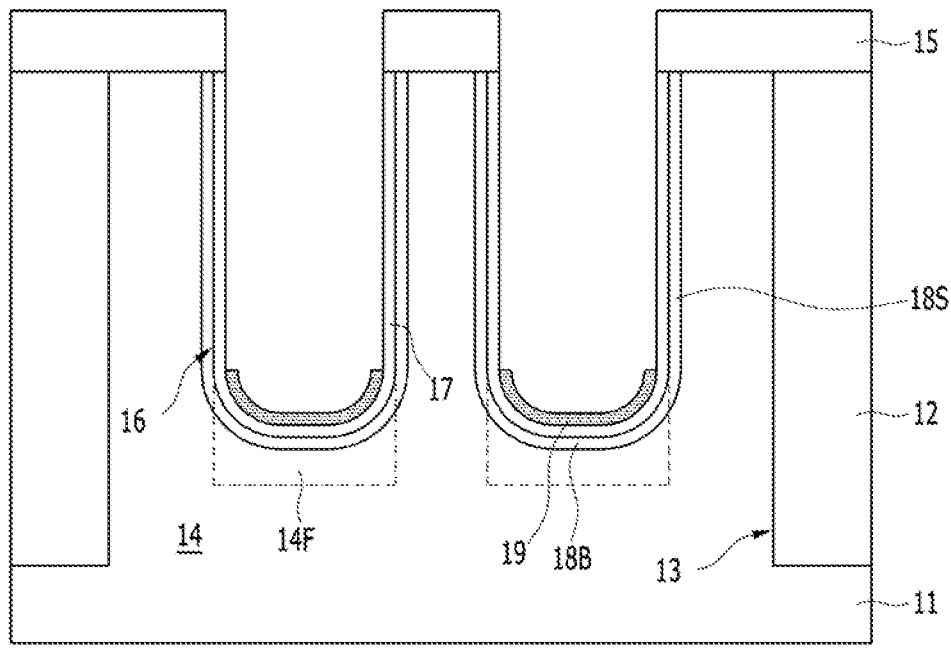

As shown in FIG. 13E, the sacrificial filler 20 may be removed. When removing the sacrificial filler 20, the dipole inducing layer 19 and the gate dielectric layer 17 are not attacked. The sacrificial filler 20 may be removed by dry etching or wet etching.

By removing the sacrificial filler 20, the dipole inducing layer 19 and the gate dielectric layer 17 may remain in the gate trench 16. The dipole inducing layer 19 may have a shape that covers the bottom of the gate trench 16. The dipole inducing layer 19 may overlap with the bottom channel 18B. The dipole inducing layer 19 may not overlap with the side channel 18S.

Figure 13F:
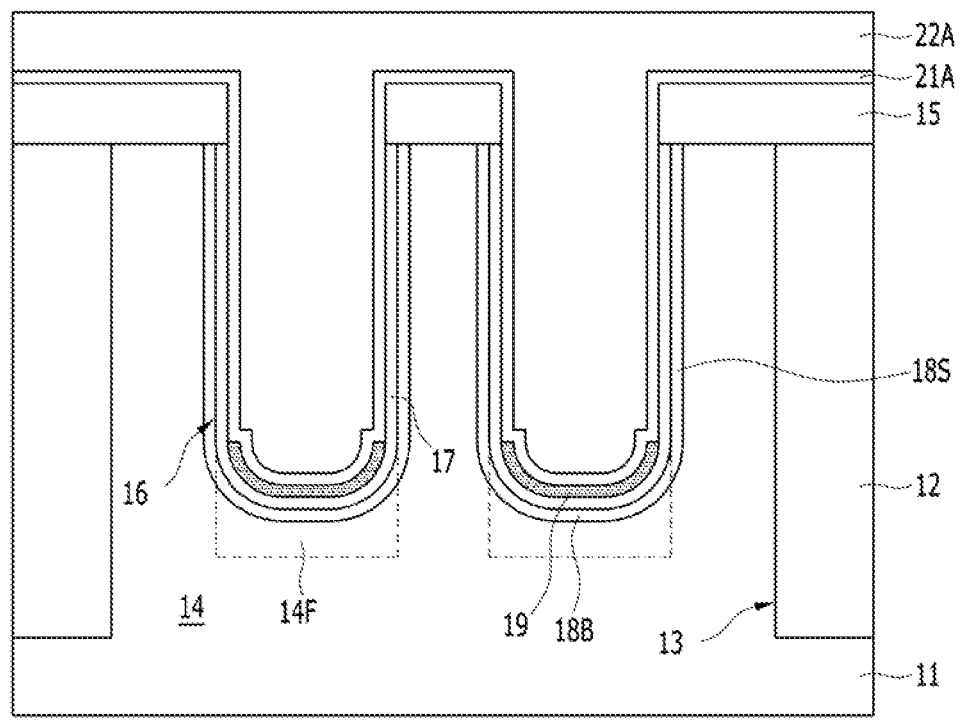

As shown in FIG. 13F, a work function material 21A and a low-resistivity material 22A may be formed. The work function material 21A may be formed conformally. The low-resistivity material 22A may fill the gate trench 16 on the work function material 21A. The low-resistivity material 22A may be formed of a low resistivity material. The low-resistivity material 22A may include a tungsten layer. The work function material 21A may include a titanium nitride.

Figure 13G:
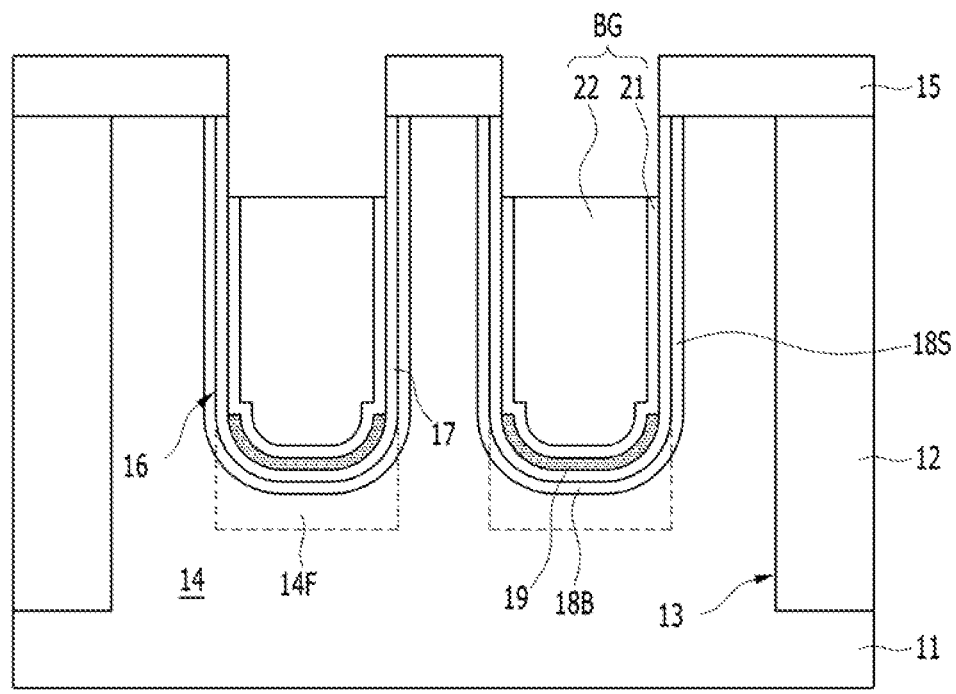

As shown in FIG. 13G, a gate electrode BG may be formed. For forming the gate electrode BG, the work function material 21A and the low-resistivity material 22A may be etched by an etch-back process. The gate electrode BG may be at a lower level than the top surface of the active region 14. Accordingly, a buried gate electrode may be formed as the gate electrode BG is positioned in the gate trench 16. Before performing the etch-back process, a planarization process using CMP may be performed in advance.

The gate electrode BG may include a work function layer 21 and a low-resistivity layer 22. The work function layer 21 may be formed by etching of the work function material 21A. The low-resistivity layer 22 may be formed by etching of the low-resistivity material 22A. The work function layer 21 may cover the dipole inducing layer 19. The low-resistivity layer 22 may fill the gate trench 16.

Figure 13H:
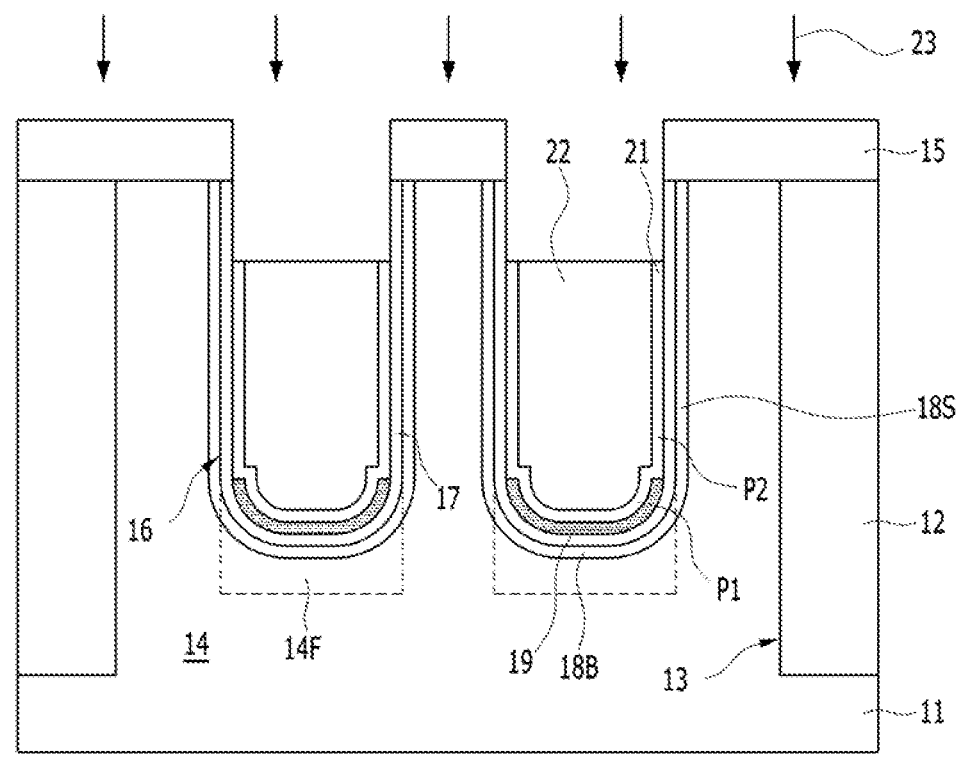

As shown in FIG. 13H, the resultant structure may be exposed to a thermal process 23. Accordingly, the resistivity of the resistivity layer 22 may be further reduced. The thermal process 23 may be performed under an atmosphere of nitrogen or an atmosphere of a mixture gas of nitrogen and hydrogen. The thermal process 23 may include rapid thermal annealing.

Even though such a thermal process 23 is performed, the work function of the work function layer 21 is not changed. Namely, the work function of the work function layer 21 is not increased.

In another embodiment, the thermal process 23 may be performed after forming the low-resistivity material 22A. Also, the thermal process 23 may be performed after the CMP process for the low-resistivity material 22A.

After the thermal process 23 is performed, the work function layer 21 includes a first portion P1 and a second portion P2. The first portion P1 may be a portion that contacts the dipole inducing layer 19. The second portion P2 may be a portion that non-contacts the dipole inducing layer 19. The first portion P1 of the work function layer 21 may have a work function higher than the second portion P2. That is to say, the first portion P1 of the work function layer 21 has a work function that is increased by the dipole inducing layer 19. The second portion P2 of the work function layer 21 has a work function of the work function layer 21 itself.

Figure 13I:
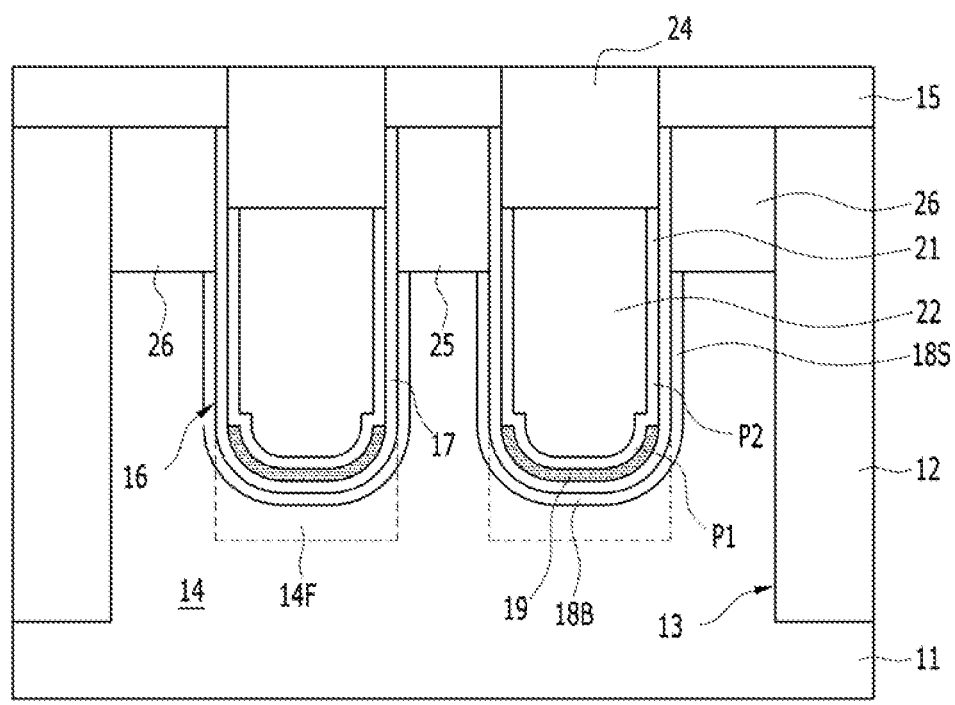

As shown in FIG. 13I, a capping layer 24 is formed on tap of the gate electrode BG. The capping layer 24 includes a dielectric material. On top of the gate electrode BG the gate trench 16 is filled with the capping layer 24. The capping layer 24 may include a silicon nitride. Subsequently, planarization of the capping layer 24 may be performed such that the top surface of the substrate 11 is exposed. In another embodiment, the capping layer 24 may include a silicon oxide. In still another embodiment, the capping layer 24 may be a nitride-oxide-nitride (NON) structure.

By forming the capping layer 24, a buried gate structure is formed. The buried gate structure includes the gate dielectric layer 17, the dipole inducing layer 19, the gate electrode BG, and the capping layer 24. The gate electrode BG may include the work function layer 21 and the low-resistivity layer 22.

Next, a first doping region 25 and a second doping region 26 are formed. The first and second doping regions 25 and 26 may be formed by a doping process such as, for example, implantation. The first and second doping regions 25 and 26 may have a depth that overlaps with the second portion P2 of the work function layer 21. The first and second doping regions 25 and 26 may have a depth that is sufficiently separated from the dipole inducing layer 19.

FIGS. 14A to 14D are representations of examples of views to assist in the explanation of a method for manufacturing the semiconductor device according to the third embodiment of the present invention. The manufacturing method according to the third embodiment may be similar to the manufacturing method according to FIGS. 13A to 13I.

By the method shown in FIGS. 13A to 13F, a work function material 21A and a low-resistivity material 22A may be formed. The work function material 21A may be formed conformally. The low-resistivity material 22A may fill the gate trench 16 on the work function material 21A. The low-resistivity material 22A may be formed of a low resistivity material. The low-resistivity material 22A may include a tungsten layer. The work function material 22A may include a titanium nitride.

Figure 14A:
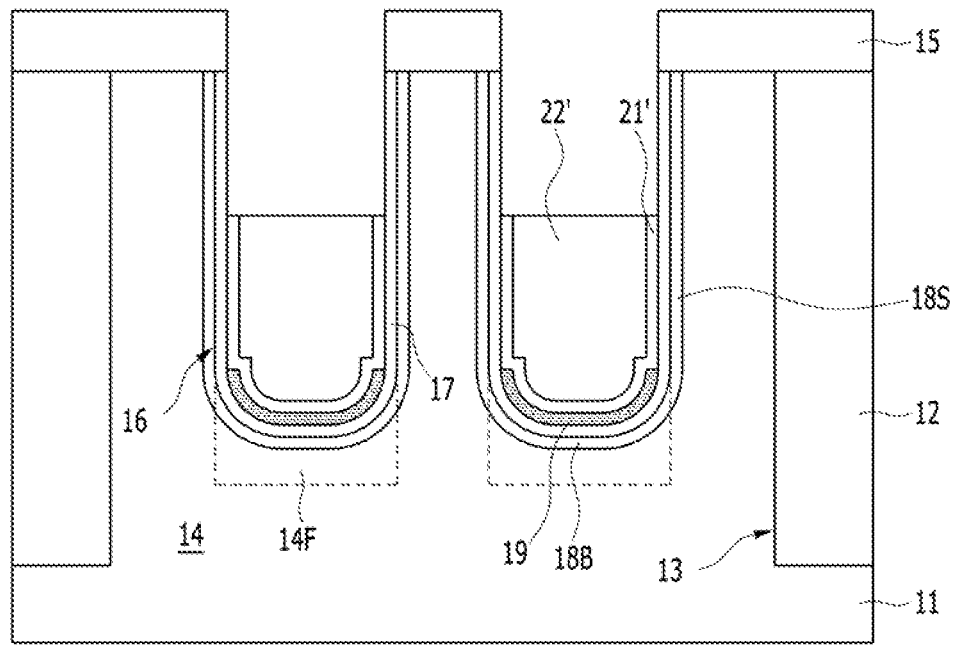
FIGS. 14A to 14D are representations of examples of views to assist in the explanation of a method for manufacturing the semiconductor device according to the third embodiment of the present invention.

Next, as shown in FIG. 14A, for forming a work function layer 21' and a low-resistivity layer 22', the work function material 21A and the low-resistivity material 22A may be etched by an etch-back process. Before performing the etch-back process, a planarization process using CMP may be performed in advance. The work function layer 21' and the low-resistivity layer 22' may be at a lower level than the top surface of the active region 14. The work function layer 21' may be at a lower level than the work function layer 21 of FIG. 13. In the same manner as the work function layer 21', the low-resistivity layer 22' may also be a level lower than the low-resistivity layer 22 of FIG. 13G. As will be described later, the work function layer 21' and the low-resistivity layer 22' may not overlap with first and second doping regions.

The work function layer 21' may be formed by etching of the work function material 21A. The low-resistivity layer 22' may be formed by etching of the low-resistivity material 22A. The work function layer 21' may cover the dipole inducing layer 19. The low-resistivity layer 22 may fill the gate trench 16.

Figure 14B:
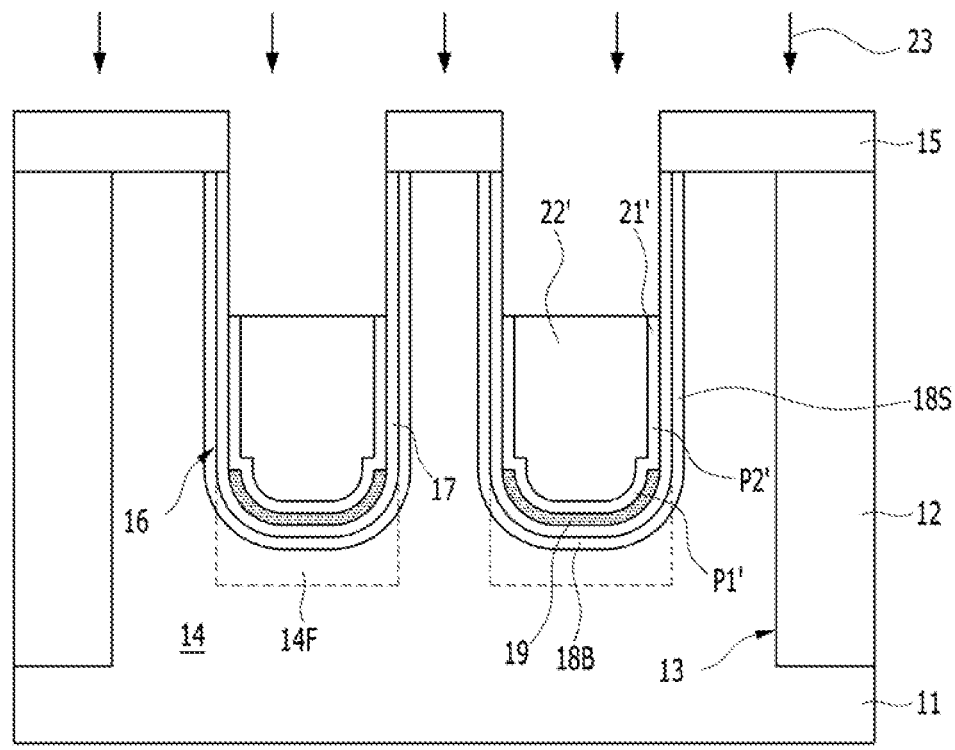

As shown in FIG. 14B, the resultant structure may be exposed to a thermal process 23. Accordingly, the resistivity of the low-resistivity layer 22' may be further reduced. The thermal process 23 may be performed under an atmosphere of nitrogen or an atmosphere of a mixture gas of nitrogen and hydrogen. The thermal process 23 may include rapid thermal annealing.

Even though such a thermal process 23 is performed, the work function of the work function layer 21' is not changed. Namely, the work function of the work function layer 21' is not increased.

In another embodiment, the thermal process 23 may be performed after forming the low-resistivity material 22A. Also, the thermal process 23 may be performed after the CMP process for the low-resistivity material 22A.

After the thermal process 23 is performed, the work function layer 21' includes a first portion P1' and a second portion P2'. The first portion P1' may be a portion that contacts the dipole inducing layer 19. The second portion P2' may be a portion that non-contacts the dipole inducing layer 19. The first portion P1' of the work function layer 21' may have a work function higher than the second portion P2'. That is to say, the first portion P1' of the work function layer 21' has a work function that is increased by the dipole inducing layer 19. The second portion P2' of the work function layer 21' has a work function of the work function layer 21' itself.

Figure 14C:
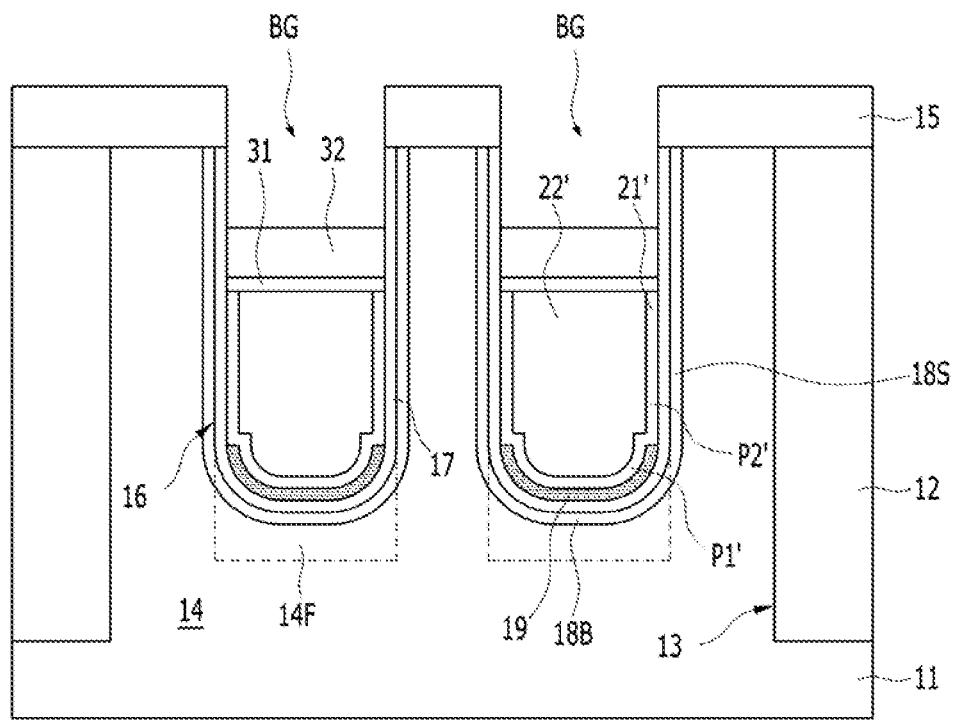

As shown in FIG. 14C, a barrier layer may be formed on the work function layer 21' and the low-resistivity layer 22'.

The barrier layer 31, may include a titanium nitride. For forming the barrier layer 31, a recessing process may be perform ed after forming a barrier material (not shown). The barrier material may be formed by physical vapor deposition (PVD).

A low work function material (not numbered) may be formed on the barrier layer 31. The low work function material may include N-type doped polysilicon.

For forming a low work function layer 32, the low work function material may be recessed. The low work function layer 32 may be positioned on the barrier layer 31. The top surface of the low work function layer 32 may be at a lower level than the top surface of the substrate 11.

In this way by forming the low work function layer a gate electrode BG may be formed. The gate electrode BG may include the work function layer 21', the low-resistivity layer 22', the barrier layer 31, and the low work function layer 32.

Figure 14D:
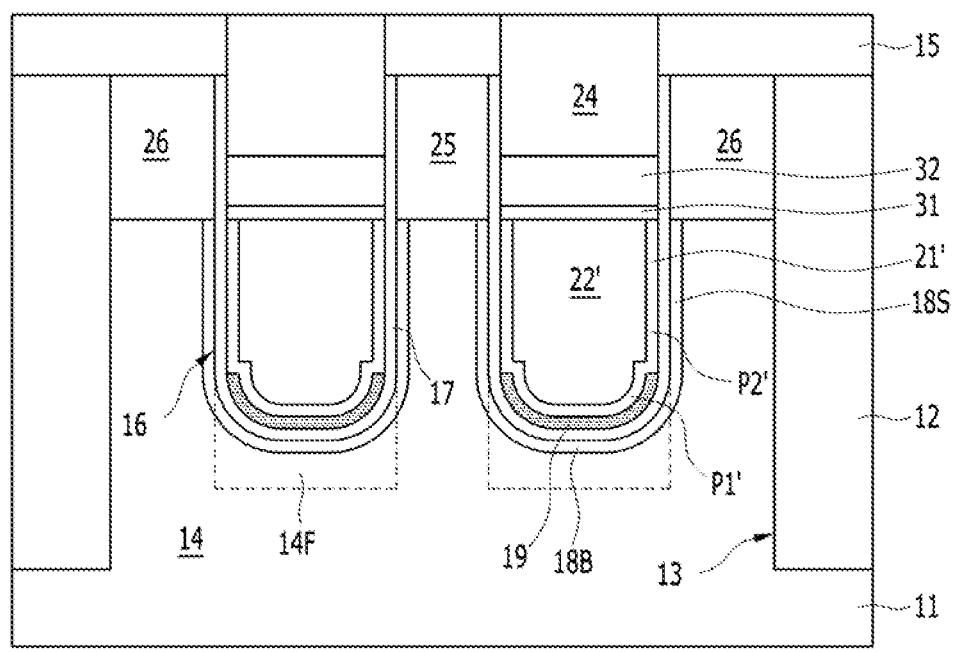

As shown in FIG. 14D, a capping layer 24 is formed on top of the gate electrode BG. The capping layer 24 includes a dielectric material. On top of the gate electrode BG, the gate trench 16 is filled with the capping layer 24. The capping layer 24 may include a silicon nitride. Subsequently, planarization of the capping layer 24 may be performed such that the top surface of the substrate 11 is exposed. In another embodiment the capping layer 24 may include a silicon oxide. In, still another embodiment, the capping layer 24 may be a nitride-oxide-nitride (NON) structure.

By forming the capping layer 24, a buried gate structure is formed. The buried gate structure includes the gate dielectric layer 17, the dipole inducing layer 19, the gate electrode BG and the capping layer 24. The gate electrode BG may include the work function layer 21', the low-resistivity layer 22', the barrier layer 31 and the low work function layer 32.

Next, a first doping region 25 and a second doping region 26 are formed. The first and second doping regions 25 and 26 may be formed by a doping process such as, for example, implantation. The first and second doping regions 25 and 26 may have a depth that overlaps with the low work function layer 32. The first and second doping regions 25 and 26 may have a depth that is sufficiently separated from the dipole inducing layer 19. The work function layer 21' may not overlap with the first and second doping regions 25 and 26.

Figure 15A:
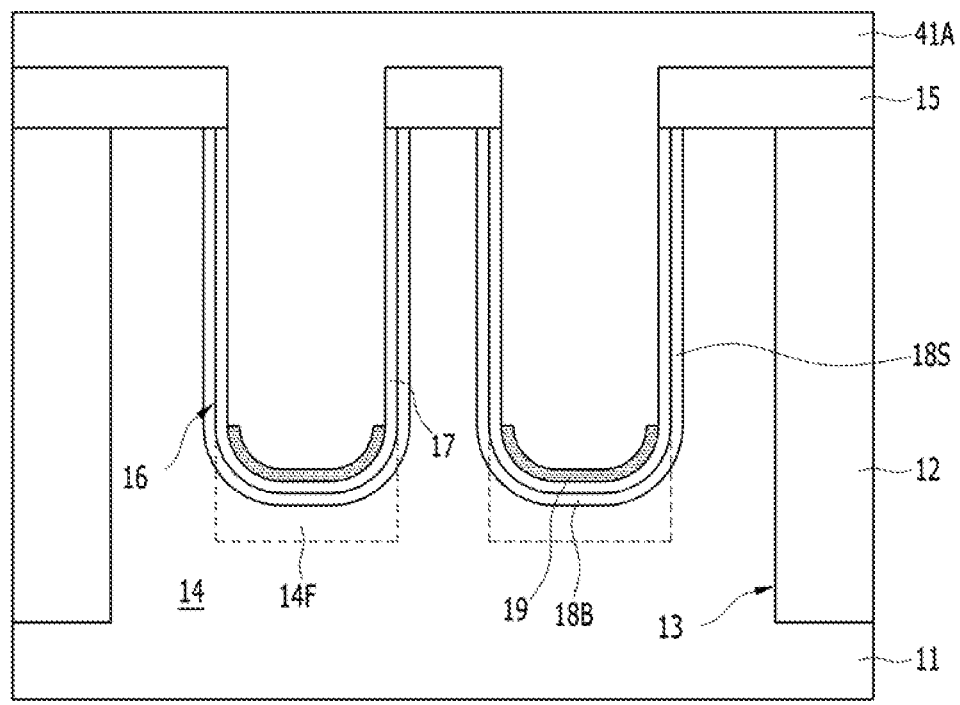
FIGS. 15A and 15B are representations of examples of views to assist in the explanation of a method for manufacturing the semiconductor device according to the fourth embodiment of the present invention.
Figure 15B:
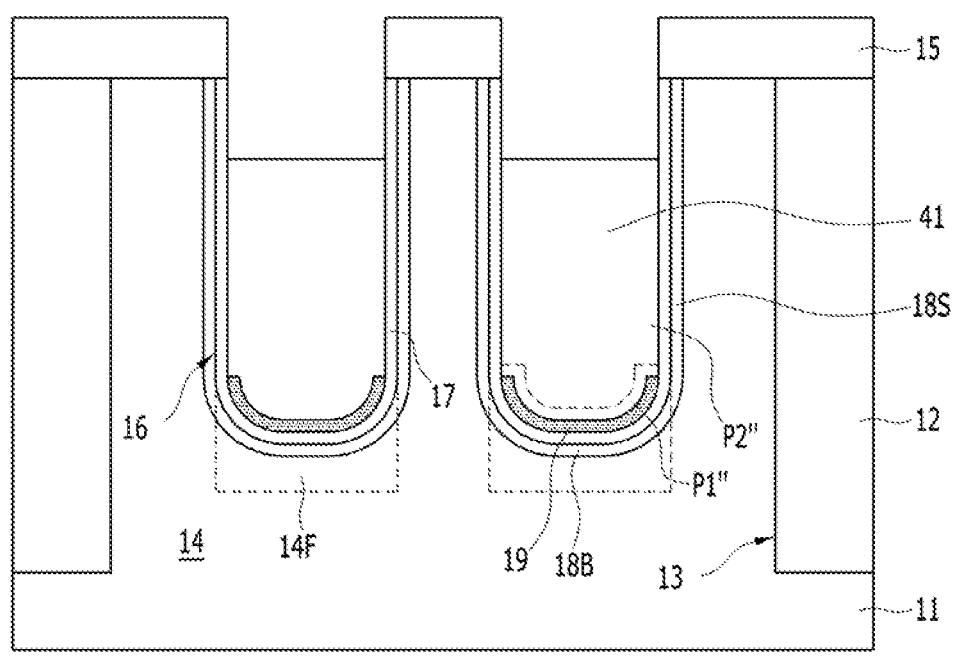

FIGS. 15A and 15B are representations of examples of views to assist in the explanation of a method for manufacturing the semiconductor device according to the fourth embodiment of the present invention. The manufacturing method according to the fourth embodiment may be similar to the manufacturing method according to FIGS. 13A to 13I.

By the method shown in FIGS. 13A to 13E, a dipole inducing layer 19 may be formed.

Next, as shown in FIG. 15A, a work function material 41A may be formed. The work function material 41A may fill the gate trench 16 on the dipole inducing layer 19. The work function material 41A may include a titanium nitride.

As shown in FIG. 15B, a work function layer 41 may be formed. For forming the work function layer 41, the work function material 41A may be etched by an etch-back process. Before performing the etch-back process, a planarization process using CMP may be performed in advance. The work function layer 41 may be at a lower level than the top surface of the active region 14. The work function layer 41 may be the same level as the work function layer 21 of FIG. 13G. As will be described later, the work function layer 41 may overlap with first and second doping regions.

The work function layer 41 may be formed by etching of the work function material 41A. The work function layer 41 may cover the dipole inducing layer 19. Unlike the work function layer 21 of FIG. 13G, the gate trench 16 may be filled with only the work function layer 41. Accordingly, the resistivity of a gate electrode may be further reduced. Moreover, since a low-resistivity layer is omitted, a thermal process is of needed.

The work function layer 41 includes a first portion P1" and a second portion P2". The first portion P1" may be a portion that contacts the dipole inducing layer 19. The second portion P2" may be a portion that non-contacts the dipole inducing layer 19. The first portion P1" of the work function layer 41 may have a work function higher than the second portion P2". That is to say, the first portion P1" of the work function layer 41 has a work function that is increased by the dipole inducing layer 19. The second portion P2" of the work function layer 41 has a work function of the work function layer 41 itself.

Subsequently, as shown in FIG. 13I, a capping layer 24 is formed on the work function layer 41. The capping layer 24 includes a dielectric material. On the work function layer 41, the gate trench 16 is filled with the capping layer 24. The capping layer 24 may include a silicon nitride. Subsequently, planarization of the capping layer 24 may be performed such that the top surface of the substrate 11 is exposed. In another embodiment, the capping layer 24 may include a silicon oxide. In still another embodiment, the capping layer 24 may be a nitride-oxide-nitride (NON) structure.

By forming the capping layer 24, a buried gate structure formed. The buried gate structure includes the gate dielectric layer 17, the dipole inducing layer 19, the work function layer 41, and the capping layer 24. A gate electrode may be constructed by only the work function layer 41.

Next, a first doping region 25 and a second doping region 26 are formed. The first and second doping regions 25 and 26 may be formed by a doping process such as, for example, implantation. The first and second doping regions 25 and 26 may have a depth that overlaps with the second portion P2" of the work function layer 41. The first and second doping regions 25 and 26 may have a depth that is sufficiently separated from the dipole inducing layer 19.

Figure 16A:
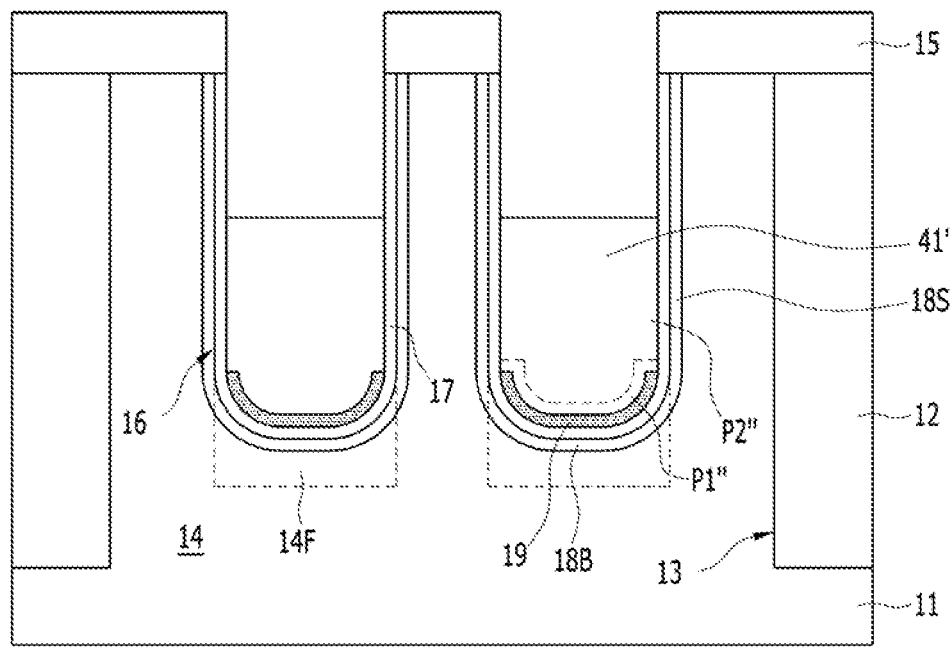
FIGS. 16A and 16B are representations of examples of views to assist in the explanation of a method for manufacturing the semiconductor device according to the fifth embodiment of the present invention.
Figure 16B:
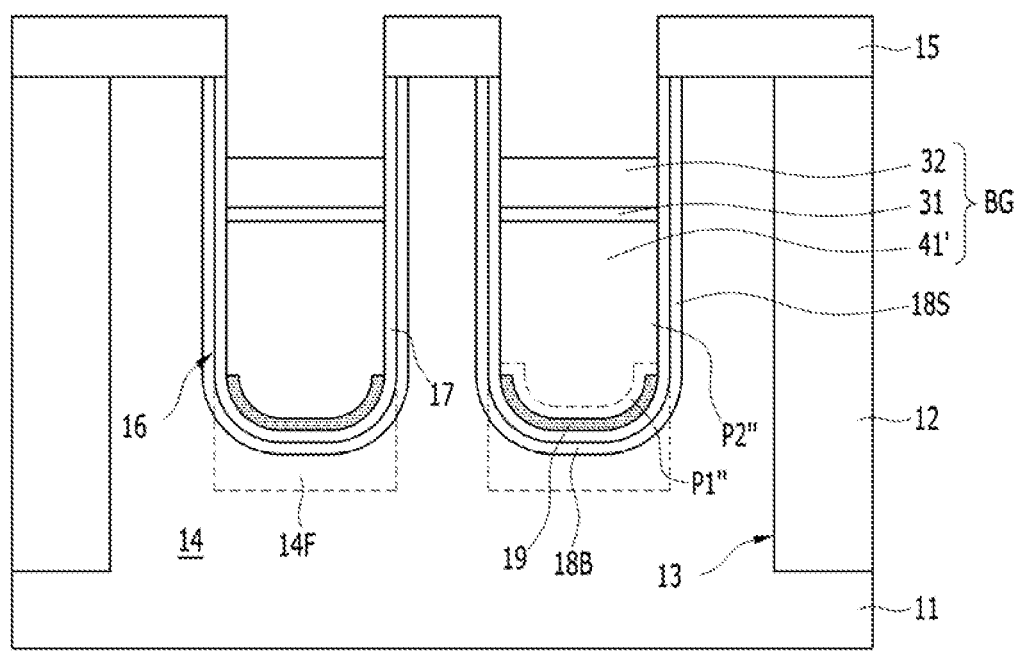

FIGS. 16A and 16B are representations of examples of views to assist in the explanation of a method for manufacturing the semiconductor device according to the fifth embodiment of the present invention. The manufacturing method according to the fifth embodiment may be similar to the manufacturing methods according to FIGS. 13A to 13I and FIGS. 15A and 15B.

By the method shown in FIGS. 13A to 13E, a dipole inducing layer 19 may be formed.

Next, as shown in FIG. 16A, a work function layer 41' may be formed. By the method shown in FIGS. 15A and 15B, the work function layer 41' may be formed. The work function layer 41' may be at a lower level than the work function layer 41 of FIG. 15B.

The work function layer 41' includes a first portion P1" and a second portion P2". The first portion P1" may be a portion that contacts the dipole inducing layer 19. The second portion P2" may be a portion that non-contacts the dipole inducing layer 19. The first portion P1" of the work function layer 41' may have a work function higher than the second portion P2". That is to say, the first portion P1" of the work function layer 41' has a work function that is increased by the dipole inducing layer 19. The second portion P2" of the work function layer 41' has a work function of the work function layer 41' itself.

As shown in FIG. 16B, a barrier layer 31 may be formed on the work function layer 41'. The barrier layer 31 may include a titanium nitride. For forming the barrier layer 31, a recessing process may be performed after forming a barrier material (not shown). The barrier material may be formed by physical vapor deposition (PVD).

A low work function material (not numbered) may be formed on the barrier layer 31. The low work function material may include N-type doped polysilicon.

For forming a low work function layer 32, the low work function material may be recessed. The low work function layer 32 may be positioned on the barrier layer 31. The top surface of the low work function layer 32 may be at a lower level than the top surface of the substrate 11.

In this way, by forming the low work function layer 32, a gate electrode BG may be formed. The gate electrode BG may include the work function layer 41', the barrier layer 31, and the low work function layer 32.

Subsequently, as shown in FIG. 13I, capping layer 24 is formed on top of the gate electrode 8G. The capping layer 24 includes a dielectric material. On top of the gate electrode BG, the gate trench 16 is filled with the capping layer 24. The capping layer 24 may include a silicon nitride. Subsequently, planarization of the capping layer 24 may be performed such that the top surface of the substrate 11 is exposed. In another embodiment, the capping layer 24 may include a silicon oxide. In still another embodiment, the capping layer 24 may be a nitride-oxide-nitride (NON) structure.

By forming the capping layer 24, a buried gate structure formed. The buried gate structure includes the gate dielectric layer 17, the dipole inducing layer 19, the gate electrode BG, and the capping layer 24. The gate electrode BG may include the work function layer 41', the barrier layer 31, and the low work function layer 32.

Next, a first doping region 25 and a second doping region 26 are formed. The first and second doping regions 25 and 26 may be formed by a doping process such as, for example, implantation. The first and second doping regions 25 and 26 may have a depth that overlaps with the low work function layer 32. The first and second doping regions 25 and 26 may have a depth that is sufficiently separated from the dipole inducing layer 19. The work function layer 41' may not overlap with the first and second doping regions 25 and 26.

FIGS. 17A to 17F are representations of examples of views to assist in the explanation of a method for manufacturing the semiconductor device according to the sixth embodiment of the present invention.

Figure 17A:
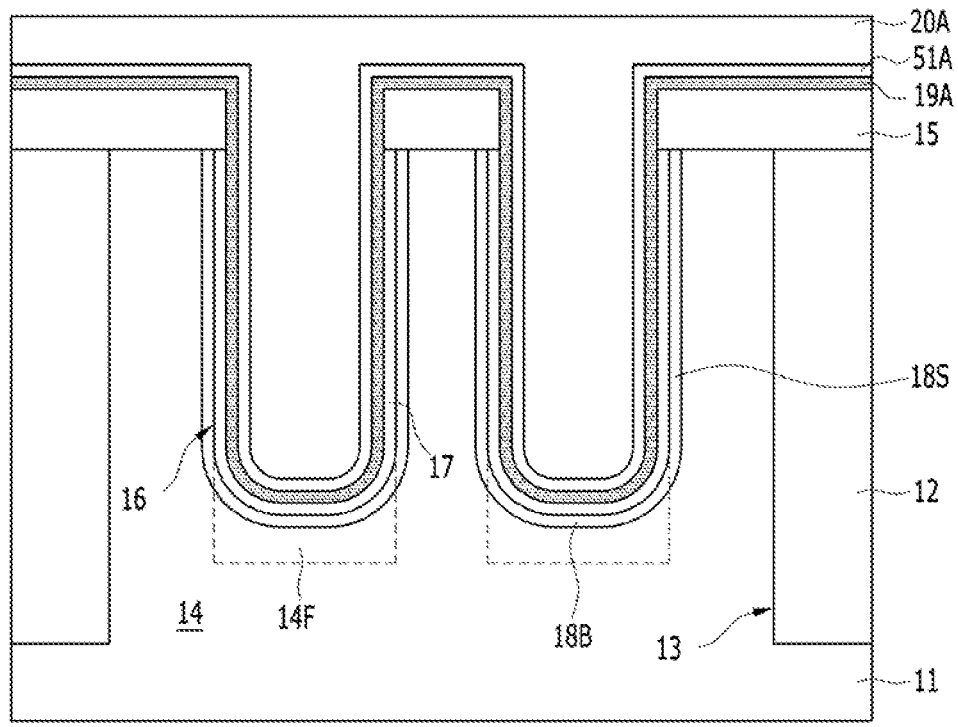
FIGS. 17A to 17F are representations of examples of views to assist in the explanation of a method for manufacturing the semiconductor device according to the sixth embodiment of the present invention.

As shown in FIG. 17A, an isolation layer 12 is formed in a substrate 11. An active region 14 is defined by the isolation layer 12. The isolation layer 12 may be formed by a shallow trench isolation (STI) process. The STI process is as follows. By etching the substrate 11, an isolation trench 13 is formed. The isolation trench 13 is filled with a dielectric material, and accordingly, the isolation layer 12 is formed. The isolation layer 12 may include a silicon oxide, a silicon nitride or a combination thereof. Chemical vapor deposition (CVD) or another deposition process may be used to fill the isolation trench 13 with a dielectric material. A planarization process such as CMP may be additionally used.

A hard mask layer 15 may be formed on the substrate 11. The hard mask layer 15 may be formed of a material having an etching selectivity with respect to the substrate 11. The hard mask, layer 15 may include a silicon oxide. The hard mask layer 15 may include TEOS.

A gate trench 16 is formed in the substrate 11. The gate trench 16 may have a line shape that extends across the active region 14 and the isolation layer 2. The gate trench 16 may be formed by forming a mask pattern (not shown) on the substrate 11 and performing an etching process using the mask pattern as an etch mask. The gate trench 16 may be formed shallower than the isolation trench 13. The gate trench 16 may have a sufficient depth to increase the average area of a subsequent gate electrode. Accordingly, the resistivity of the gate electrode may be reduced. The bottom of the gate trench 16 may have a curvature. In this way, by forming the bottom of the gate trench 16 to have a curvature, prominences and depressions may be minimized at the bottom of the gate trench 16, and accordingly, filling of the gate electrode may be easily performed. Also, by forming the bottom of the gate trench 16 to have a curvature, angled corners may be removed at the bottom of the gate trench 16, whereby electric field enhancement may be alleviated.

A fin region 14F is formed. The fin region 14F may be formed by recessing the isolation layer 12 (see FIG. 3B).

A gate dielectric layer 17 may be formed on the surface of the gate trench 16. Before forming the gate dielectric layer 17, etch damage to the surface of the gate trench 16 may be cured. For example, after forming a sacrificial oxide by thermal oxidation processing, the sacrificial oxide may be removed.

The gate dielectric layer 17 may be formed by a thermal oxidation process. In another embodiment, the gate dielectric layer 17 may be formed by chemical vapor deposition (CVD) or atomic layer deposition (ALD). The gate dielectric layer 17 may include a high-k material, an oxide, a nitride, an oxynitride or a combination thereof. A high-k material may include a hafnium-containing material. A hafnium-containing material may include a hafnium oxide, a hafnium silicon oxide, a hafnium silicon oxynitride or a combination thereof. In another embodiment, a high-k material may include a lanthanum oxide, a lanthanum aluminum oxide, a zirconium oxide, a zirconium silicon oxide, a zirconium silicon oxynitride, an aluminum oxide or a combination thereof. As a high-k material, other high-k materials known in the art may be selectively used.

In another embodiment, the gate dielectric layer 17 may be formed by depositing a polysilicon liner layer and then performing radical oxidation for the polysilicon liner layer.

In still another embodiment, the gate dielectric layer 17 may be formed by forming a liner silicon nitride layer and then performing radical oxidation for the liner silicon nitride layer.

Channel doping may be performed to modulate a threshold voltage before forming the gate dielectric layer 17. Channel doping may be performed for the bottom and the sidewalls of the gate trench 16. In addition, local channel doping may be, performed for the bottom of the gate trench 16. At this time, the dose of local channel doping is decreased. Local channel doping may be omitted.

A side channel 18S and a bottom channel 18B may be defined by channel doping.

A dipole inducing material 19A may be formed on the gate dielectric layer 17. The dipole inducing material 19A may be formed conformally on the surface of the gate dielectric layer 17. The dipole inducing material 19A is a material for forming a dipole. The dipole inducing material 19A may be formed of a material having a dielectric constant higher than $SiO_2$. The dipole inducing material 19A may include an aluminum oxide ($Al_2O_3$), a titanium oxide ($TiO_2$), a hafnium oxide ($HfO_2$), a zirconium oxide ($ZrO_2$), a magnesium oxide (MgO) or a combination thereof. In the present embodiment, the dipole inducing material 19A may include $Al_2O_3$.

A first work function material 51A may be formed on the dipole inducing material 19A. The first work function material 51A may include a titanium nitride.

A sacrificial layer 20A may be formed on the first work function material 51A. The sacrificial layer 20A may fill the gate trench 16. The sacrificial layer 21A may fill the gate trench 16 without a void. The sacrificial layer 20A may be formed of a material having an etching selectivity with respect to the dipole inducing material 19A. The to sacrificial layer 20A may include polysilicon, a metal, silicon germanium or a combination thereof. The sacrificial layer 20A may be formed by chemical vapor deposition (CVD) or atomic layer deposition (ALD).

Figure 17B:
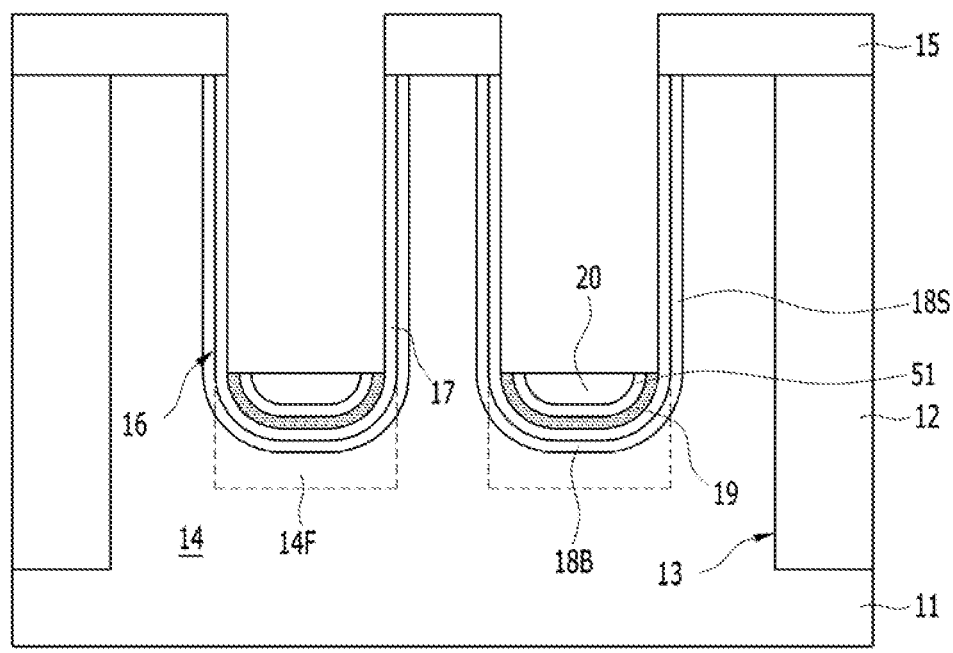

As shown in FIG. 17B, a recessing process for the sacrificial layer 20A is performed such that a sacrificial filler 20 remains in the gate trench 16. The recessing process for the sacrificial layer 20A may be performed by dry etching, for example, an etch-back process. The sacrificial filler 20 may be formed by an etch-back process for the sacrificial layer 20A.

In another embodiment, the recessing process for the sacrificial layer 20A may be performed in such a manner that an etch-back process is performed subsequently after a planarization process is performed.

The sacrificial filler 20 is formed by the recessing process for the sacrificial layer 20A, as described above. The sacrificial filler 20 may be recessed to be lower than the top surface of the active region 14. For example, the sacrificial filler 20 may cover the bottom of the gate trench 16. The sacrificial filler 20 may not overlap with the sidewalk of the gate trench 16.

After forming the sacrificial filler 20, a portion of the first work function material 51A may be exposed.

A recessing process is performed such that a first work function layer 51 and a dipole inducing layer 19 remain in the gate trench 16. That is to say, the first work function material 51A and the dipole inducing material 19A may be selectively removed. First, the exposed portion of the first work function material 51A may be removed. Accordingly, the first work function layer 51 may be formed, and a portion of the dipole inducing material 19A may be exposed. Next, the exposed portion of the dipole inducing material 19A may be removed. Accordingly, the dipole inducing layer 19 may be formed. The recessing process may be performed by dry etching or wet etching. The first work function layer 51 may be formed by an etch-back process for the first work function material 51A. The dipole inducing layer 19 may be formed by an etch-back process for the dipole inducing material 19A. The dipole inducing layer 19 may be positioned between the first work function layer 51 and the gate dielectric layer 17. The first work function layer 51 may be positioned between the sacrificial filler 20 and the dipole inducing layer 19. The heights of the top surfaces of the dipole inducing layer 19, the first work function layer 51 and the sacrificial filler 20 may be the same level. For example, the dipole inducing layer 19 and the first work function layer 51 may not be positioned on the sidewalls of the gate trench 16. The dipole inducing layer 19 and the first work function layer 51 may cover the top of the fin region 14F. In other words, the dipole inducing layer 19 and the first work function layer 51 may cover the bottom f the gate trench 16.

The recessing process for the dipole inducing material 19A has an etching selectivity with respect to the gate dielectric layer 17. Accordingly, loss of the gate dielectric layer 17 is prevented.

Figure 17C:
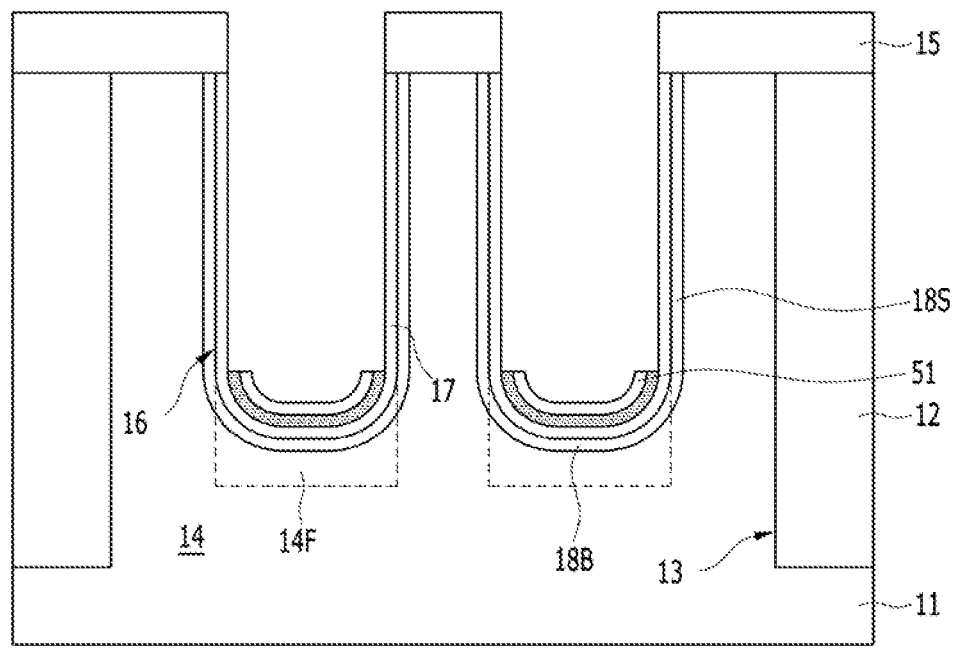

As shown in FIG. 17C, the sacrificial filler 20 may be removed. The sacrificial filler 20 may be removed by dry etching or wet etching.

By removing the sacrificial filler 20, the first work function layer 51, the dipole inducing layer 19 and the gate dielectric layer 17 may remain ire the gate trench 16. The dipole inducing layer 19 and the first work function layer 51 may have shapes that cover the bottom of the gate trench 16. The dipole inducing layer 19 and the first work function layer 51 may overlap with the bottom channel 18B. The dipole inducing layer 19 and the first work function layer 51 may not overlap with the side channel 18S.

Figure 17D:
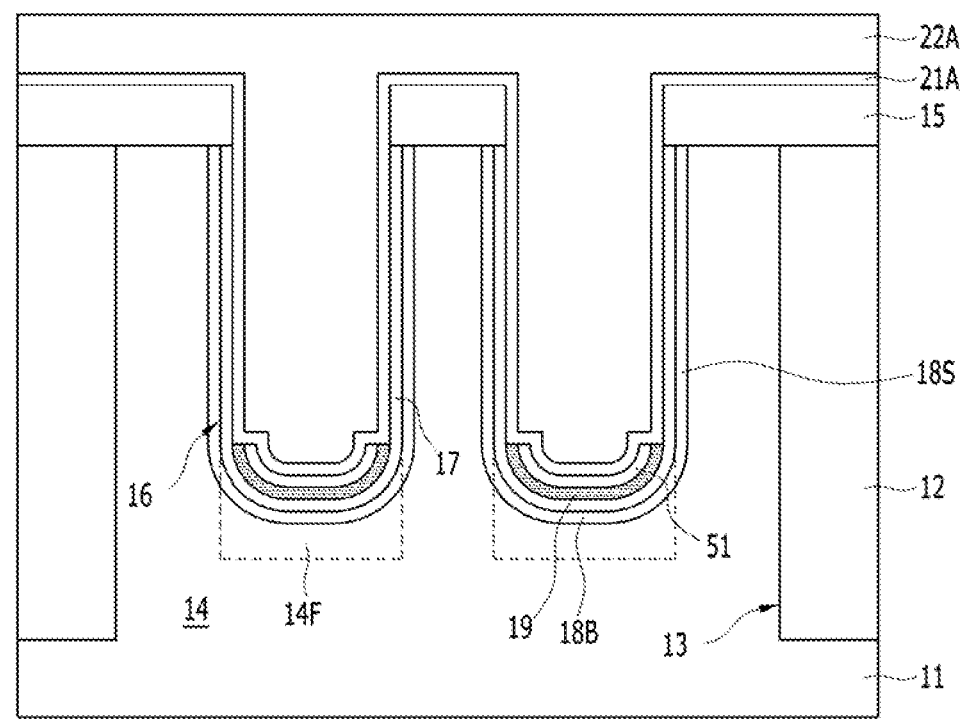

As shown in FIG. 17D, a second work function material 21A and a low-resistivity material 22A may be formed. The second work function material 21A may be formed conformally. The low-resistivity material 22A may fill the gate trench 16 on the second work function material 21A. The low-resistivity material 22A may be formed of a low resistivity material. The low-resistivity material 22A may include a tungsten layer. The second work function material 21A may include a titanium nitride.

Figure 17E:
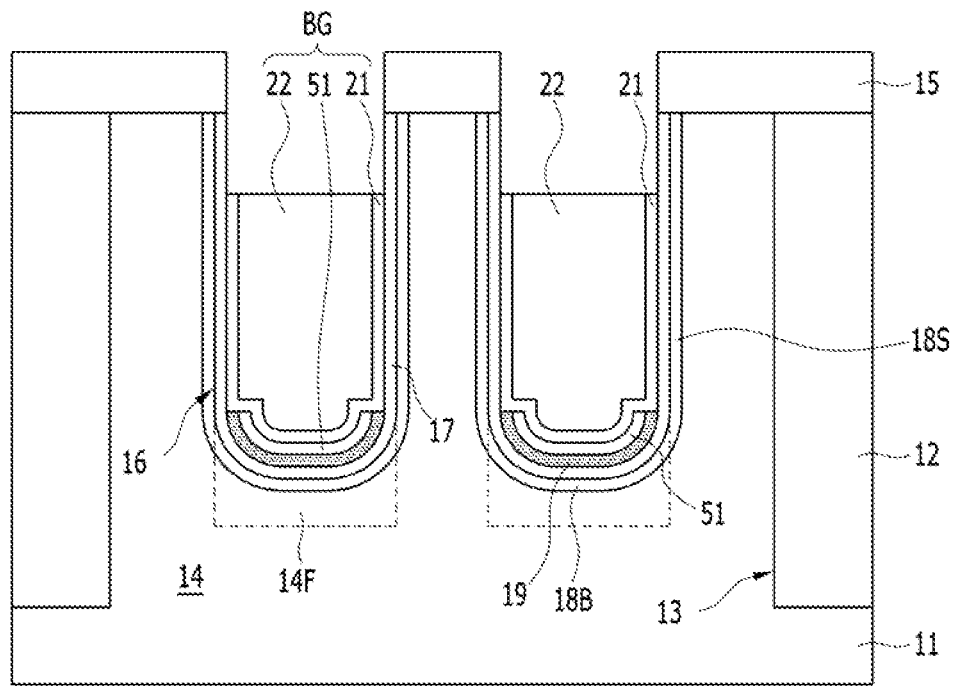

As shown in FIG. 17E, a second work function layer 21 and a low-resistivity layer 22 may be formed. For forming the second work function layer 21 and the low-resistivity layer 22, the second work function material 21A and the low-resistivity material 22A may etched by an etch-back process. The top surfaces of the second work function layer 21 and the low-resistivity layer 22 may be at a lower level than the top surface of the active region 14. Before performing the etch-back process, a planarization process using CMP may be performed in advance. The second work function layer 21 may be formed by etching of the second work function material 21A. The low-resistivity layer 22 may be formed by etching of the low-resistivity material 22A. The second work function layer 21 may cover the first work function layer 51 and the gate dielectric layer 17. The low-resistivity layer 22 may fill the gate trench 16.

Subsequently, as shown in FIG. 13H, the resultant structure may be exposed to a thermal process (not numbered). Accordingly, the resistivity of the low-resistivity layer 22 may be further reduced. The thermal process may be performed under an atmosphere of nitrogen or an atmosphere of a mixture gas of nitrogen and hydrogen. The thermal process may include rapid thermal annealing. The thermal process may be performed after forming the low-resistivity material 22A. Also, the thermal process may be performed after the CMP process for the low-resistivity material 22A.

Even though the thermal process is performed, the work function of the second work function layer 21 is not changed. Namely, the work function of the second work function layer 21 is not increased.

By the above-described series of processes, a gate electrode BG is formed. The gate electrode BG may include the first work function layer 51, the second work function layer 21, and the low-resistivity layer 22.

The first work function layer 51 may contact the dipole inducing layer 19. The second work function layer 21 may not contact the dipole inducing layer 19. The first work function layer 51 may have a higher work function than the second work function layer 21. That is to say, the first work function layer 51 has a work function that is increased by the dipole inducing layer 19. The second work function layer 21 has a work function of the second work function layer 21 itself.

Figure 17F:
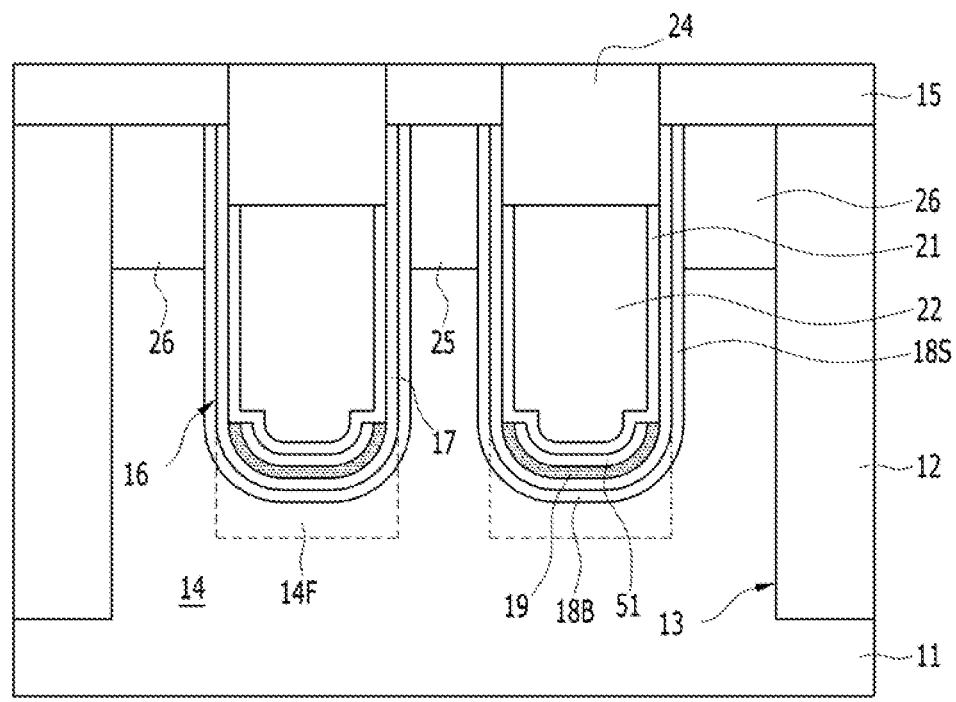

As shown in FIG. 17F, a capping layer 24 is formed on top of the gate electrode BG. The capping layer 24 includes a dielectric material. On top of the gate electrode BG, the gate trench 16 is filled with the capping layer 24. The capping layer 24 may include a silicon nitride. Subsequently, planarization of the capping layer 24 may be performed such that the top surface of the substrate 11 is exposed. In another embodiment, the capping layer 24 may include a silicon oxide. In another embodiment, the capping layer 24 may be a nitride-oxide-nitride (NON) structure.

By forming the capping layer 24, a buried gate structure is formed. The buried gate structure includes the gate dielectric layer 17, the dipole inducing layer 19, the gate electrode BG, and the capping layer 24. The gate electrode BG may include the first work function layer 51, the second work function layer 21, and the resistivity layer 22.

Next, a first doping region and a second doping region 26 are formed. The first and second doping regions 25 and 26 may be formed by a doping process such as, for example, implantation. The first and second doping regions 25 and 26 may have a depth that overlaps with the second work function layer 21. The first and second doping regions 25 and 26 may have a depth that is sufficiently separated from the dipole inducing layer 19 and the first work function layer 51.

Figure 18A:
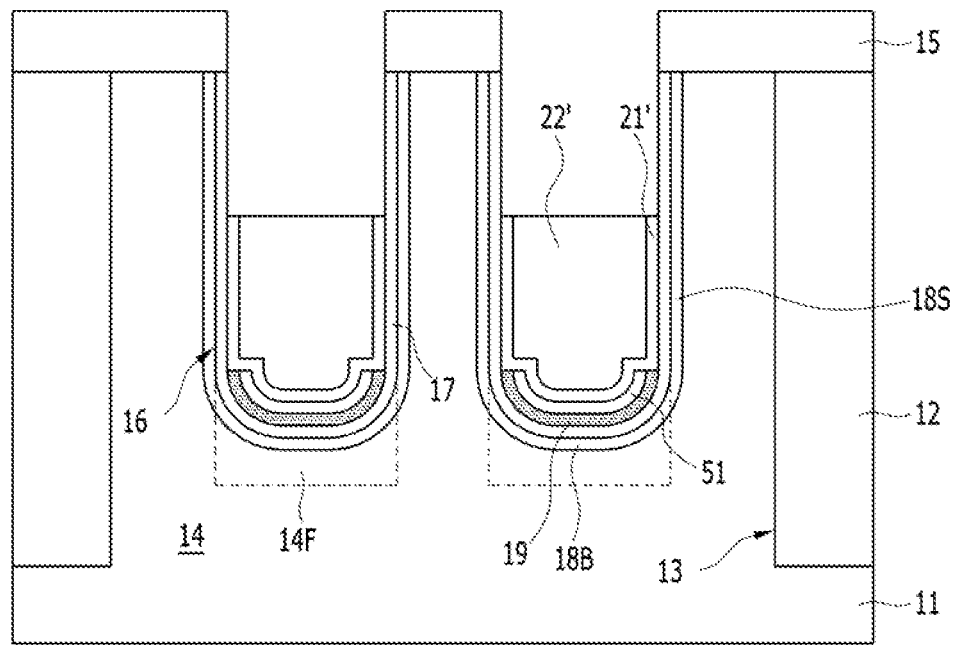
FIGS. 18A and 18B are representations of examples of views to assist in the explanation of a method for manufacturing the semiconductor device according to the seventh embodiment of the present invention.
Figure 18B:
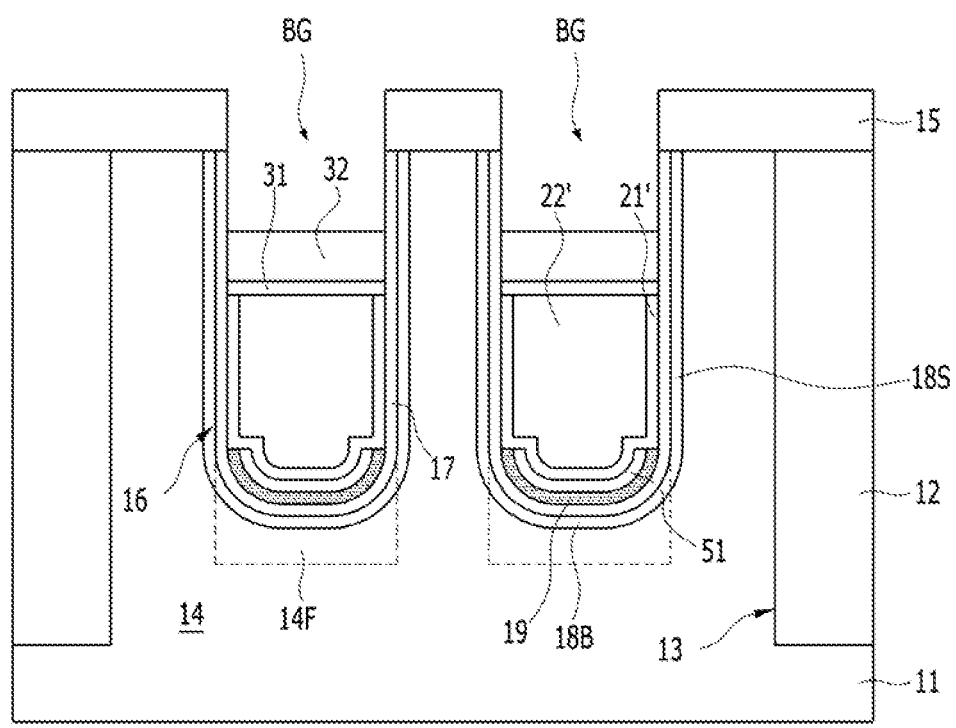

FIGS. 18A and 18B are representations of examples of views to assist in the explanation of a method for manufacturing the semiconductor device according to the seventh embodiment of the present invention. The manufacturing method according to the seventh embodiment may be similar to the manufacturing method according to FIGS. 17A to 17F.

By the method shown in FIGS. 17A to 17E, a second work function material 21A and a low-resistivity material 22A may be formed. The second work function material 21A may be formed conformally. The low-resistivity material 22A may fill the gate trench 16 on the second work function material 21A. The low-resistivity material 22A may be formed of a low resistivity material. The low-resistivity material 22A may include a tungsten layer. The second work function material 21A may include a titanium nitride.

Next, as shown in FIG. 18A, for forming a second work function layer 21' and a low-resistivity layer 22', the second work function material 21A and the low-resistivity material 22A may be etched by an etch-back process. Before performing the etch-back process, a planarization process using CMP may be performed in advance. The second work function layer 21 and the low-resistivity layer 22' may be at a lower level than the top surface of the active region 14. The second work function layer 21' may be at a lower level than the second work function layer 21 of FIG. 17E. In the same manner as the second work function layer 21' the low-resistivity layer 22' may also be a level lower than the low-resistivity layer 22 of FIG. 17E. As will be described later, the second work function layer 21' and the low-resistivity layer 22' may not overlap with first and second doping regions.

The second work function layer 21' may be formed by etching of the second work function material 21A. The low-resistivity layer 22' may be formed by etching of the low-resistivity material 22A. The second, work function layer 21' may cover the first work function layer 51 and the gate dielectric layer 17. The low-resistivity layer 22' may fill the gate trench 16.

Subsequently, as shown in FIG. 13H, the resultant structure may be exposed to a thermal process. Accordingly, the resistivity of the low-resistivity layer 22' may be further reduced. The thermal process may be performed under an atmosphere of nitrogen or an atmosphere of a mixture gas of nitrogen and hydrogen. The thermal process may include rapid thermal annealing. The thermal process may be performed after forming the low-resistivity material 22A. Also, the thermal process may be performed after the CMP process for the low-resistivity material 22A.

Even though the thermal process is performed the work function of the second work function layer 21' is not changed. Namely, the work function of the second work function layer 21' is not increased.

The first work function layer 51 may contact the dipole inducing layer 19. The second work function layer 21' may not contact the dipole inducing layer 19. The first work function layer 51 may have a higher work function than the second work function layer 21'. That is to say the first work function layer 51 has a work function that is increased by the dipole inducing layer 19. The second work function layer 21' has a work function of the second work function layer 21' itself.

As shown in FIG. 18B, a barrier layer 31 may be formed on the second work function layer 21' and the low-resistivity layer 22'. The barrier layer 31 may include a titanium nitride. For forming the barrier layer 31, a recessing process may be performed after forming a barrier material (not shown). The barrier material relay be formed by physical vapor deposition (PVD).

A low work function material (not numbered) may be formed on the barrier layer 31. The low work function material may include N-type doped polysilicon.

For forming a low work function layer 32, the low work function material may be recessed. The low work function layer 32 may be positioned on the barrier layer 31. The top surface of the low work function layer 32 may be at a lower level than the top surface of the substrate 11.

In this way, by forming the low work function layer 32, a gate electrode BG may be formed. The gate electrode BG may include the first work function layer 51, the second work function layer 21', the low-resistivity layer 22', the barrier layer 31, and the low work function layer 32.

Subsequently, a shown in FIG. 17F a capping layer 24 is formed on top of the gate electrode BG. The capping layer 24 includes a dielectric material. On top of the gate electrode BG, the gate trench 16 is filled with the capping layer 24. The capping layer 24 may include a silicon nitride. Subsequently, planarization of the capping layer 24 may be performed such that the top surface of the substrate 11 is exposed. In another embodiment, the capping layer 24 may include a silicon oxide. In still another embodiment, the capping layer 24 may be a nitride-oxide-nitride (NON) structure.

By forming the capping layer 24, a buried gate structure is formed. The buried gate structure includes the gate dielectric layer 17, the dipole inducing layer 19, the gate electrode BG, and the capping layer 24. The gate electrode BG may include the first work function layer 51, the second work function layer 21', the low-resistivity layer 22', the barrier layer 31, and the low work function layer 32.

Next, a first doping region 25 and a second doping region 26 are formed. The first and second doping regions 25 and 26 may be formed by a doping process such as implantation. The first and second doping regions 25 and 26 may have a depth that overlaps with the second work function layer 21'. The first and second doping regions 25 and 26 may have a depth that is sufficiently separated from the dipole inducing layer 19 and the first work function layer 51.

Figure 19A:
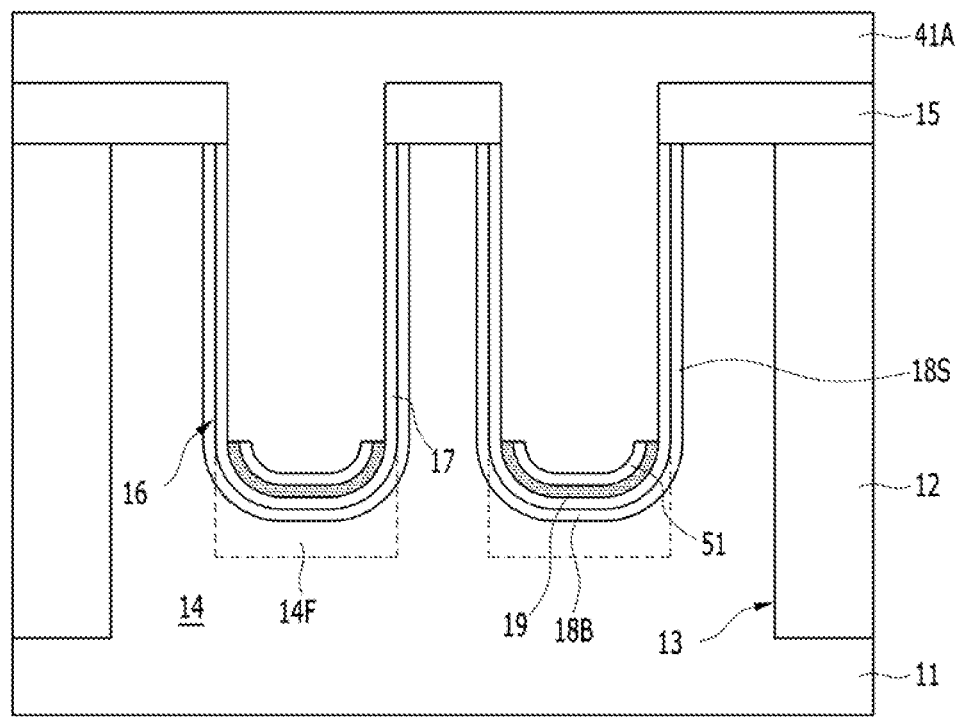
FIGS. 19A and 19B are representations of examples of views to assist in the explanation of a method for manufacturing the semiconductor device according to the eighth embodiment of the present invention.
Figure 19B:
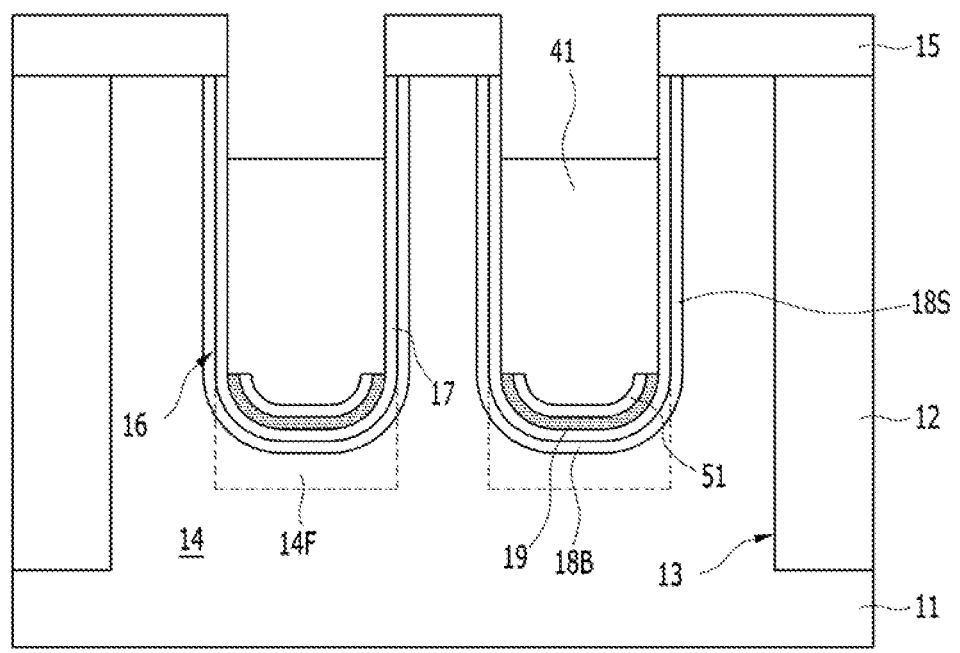

FIGS. 19A and 19B are representations of examples of views to assist in the explanation of a method for manufacturing the semiconductor device according to the eighth embodiment of the present invention. The manufacturing method according to the eighth embodiment may be similar to the manufacturing method according to FIGS. 17A to 17F.

By the method shown in FIGS. 17A to 17C, a dipole inducing layer 19 and a first work function layer 51 may be formed.

Next, as shown in FIG. 19A, a second work function material 41A may be formed. The second work function material 41A may fill the gate trench 16 on the first work function layer 51. The second work function material 41A nay include a titanium nitride.

As shown in FIG. 19B, a second work function layer 41 may be formed. For forming the second work function layer 41, the second work function material 41A may be etched by an etch-back process. Before performing the etch-back process, a planarization process using CMP may be performed in advance. The second work function layer 41 may be at a lower level than the top surface of the active region 14. The second work function layer 41 may be the same level as the second work function layer 22 of FIG. 17E. As will be described later, the second work function layer 41 may overlap with first and second doping regions.

The second work function layer 41 may be formed by etching of the second work function material 41A. The second work function layer 41 may cover the first work function layer 51 and the gate dielectric layer 17. Unlike the second work function layer 21 of FIG. 13H, only the second work function layer 41 may fill the gate trench 16. Accordingly, the resistivity of a gate electrode may be further reduced. Moreover, since a low-resistivity layer is omitted, a thermal process is not needed.

The second work function layer 41 has a work function of the second work function layer 41 itself. The first work function layer 51 has a work function that is increased by the dipole inducing layer 19.

Subsequently, as shown in FIG. 17F, a capping layer 24 is formed on the second work function layer 41. The capping layer 24 includes a dielectric material. On the second work function layer 41, the gate trench 16 is filled with the capping layer 24. The capping layer 24 may include a silicon nitride. Subsequently, planarization of the capping layer 24 may be performed such that the top surface of the substrate 11 is exposed. In another embodiment, the capping layer 24 may include a silicon oxide. In still another embodiment, the capping layer 24 may be a nitride-oxide-nitride (NON) structure.

By forming the capping layer 24, a buried gate structure formed. The buried gate structure includes the gate dielectric layer 17, the dipole inducing layer 19, the first work function layer 51, the second work function layer 41, a gate electrode BG, and the capping layer 24. The gate electrode BG may be constructed by only the first work function layer 51 and the second work function layer 41, without a low-resistivity layer.

Next, a first doping region 25 and a second doping region 26 are formed. The first and second doping regions 25 and 26 may be formed by a doping process such as, for example, implantation. The first and second doping regions 25 and 26 may have a depth that overlaps with the second work function layer 41. The first and second doping regions 25 and 26 may have a depth that is sufficiently separated from the dipole inducing layer 1g and the first work function layer 51.

Figure 20A:
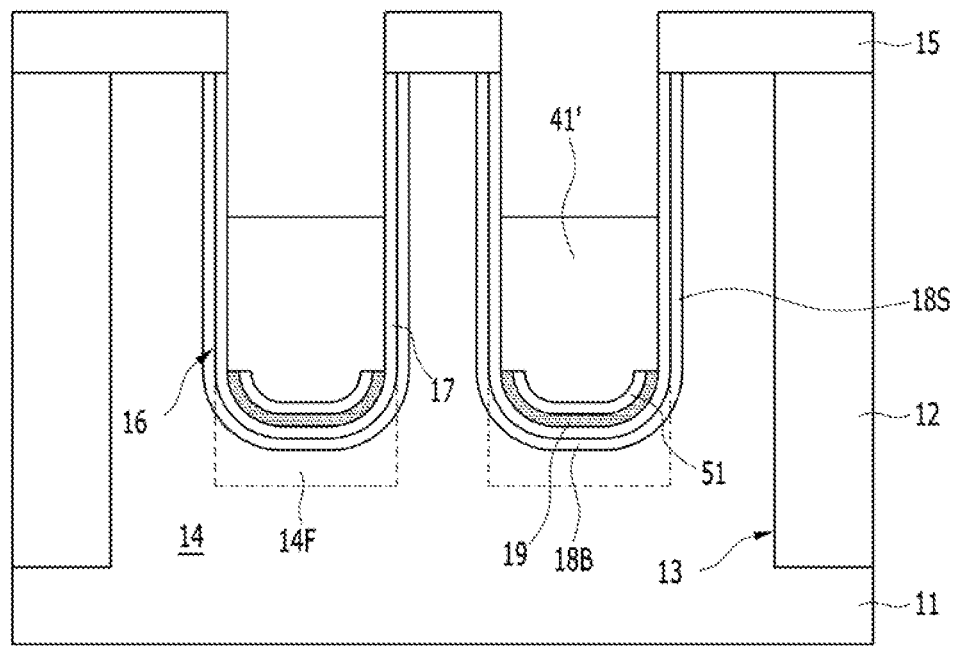
FIGS. 20A and 20B are representations of examples of views to assist in the explanation of a method for manufacturing the semiconductor device according to the ninth embodiment of the present invention.
Figure 20B:
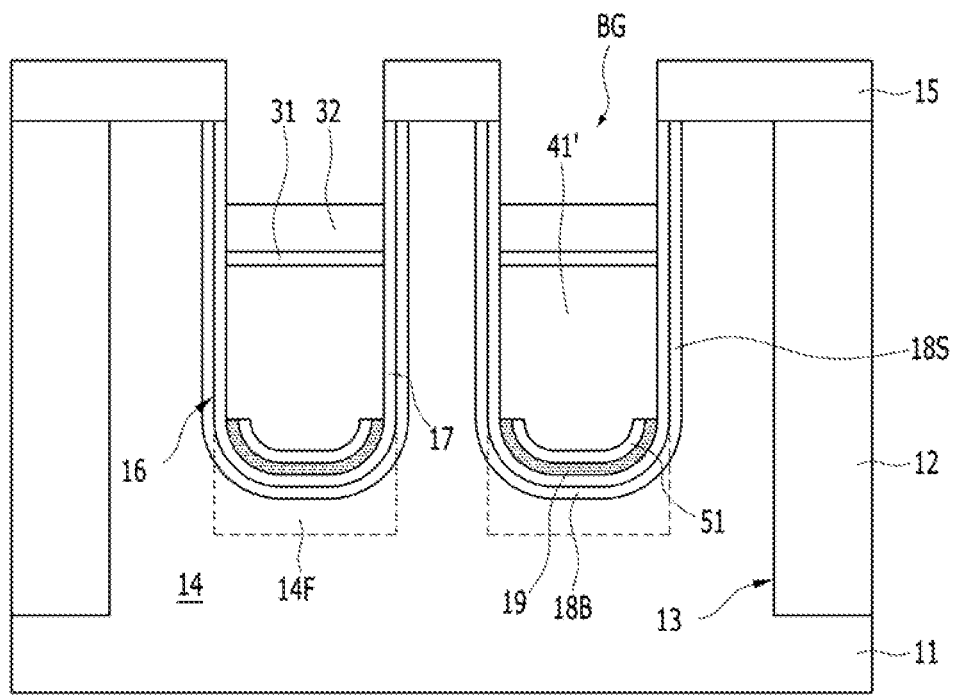

FIGS. 20A and 20B are representations of examples of views to assist in the explanation of a method for manufacturing the semiconductor device according to the ninth embodiment of the present invention. The manufacturing, method according to the ninth embodiment may be similar to the manufacturing methods according to FIGS. 17A to 17F and FIGS. 19A and 19B.

First, by the method shown in FIGS. 17A to 17E, a dipole inducing layer 19 and a first work function layer 51 may be formed.

Next, as show n in FIG. 20A, a second work function layer 41' may be formed. By the method shown in FIGS. 19A and 19B the second work function layer 41' may be formed. The second work function layer 41' may be at a lower level than the second work function layer 41 of FIG. 19B.

As shown in FIG. 20B, a barrier layer 31 may be formed on the second work function layer 41'. The barrier layer 31 may include a titanium nitride. For forming the barrier layer 31, a recessing process may be performed after forming a barrier material (not shown). The barrier material may be formed by physical vapor deposition (PVD).

A low work function material may be formed on the barrier layer 31. The to work function material may include N-type doped polysilicon.

For forming a low work function layer 32, the low work function material may be recessed. The low work function layer 32 may be positioned on the barrier layer 31. The top surface of the low work function layer 32 may be at a lower level than the top surface of the substrate 11.

In this way, by forming the low work function layer 32, a gate electrode BG may be formed. The gate electrode BG may include the first work function layer 51, the second work function layer 41', the barrier layer 31, and the low work function layer 32.

Subsequently, as shown in FIG. 17F a capping layer 24 is formed on top of the gate electrode BG. The capping layer 24 includes a dielectric material. On top of the gate electrode BG, the gate trench 16 is filled with the capping layer 24. The capping layer 24 may include a silicon nitride. Subsequently, planarization of the capping layer 24 may be performed such that the top surface of the substrate 11 is exposed. In another embodiment, the capping layer 24 may include a silicon oxide. In still another embodiment, the capping layer 25 may be a nitride-oxide-nitride (NON) structure.

By forming the capping layer 24, a buried gate structure is formed. The buried gate structure includes the gate dielectric layer 17, the dipole inducing layer 19 the gate electrode BG, and the capping layer 24. The gate electrode BG may include the first work function layer 51, the second work function layer 41', the barrier layer 31, and the low work function layer 32.

Next, a first doping region 25 and a second doping region 26 are formed. The first and second doping regions 25 and 26 may be formed by a doping process such as implantation. The first and second doping regions 25 and 26 may have a depth that overlaps with the low work function layer 32. The first and second doping regions 25 and 26 may have a depth that is sufficiently separated from the dipole inducing layer 19 and the first work function layer 51. The second work function layer 41' may not overlap with the first and second doping regions 25 and 26.

In the embodiments since a channel dose is decreased by a dipole inducing layer, junction leakage current may be suppressed.

Moreover, in the embodiments, since a low work function material is formed between a gate electrode and doping regions, GIDL may be reduced.

Further, in the embodiments, since a dipole inducing material and the doping regions (source/drain regions) are separated from each other by a sufficient distance, off-state leakage by a side transistor effect may be prevented.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   at least one trench extending into a semiconductor substrate and lined with a gate dielectric layer;
   a dipole inducing layer covering a lowermost portion of the trench without covering sidewalls of the trench;
   a gate electrode disposed over the dipole inducing layer and that fills in the trench; and
   doping regions in the semiconductor substrate, separated from each other by the trench and separated from the dipole inducing layer,
   wherein the dipole inducing layer is formed over the lowermost portion of the trench without overlapping with the doping regions,
   wherein a top surface of the dipole inducing layer being at a lower level than a bottom surface of the doping regions,
   wherein the dipole inducing layer is formed of a dielectric material, and
   wherein the gate electrode comprises:
   a first buried portion formed on the dipole inducing layer, the first buried portion covering partially the sidewall of the trench with a top surface of the first buried portion being aligned with the bottom surface of the doping regions;
   a second buried portion formed on the first buried portion, the second buried portion having a top surface that is positioned lower than a top surface of the doping regions,
   wherein a top surface of the dipole inducing layer is at a lower level than the top surface of the first buried portion, and
   wherein the first and second buried portions are made of a different material.

2. The semiconductor device according to claim 1, wherein the dipole inducing layer comprises a metal oxide that has a dielectric constant higher than the gate dielectric layer.

3. The semiconductor device according to claim 1, wherein the gate dielectric layer comprises a silicon oxide ($SiO_2$), and the dipole inducing layer comprises an aluminum oxide ($Al_2O_3$), a titanium oxide ($TiO_2$), a hafnium oxide ($HfO_2$), a zirconium oxide ($ZrO_2$), a magnesium oxide (MgO) or a combination thereof.

4. The semiconductor device according to claim 1, wherein the first buried portion comprises:
   a first portion contacting the dipole inducing layer; and
   a second portion non-contacting the dipole inducing layer, and
   wherein the first portion has a work function higher than the second portion.

5. The semiconductor device according to claim 4, wherein the first portion of the first buried portion is separated from the doping regions, and is separated from sidewalls of the trench.

6. The semiconductor device according to claim 4, wherein the first portion of the first buried portion comprises a titanium nitride that has a high work function, and the second portion of the first buried portion comprises a titanium nitride that has a low work function.

7. The semiconductor device according to claim 1, wherein the first buried portion of the gate electrode comprises:
   a work function layer lining the dipole inducing layer and the gate dielectric layer; and
   a low-resistivity layer filling the trench over the work function layer.

8. The semiconductor device according to claim 7, wherein the second buried portion of the gate electrode comprises:
   a barrier layer formed over the work function layer and the low-resistivity layer; and
   a low work function layer formed over the barrier layer, and
   wherein the low work function layer overlaps with the doping regions.

9. The semiconductor device according to claim 8, wherein the low work function layer has a low work function lower than the work function layer.

10. The semiconductor device according to claim 7, wherein the work function layer comprises a titanium nitride.

11. The semiconductor device according to claim 7, wherein the low-resistivity layer comprises tungsten.

12. The semiconductor device according to claim 1, further comprises:
    a bottom channel formed along a bottom of the trench; and
    a side channel formed along sidewalls of the trench,
    wherein the bottom channel overlaps with the dipole inducing layer.

13. The semiconductor device according to claim 12, wherein the dipole inducing layer has a height that non-overlaps with the side channel.

14. The semiconductor device according to claim 12, wherein the bottom channel has a dopant concentration lower than the side channel.

15. The semiconductor device according to claim 12, wherein the bottom channel is undoped, and the side channel is doped.

16. The semiconductor device according to claim 1, wherein the second buried portion and the dipole inducing layer are formed apart from each other with the first buried portion therebetween.

* * * * *